(12) United States Patent
Kwak et al.

(10) Patent No.: US 9,178,001 B2
(45) Date of Patent: Nov. 3, 2015

(54) ORGANIC LIGHT EMITTING DIODE AND METHOD FOR MANUFACTURING THE SAME

(75) Inventors: Yoon-Hyun Kwak, Yongin (KR); Sun-Young Lee, Yongin (KR); Bum-Woo Park, Yongin (KR); Chang-Ho Lee, Yongin (KR); Se-Jin Cho, Yongin (KR); Jong-Hyuk Lee, Yongin (KR); Hee-Joo Ko, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 853 days.

(21) Appl. No.: 13/341,737

(22) Filed: Dec. 30, 2011

(65) Prior Publication Data

US 2013/0001526 A1 Jan. 3, 2013

(30) Foreign Application Priority Data

Jun. 30, 2011 (KR) .................. 10-2011-0064982

(51) Int. Cl.
*H01L 51/54* (2006.01)
*H01L 27/32* (2006.01)
*H01L 51/52* (2006.01)
*H01L 51/50* (2006.01)
*H01L 51/00* (2006.01)

(52) U.S. Cl.
CPC ........ *H01L 27/3211* (2013.01); *H01L 51/5265* (2013.01); *H01L 51/006* (2013.01); *H01L 51/0061* (2013.01); *H01L 51/0065* (2013.01); *H01L 51/0067* (2013.01); *H01L 51/0068* (2013.01); *H01L 51/0072* (2013.01); *H01L 51/0081* (2013.01); *H01L 51/506* (2013.01); *H01L 2251/558* (2013.01)

(58) Field of Classification Search
None
See application file for complete search history.

(56) References Cited

U.S. PATENT DOCUMENTS

| | | | |
|---|---|---|---|
| 6,582,837 B1 * | 6/2003 | Toguchi et al. | 428/690 |
| 2002/0086180 A1 * | 7/2002 | Seo et al. | 428/690 |
| 2004/0106003 A1 | 6/2004 | Chen et al. | |
| 2005/0146268 A1 | 7/2005 | Seo et al. | |
| 2006/0017377 A1 * | 1/2006 | Ryu | 313/504 |

FOREIGN PATENT DOCUMENTS

| | | | | |
|---|---|---|---|---|
| JP | 11054280 A | * | 2/1999 | H04B 33/14 |
| JP | 2004-186156 A | | 7/2004 | |
| JP | 2006-328037 | | 7/2006 | |
| KR | 1020010021021 | | 3/2001 | |
| KR | 10-2005-0072247 A1 | | 7/2005 | |
| KR | 1020060007899 | | 1/2006 | |
| KR | 1020100007552 A | | 1/2010 | |
| KR | 1020100069216 A | | 6/2010 | |

OTHER PUBLICATIONS

Machine transaltion of JP11-054280. Year of publication: 1999.*

* cited by examiner

*Primary Examiner* — Andrew K Bohaty
(74) *Attorney, Agent, or Firm* — Robert E. Bushnell, Esq.

(57) ABSTRACT

The present invention provides an organic light emitting diode comprising a substrate comprising a first sub-pixel, a second sub-pixel, and a third sub-pixel; a first electrode disposed on the substrate; a second electrode facing the first electrode; an emission layer disposed between the first electrode and the second electrode; and a first layer disposed between the first electrode and the second electrode and containing an ambipolar compound, and a method for manufacturing the organic light emitting diode.

20 Claims, 9 Drawing Sheets

ORGANIC LIGHT EMITTING DIODE AND METHOD FOR MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 30$^{th}$ of Jun. 2011 and there duly assigned Serial No. 10-2011-0064982.

BACKGROUND OF THE INVENTION

1. Field of the Invention

The present invention relates to an organic light emitting diode and a method of manufacturing the same.

2. Description of the Related Art

An organic light emitting diode is a self-emitting type display device, and not only has a wide viewing angle and excellent contrast, but also has a quick response speed, excellent luminance, excellent driving voltage, and an excellent response speed, and is capable of a polychrome.

SUMMARY OF THE INVENTION

The present invention provides a highly efficient organic light emitting diode having simple manufacturing processes, and a method of manufacturing the same.

According to an aspect of the present invention, there is provided an organic light emitting diode including a substrate including a first sub-pixel, a second sub-pixel, and a third sub-pixel, a first electrode disposed according to the first through third sub-pixels of the substrate, a second electrode facing the first electrode, an emission layer disposed between the first electrode and the second electrode, and a first layer disposed between the first electrode and the second electrode and containing an ambipolar compound. The emission layer includes a first emission layer formed in the first sub-pixel and emitting a first color light, a second emission layer formed in the second sub-pixel and emitting a second color light, and a third emission layer formed in the third sub-pixel and emitting a third color light. The first layer is a common layer disposed throughout the first sub-pixel, the second sub-pixel, and the third sub-pixel, and includes a first region disposed in the first sub-pixel, a second region disposed in the second sub-pixel, and a third region disposed in the third sub-pixel. The first region is disposed between the first emission layer and the second electrode, and the third region is disposed between the third emission layer and the first electrode.

The first color light may be a blue light, the second color light may be a green light, and the third color light may be a red light.

The second region of the first layer may be disposed between the first electrode and the second emission layer. In this case, the organic light emitting diode may satisfy Equation 1 below:

$$D_1 < D_2 < D_3 \qquad \text{<Equation 1>}$$

wherein $D_1$ denotes a distance between the first electrode and the first emission layer, $D_2$ denotes a distance between the first electrode and the second emission layer, and $D_3$ denotes a distance between the first electrode and the third emission layer.

Alternatively, the second region of the first layer may be disposed between the second emission layer and the second electrode. In this case, the organic light emitting diode may satisfy Equation 2 below:

$$D_1 = D_2 < D_3 \qquad \text{<Equation 2>}$$

wherein $D_1$ denotes a distance between the first electrode and the first emission layer, $D_2$ denotes a distance between the first electrode and the second emission layer, and $D_3$ denotes a distance between the first electrode and the third emission layer.

A first auxiliary layer may be disposed between the third region of the first layer and the third emission layer.

Alternatively, the first auxiliary layer may be disposed between the first electrode and the third region of the first layer.

A thickness of the second emission layer may be larger than a thickness of the first emission layer.

The first electrode may be a reflective electrode and the second electrode may be a translucent electrode, or the first electrode may be a translucent electrode and the second electrode may be a reflective electrode, and the organic light emitting diode may satisfy Equations 3 through 5 below:

$$\frac{\lambda_1}{2n_1} \cdot m_1 - \frac{\lambda_1}{10} \leq L_1 \leq \frac{\lambda_1}{2n_1} \cdot m_1 + \frac{\lambda_1}{10} \qquad \text{< Equation 3 >}$$

$$\frac{\lambda_2}{2n_2} \cdot m_2 - \frac{\lambda_2}{10} \leq L_2 \leq \frac{\lambda_2}{2n_2} \cdot m_2 + \frac{\lambda_2}{10} \qquad \text{< Equation 4 >}$$

$$\frac{\lambda_3}{2n_3} \cdot m_3 - \frac{\lambda_3}{10} \leq L_3 \leq \frac{\lambda_3}{2n_3} \cdot m_1 + \frac{\lambda_3}{10} \qquad \text{< Equation 5 >}$$

wherein, in Equations 3 through 5, $L_1$ denotes a distance between the first electrode and the second electrode in the first sub-pixel; $L_2$ denotes a distance between the first electrode and the second electrode in the second sub-pixel; $L_3$ denotes a distance between the first electrode and the second electrode in the third sub-pixel; $\lambda_1$, $\lambda_2$, and $\lambda_3$ respectively denote wavelengths of the first color light, the second color light, and the third color light; $n_1$ denotes a refractive index of layers disposed between the first electrode and the second electrode in the first sub-pixel; $n_2$ denotes a refractive index of layers disposed between the first electrode and the second electrode in the second sub-pixel; $n_3$ denotes a refractive index of layers disposed between the first electrode and the second electrode in the third sub-pixel; and each of $m_1$, $m_2$, and $m_3$ is independently a natural number.

The ambipolar compound may be represented by Equation 1, 2, or 3 below:

<Formula 1>

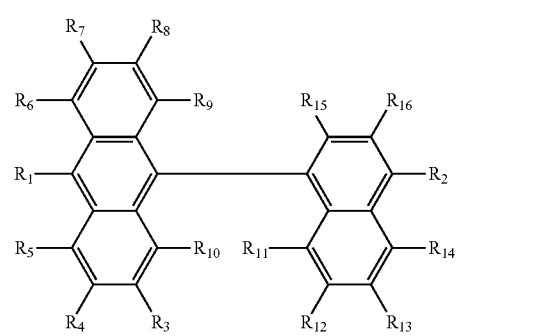

-continued

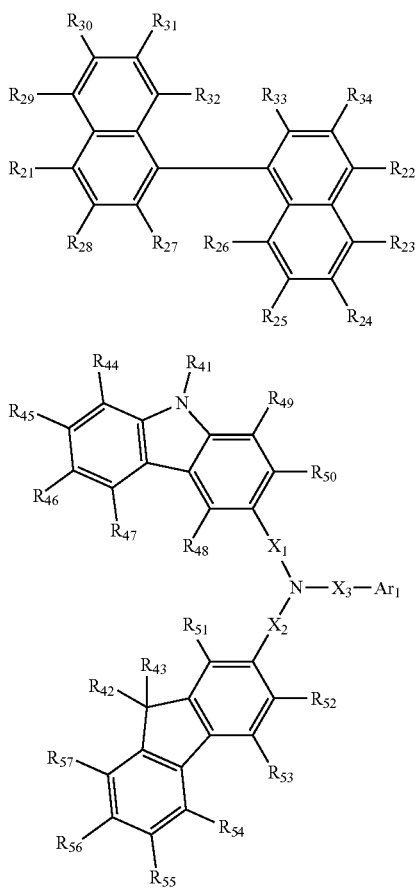

<Formula 2>

<Formula 3> wherein, in Formulas 1 through 3, each of $R_1$ through $R_{16}$, $R_{21}$ through $R_{34}$, and $R_{41}$ through $R_{57}$ is independently one of hydrogen, heavy hydrogen, a halogen atom, a hydroxyl group, a cyano group, a nitro group, a carboxyl group, a substituted or unsubstituted $C_1$-$C_{50}$ alkyl group, a substituted or unsubstituted $C_2$-$C_{50}$ alkenyl group, a substituted or unsubstituted $C_2$-$C_{50}$ alkynyl group, a substituted or unsubstituted $C_1$-$C_{50}$ alkoxy group, a substituted or unsubstituted $C_3$-$C_{50}$ cycloalkyl group, a substituted or unsubstituted $C_5$-$C_{50}$ aryl group, a substituted or unsubstituted $C_5$-$C_{50}$ aryloxy group, a substituted or unsubstituted $C_5$-$C_{50}$ arylthio group, a substituted or unsubstituted $C_2$-$C_{50}$ heteroaryl group, $-N(R_{70})(R_{71})$, and $-Si(R_{72})(R_{73})(R_{74})$; each of $X_1$, $X_2$, and $X_3$ is independently one of a single bond, a substituted or unsubstituted $C_5$-$C_{50}$ arylene group, and a substituted or unsubstituted $C_2$-$C_{50}$ heteroarylene group; $Ar_1$ is a substituted or unsubstituted $C_2$-$C_{50}$ heteroaryl group; and each of $R_{70}$ through $R_{74}$ is independently one of hydrogen, heavy hydrogen, a halogen atom, a hydroxyl group, a cyano group, a nitro group, a carboxyl group, a substituted or unsubstituted $C_1$-$C_{50}$ alkyl group, a substituted or unsubstituted $C_2$-$C_{50}$ alkenyl group, a substituted or unsubstituted $C_2$-$C_{50}$ alkynyl group, a substituted or unsubstituted $C_1$-$C_{50}$ alkoxy group, a substituted or unsubstituted $C_3$-$C_{50}$ cycloalkyl group, a substituted or unsubstituted $C_5$-$C_{50}$ aryl group, a substituted or unsubstituted $C_5$-$C_{50}$ aryloxy group, a substituted or unsubstituted $C_5$-$C_{50}$ arylthio group, and a substituted or unsubstituted $C_2$-$C_{50}$ heteroaryl group.

According to another aspect of the present invention, there is provided a method of manufacturing an organic light emitting diode. The method includes preparing a first electrode according to a first sub-pixel, a second sub-pixel, and a third sub-pixel, on a substrate including the first through third sub-pixels, preparing a first emission layer emitting a first color light on the first sub-pixel, preparing a first layer including an ambipolar compound and being a common layer disposed throughout the first through third sub-pixels, and preparing a third emission layer emitting a third color light in the third sub-pixel.

The method may further include, before the preparing of the first layer, preparing a second emission layer emitting a second color light in the second sub-pixel.

Alternatively, the method may further include, after the preparing of the first layer, preparing a second emission layer emitting the second color light in the second sub-pixel.

The method may further include, before the preparing of the first layer, preparing a first auxiliary layer in the third sub-pixel.

Alternatively, the method may further include, after the preparing of the first layer and before the preparing of the third emission layer, preparing the first auxiliary layer in the third sub-pixel.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Hereinafter, the present invention will be described more fully with reference to the accompanying drawings, in which exemplary embodiments of the invention are shown.

An organic light emitting diode may generally have a structure where an anode is formed on a substrate, and a hole transport layer (HTL), an emission layer, an electron transport layer (ETL), and a cathode are sequentially formed on the anode. Here, the HTL, the emission layer, and the ETL are organic thin films formed of an organic compound.

The organic light emitting diode having such a structure may operate as follows.

When a voltage is applied between the anode and the cathode, holes injected from the anode move to the emission layer through the HTL, and electrons injected from the cathode move to the emission layer through the ETL. Carriers such as the holes and electrons recombine in the emission layer to generate excitons. Then, light is generated as the excitons change from an excited state to a base state.

Figure 1:
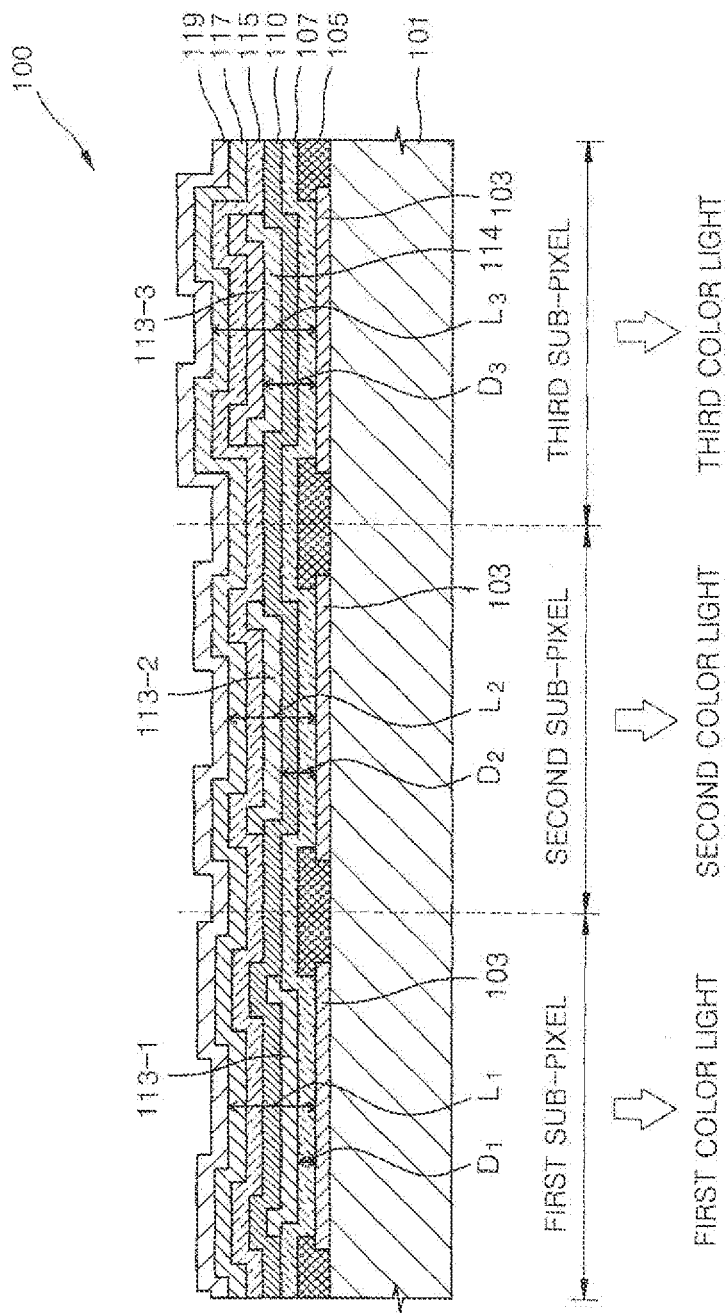
FIG. 1 is a cross-sectional view schematically illustrating an organic light emitting diode according to an embodiment of the present invention.

FIG. 1 is a cross-sectional view schematically illustrating an organic light emitting diode 100 according to an embodiment of the present invention. A structure of the organic light emitting diode 100 and a method of manufacturing the organic light emitting diode 100 will now be described with reference to FIG. 1.

Referring to the organic light emitting diode 100 of FIG. 1, a substrate 101 includes a first sub-pixel, a second sub-pixel, and a third sub-pixel. A first electrode 103 is patterned according to the first sub-pixel, the second sub-pixel, and the third sub-pixel. A hole injection and transport layer 107 and a first layer 110 including an ambipolar compound are sequentially disposed on the first electrode 103, as a common layer. The first layer 110 includes a first region disposed in the first sub-pixel, a second region disposed in the second sub-pixel, and a third region disposed in the third sub-pixel. A first emission layer 113-1 is disposed in the first sub-pixel, wherein the first region of the first layer 110 is disposed between the first emission layer 113-1 and a second electrode 119. A second emission layer 113-2 is disposed in the second sub-pixel, wherein the second region of the first layer 110 is disposed between the second emission layer 113-2 and the first electrode 103. A third emission layer 113-3 is disposed in the third sub-pixel, wherein the third region of the first layer 110 is disposed between the third emission layer 113-3 and the first electrode 103. Also, a first auxiliary layer 114 that maximizes a resonance effect of a third color light is disposed between the third emission layer 113-3 and the third region of the first layer 110. Then, an electron transport layer (ETL) 115, an electron injection layer (EIL) 117, and the second electrode 119 are sequentially disposed as a common layer.

In the present specification and the claims, a "common layer" denotes a layer disposed throughout the first, second, and third sub-pixels, without being patterned according to the first, second, and third sub-pixels.

First, second, and third color lights are respectively blue, green, and red lights. Accordingly, the organic light emitting diode 100 may emit a full color. Here, the first through third color lights are not limited to blue, green, and red lights as long as a mixed light of the first through third color lights is a white light.

A substrate generally used in an organic light emitting diode may be used as the substrate 101. Here, a glass substrate or transparent plastic substrate having excellent mechanical strength, thermal stability, transparency, surface flatness, handling convenience, and waterproofing property may be used as the substrate 101.

The first electrode 103 that is patterned according to the first through third sub-pixels is disposed on the substrate 101. The first electrode 103 is a transparent or translucent electrode.

Accordingly, the first through third color lights pass through the first electrode 101 and are emitted toward the substrate 101.

The first electrode 103 may be disposed by providing a material for forming a first electrode on the substrate 101 via a deposition method, a sputtering method, or the like. If the first electrode 103 is an anode, the material for forming a first electrode may have a high work function so that holes are easily injected into the first emission layer 113-1, the second emission layer 113-2, and the third emission layer 113-3.

The first electrode 103 may include an indium tin oxide (ITO), an indium zinc oxide (IZO), a tin oxide (SnO2), a zinc oxide (ZnO), or the like, which are transparent and have excellent electrical conductivity. Alternatively, in order to have a translucent property, the first electrode 103 may be a thin film electrode including at least one metal, such as magnesium (Mg), aluminum (Al), aluminum-lithium (Al—Li), calcium (Ca), magnesium-indium (Mg—In), or magnesium-silver (Mg—Ag).

A pixel insulation film 105 is formed on an edge portion of the first electrode 103. The pixel insulation film 105 defines a pixel region, and may include any well known organic insulation material (for example, a silicon-based material), any well known inorganic insulation material, or any well known organic/inorganic complex insulation material.

The hole injection and transport layer 107 is disposed on the first electrode 103 as a common layer.

The hole injection and transport layer 107 may include at least two layers, such as a hole injection layer (HIL) including a hole injection material and a hole transport layer (HTL) including a hole transport material, or may be a single layer including at least one of a hole injection material and a hole transport material.

The hole injection and transport layer 107 may be disposed on the first electrode 103 by using any one of various methods, such as a vacuum deposition method, a spin coating method, a cast method, a Langmuir Blodgett (LB) method, an inkjet printing method, a laser printing method, and a laser thermal transfer method.

When the hole injection and transport layer 107 is disposed by using a vacuum deposition method, deposition conditions may differ according to a compound used as a material of the hole injection and transport layer 107, and a target structure and target thermal characteristics of the hole injection and transport layer 107, but for example, a deposition temperature may be from about 100° C. to about 500° C., a vacuum level may be from about $10^{-8}$ to about $10^{-3}$ torr, and a deposition rate may be from about 0.01 Å/sec to about 100 Å/sec. However, the deposition conditions are not limited thereto.

When the hole injection and transport layer 107 is disposed by using a spin coating method, coating conditions may differ according to a compound used as a material of the hole injection and transport layer 107, and a target structure and target thermal characteristics of the hole injection and transport layer 107, but for example, a coating rate may be from about 2000 to about 5000 rpm and a thermal process temperature for removing a solvent after coating may be from about 80° C. to about 200° C. However, the coating conditions are not limited thereto.

Examples of the hole injection material unlimitedly include N,N'-diphenyl-N,N'-bis-[4-(phenyl-m-tolyl-amino)-phenyl]-biphenyl-4,4'-diamine (DNTPD), a phthalocyanine compound such as copper phthalocyanine, [4,4',4"-tris (3-methylphenylphenylamino)triphenylamine] (m-MT-DATA), TDATA, 2-TNATA, polyaniline/dodecylbenzene-sulfonic acid (Pani/DBSA), poly(3,4-ethylenediox-ythiophene)/Poly(4-styrenesulfonate) (PEDOT/PSS), polyaniline/camphor sulfonic acid (Pani/CSA) and polyaniline/poly(4-styrenesulfonate) (PANI/PSS).

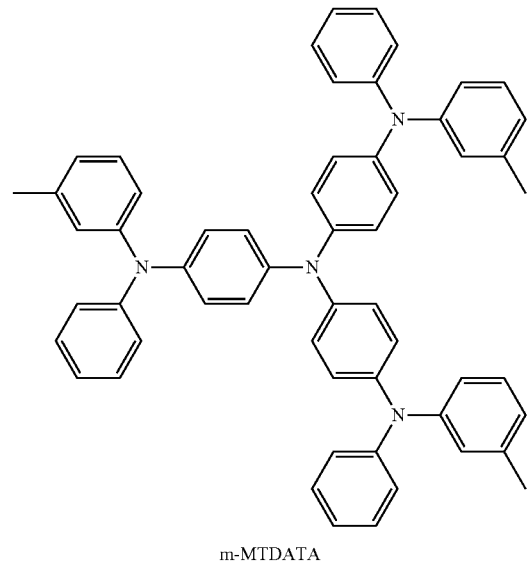

m-MTDATA

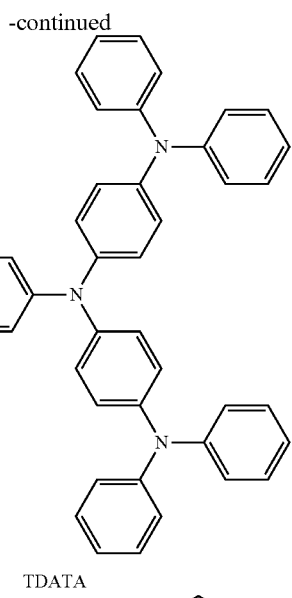

TDATA

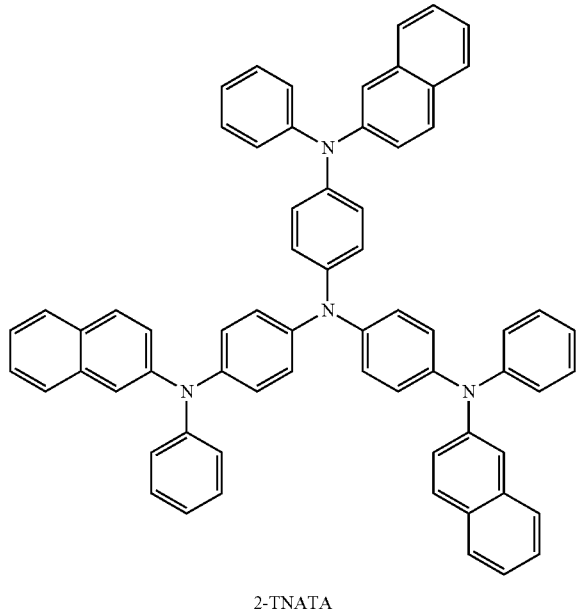

2-TNATA

Examples of the hole transport material unlimitedly include carbazole derivatives such as N-phenylcarbazole and polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), N,N'-di(1-naphthyl)-N,N'-diphenylbenzidine (NPB).

If the hole injection and transport layer 107 includes a hole injection layer and a hole transport layer, a thickness of the hole injection may be from about 100 Å to about 10000 Å, for example, from about 100 Å to about 1500 Å, and a thickness of the hole transport layer may be from about 100 Å to about 10000 Å, for example, from about 100 Å to about 1500 Å. If the thicknesses of the hole injection layer and the hole transport layer are within the above ranges, the organic light emitting diode 100 substantially having no increase of a driving voltage may be realized.

The hole injection and transport layer 107 may further include a charge-generating material, aside from the hole injection material and the hole transport material described above, so as to improve conductivity of the hole injection and transport layer 107.

The charge-generating material may be a p-dopant. Examples of the p-dopant unlimitedly include quinone derivatives such as tetracyanoquinodimethane (TCNQ) and 2,3,5,6-tetrafluoro-tetracyano-1,4-benzoquinondimethane (F4TCNQ); metal oxides such as a tungsten oxide and a molybdenum oxide; and cyano group-containing compounds such as a compound 100 below.

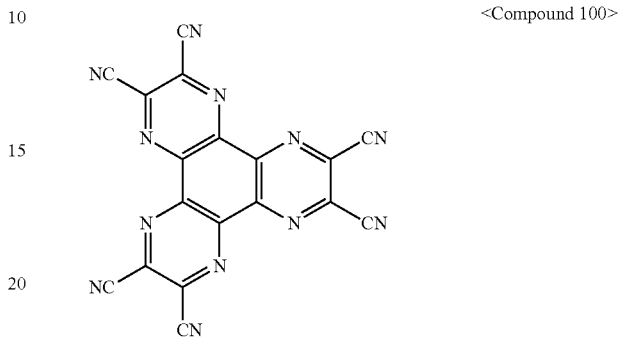

<Compound 100>

If the hole injection and transport layer 107 further includes the charge-generating material, the charge-generating material may be homogeneously or heterogeneously dispersed in the hole injection and transport layer 107.

The first emission layer 113-1 may be disposed on the hole injection and transport layer 107 of the first sub-pixel by using a method such as a vacuum deposition method, a spin coating method, a cast method, an LB method, an inkjet printing method, a laser printing method, or a laser thermal transfer method. If the first emission layer 113-1 is disposed by using the vacuum deposition method or the spin coating method, deposition conditions may differ according to a used compound, but may be generally selected from the similar conditions of disposing the hole injection and transport layer 107.

When the first color light is a blue light, the first emission layer 113-1 may include a well known blue emitting material. For example, the first emission layer 113-1 may include a well known host and dopant.

Examples of the well known host include $Alq_3$, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl) anthracene (TBADN), E3, and distyrylarylene (DSA), but are not limited thereto.

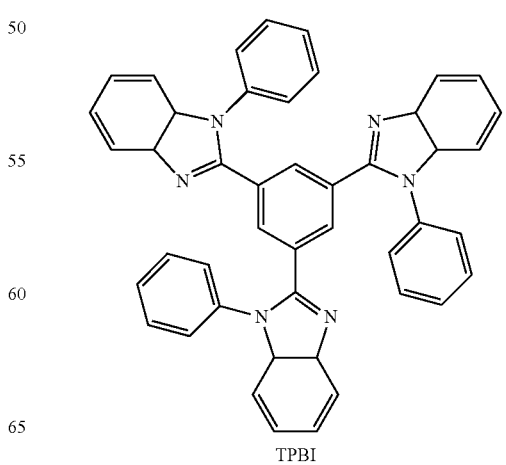

TPBI

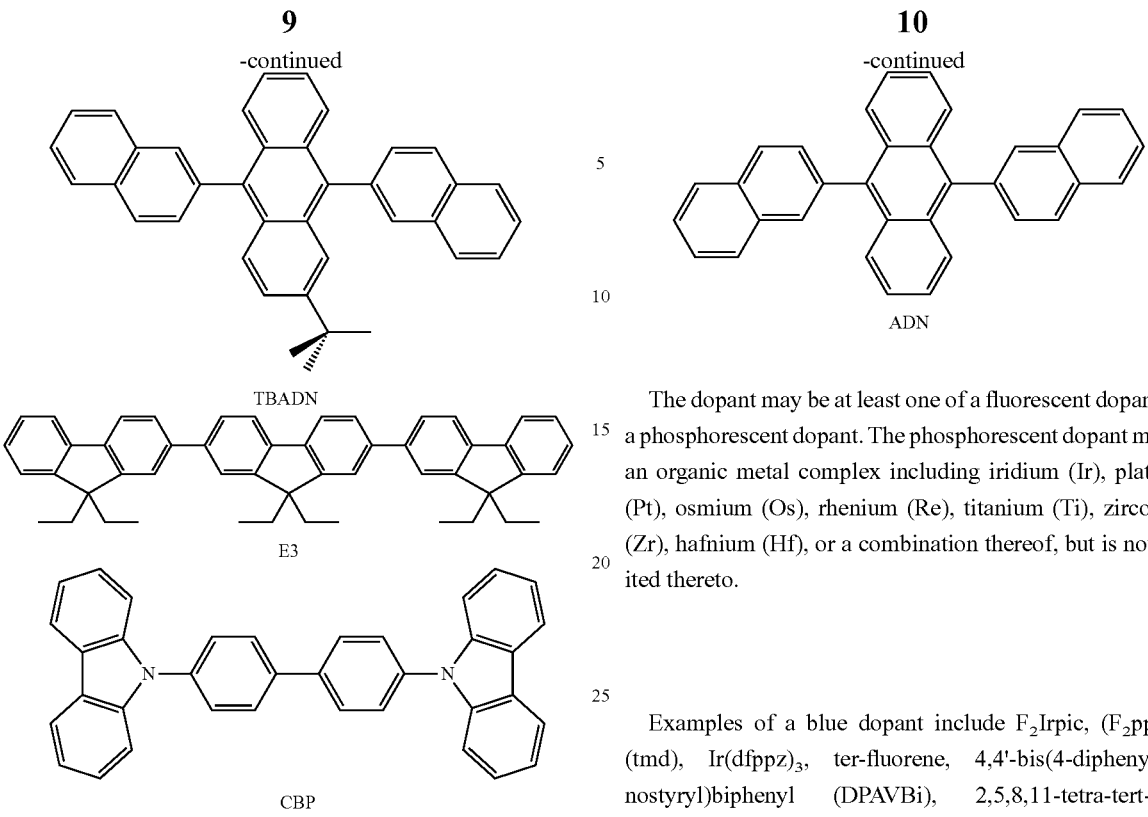

The dopant may be at least one of a fluorescent dopant and a phosphorescent dopant. The phosphorescent dopant may be an organic metal complex including iridium (Ir), platinum (Pt), osmium (Os), rhenium (Re), titanium (Ti), zirconium (Zr), hafnium (Hf), or a combination thereof, but is not limited thereto.

Examples of a blue dopant include $F_2Irpic$, $(F_2ppy)_2Ir(tmd)$, $Ir(dfppz)_3$, ter-fluorene, 4,4'-bis(4-diphenylaminostyryl)biphenyl (DPAVBi), 2,5,8,11-tetra-tert-butyl perylene (TBPe), and DPVBi, but is not limited thereto.

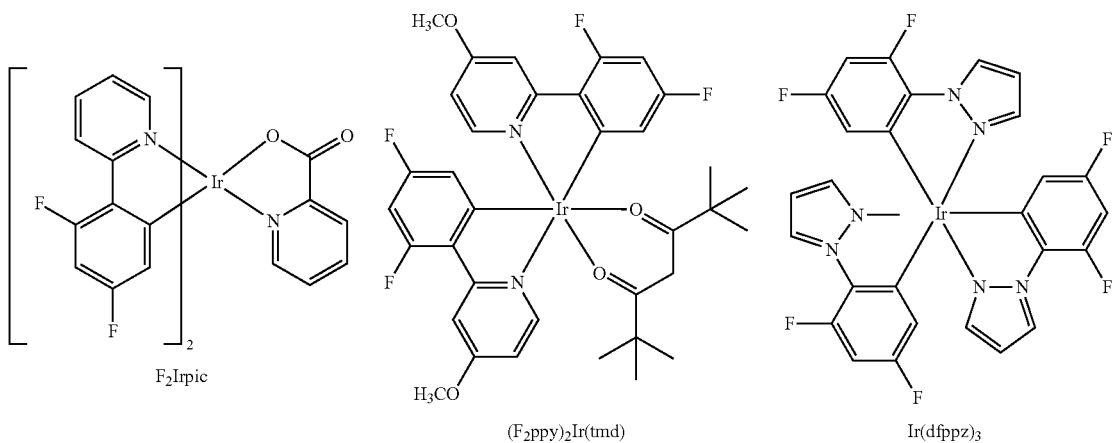

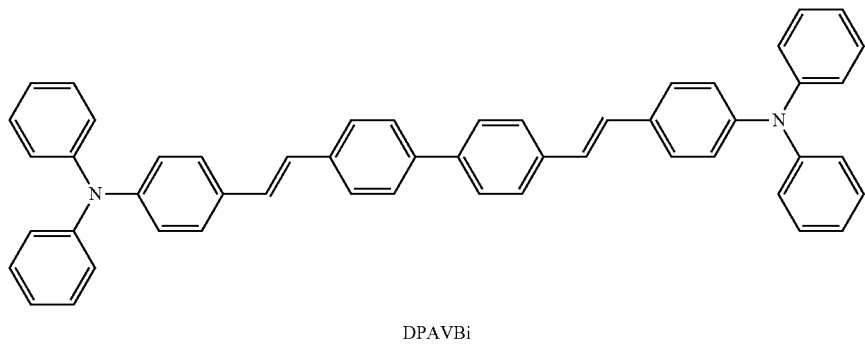

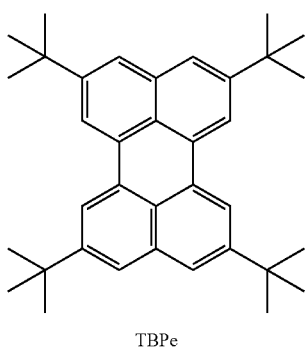

TBPe

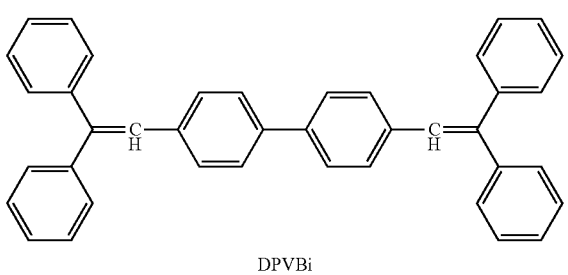

DPVBi

A thickness of the first emission layer 113-1 may be from 100 Å to 500 Å, for example, from 150 Å to 300 Å. If the thickness of the first emission layer 113-1 is within the above range, the organic light emitting diode 100 substantially having no increase of a driving voltage may be realized.

Then, the first layer 110 including an ambipolar compound is disposed as a common layer, and the second emission layer 113-2 and the third emission layer 113-3 are respectively disposed on the first layer 110 in the second sub-pixel and the third sub-pixel. Accordingly, the first region of the first layer 110 is disposed between the first emission layer 113-1 and the second electrode 119 to transfer electrons injected from the second electrode 119 (if the second electrode 119 is a cathode) to the first emission layer 113-1, and the second region of the first layer 110 between the second emission layer 133-2 and the first electrode 103 and the third region of the first layer 110 between the third emission layer 133-3 and the first electrode 103 respectively transfer holes injected from the first electrode 103 (if the first electrode 103 is an anode) to the second emission layer 113-2 and the third emission layer 113-3, or vice versa if the first electrode 103 is a cathode and the second electrode 119 is an anode. This is possible since the first layer 110 includes the ambipolar compound. The ambipolar compound is a compound having excellent electron transport and hole transport capabilities.

Herein, "a first region of a first layer" or "a first region" denotes a region of the first layer disposed in a first sub-pixel, "a second region of a first layer" or "a second region" denotes a region of the first layer disposed in a second sub-pixel, and "a third region of a first layer" or "a third region" denotes a region of the first layer disposed in a third sub-pixel, which will be easily understood through FIGS. 1, 3, 4, and 5.

The ambipolar compound may be represented by one of Formulas 1 through 3 below:

<Formula 1>

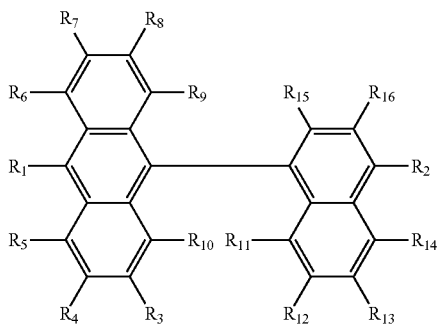

<Formula 2>

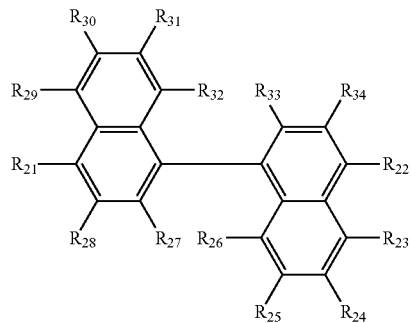

<Formula 3>

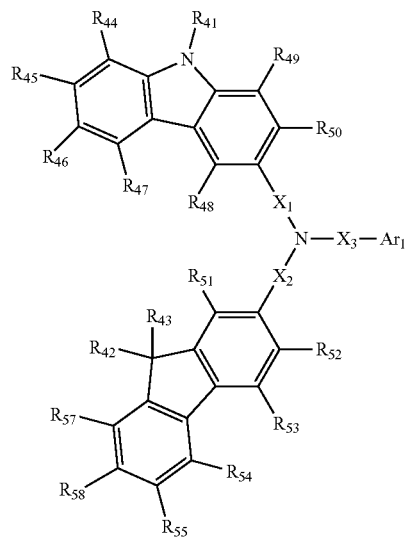

In Formulas 1 through 3, each of $R_1$ through $R_{16}$, $R_{21}$ through $R_{34}$, and $R_{41}$ through $R_{57}$ is independently one of hydrogen, heavy hydrogen, a halogen atom, a hydroxyl group, a cyano group, a nitro group, a carboxyl group, a substituted or unsubstituted $C_1$-$C_{50}$ alkyl group, a substituted or unsubstituted $C_2$-$C_{50}$ alkenyl group, a substituted or unsubstituted $C_2$-$C_{50}$ alkynyl group, a substituted or unsubstituted $C_1$-$C_{50}$ alkoxy group, a substituted or unsubstituted $C_3$-$C_{50}$ cycloalkyl group, a substituted or unsubstituted $C_5$-$C_{50}$ aryl group, a substituted or unsubstituted $C_5$-$C_{50}$ aryloxy group, a substituted or unsubstituted $C_5$-$C_{50}$ arylthio group, a substituted or unsubstituted $C_2$-$C_{50}$ heteroaryl group, —N($R_{70}$)($R_{71}$), and —Si($R_{72}$)($R_{73}$)($R_{74}$);

each of $X_1$, $X_2$, and $X_3$ is independently a single bond, a substituted or unsubstituted $C_5$-$C_{50}$ arylene group and a substituted or unsubstituted $C_2$-$C_{50}$ heteroarylene group;

$Ar_1$ is a substituted or unsubstituted $C_2$-$C_{50}$ heteroaryl group; and each of $R_{70}$ through $R_{74}$ is independently one of hydrogen, heavy hydrogen, a halogen atom, a hydroxyl group, a cyano group, a nitro group, a carboxyl group, a substituted or unsubstituted $C_1$-$C_{50}$ alkyl group, a substituted or unsubstituted $C_2$-$C_{50}$ alkenyl group, a substituted or unsubstituted $C_2$-$C_{50}$ alkynyl group, a substituted or unsubstituted $C_1$-$C_{50}$ alkoxy group, a substituted or unsubstituted $C_3$-$C_{50}$ cycloalkyl group, a substituted or unsubstituted $C_5$-$C_{50}$ aryl group, a substituted or unsubstituted $C_5$-$C_{50}$ aryloxy group, a substituted or unsubstituted $C_5$-$C_{50}$ arylthio group, and a substituted or unsubstituted $C_2$-$C_{50}$ heteroaryl group.

For example, in Formulas 1 through 3, each of $R_1$ through $R_{16}$ and $R_{21}$ through $R_{34}$, and $R_{41}$ through $R_{57}$ may be independently hydrogen, heavy hydrogen, a halogen atom, a hydroxyl group, a cyano group, a substituted or unsubstituted $C_1$-$C_{10}$ alkyl group, a substituted or unsubstituted $C_2$-$C_{10}$ alkenyl group, a substituted or unsubstituted alkynyl group, a substituted or unsubstituted $C_1$-$C_{10}$ alkoxy group, a substituted or unsubstituted $C_5$-$C_{16}$ aryl group, a substituted or unsubstituted $C_2$-$C_{16}$ heteroaryl group, or —N($R_{70}$)($R_{71}$), but is not limited thereto.

In detail, each of $R_1$ trough $R_{16}$, $R_{21}$ through $R_{34}$, and $R_{41}$ through $R_{57}$ may be independently hydrogen, heavy hydrogen, a halogen atom, a hydroxyl group, a cyano group, a methyl group, an ethyl group, a propyl group, a butyl group, a pentyl group, an ethenyl group, a prophenyl group, a butenyl group, a pentenyl group, an acetyl group, a methoxy group, an ethoxy group, a propoxy group, a butoxy group, a pentoxy group, a substituted or unsubstituted phenyl group, a substituted or unsubstituted pentalenyl group, a substituted or unsubstituted indenyl group, a substituted or unsubstituted naphthyl group, a substituted or unsubstituted azulenyl, a substituted or unsubstituted heptalenyl, a substituted or unsubstituted indacenyl, a substituted or unsubstituted acenaphthyl group, a substituted or unsubstituted fluorenyl group, a substituted or unsubstituted phenalenyl group, a substituted or unsubstituted phenanthrenyl group, a substituted or unsubstituted anthracenyl group, a substituted or unsubstituted fluoranthenyl group, a substituted or unsubstituted triphenylenyl group, a substituted or unsubstituted pyrenyl group, a substituted or unsubstituted chrysenylenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted pyrazolyl group, a substituted or unsubstituted imidazolyl group, a substituted or unsubstituted imidazolinyl group, a substituted or unsubstituted imidazopyridinyl group, a substituted or unsubstituted imidazopyrimidinyl group, a substituted or unsubstituted pyridinyl group, a substituted or unsubstituted pyrazinyl group, a substituted or unsubstituted pyrimidinyl group, a substituted or unsubstituted indolyl group, a substituted or unsubstituted purinyl group, a substituted or unsubstituted quinolinyl group, a substituted or unsubstituted phthalazinyl group, a substituted or unsubstituted indolizinyl group, a substituted or unsubstituted naphthyridinyl group, a substituted or unsubstituted quinazolinyl group, a substituted or unsubstituted cinnolinyl group, a substituted or unsubstituted indazolyl group, a substituted or unsubstituted carbazolyl group, a substituted or unsubstituted phenazinyl group, a substituted or unsubstituted phenanthridinyl group, a substituted or unsubstituted pyranyl group, a substituted or unsubstituted chromenyl group, a substituted or unsubstituted benzofuranyl group, a substituted or unsubstituted thiophenyl group, a substituted or unsubstituted benzothiophenyl group, a substituted or unsubstituted isothiazolyl group, a substituted or unsubstituted benzoimidazolyl group, a substituted or unsubstituted isoxazolyl group, a substituted or unsubstituted puranyl group, a substituted or unsubstituted pyrimidinyl group, a substituted or unsubstituted triazinyl group, or —N($R_{70}$)($R_{71}$), but is not limited thereto. Each of $R_{70}$ and $R_{71}$ may be independently a substituted or unsubstituted phenyl group, a substituted or unsubstituted naphthyl group, a substituted or unsubstituted pyridinyl group, or a substituted or unsubstituted quinolyl group, but is not limited thereto.

For example, each of $R_1$ through $R_{16}$, $R_{21}$ through $R_{34}$, and $R_{41}$ through $R_{57}$ may be independently one of Formulas 5A through 5P below:

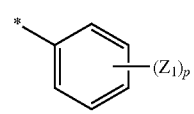

Formula 5A

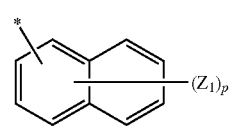

Formula 5B

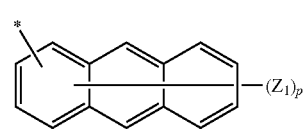

Formula 5C

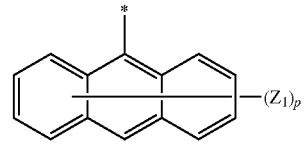

Formula 5D

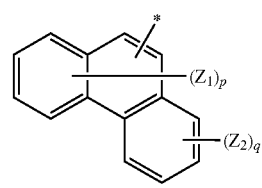

Formula 5E

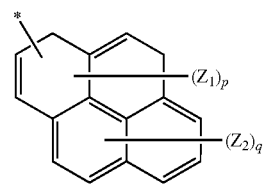

Formula 5F

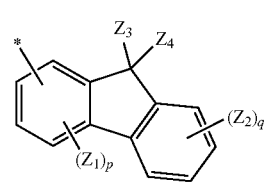

Formula 5G

-continued

Formula 5H
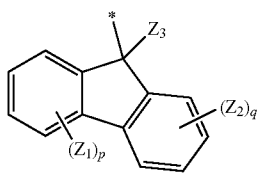

Formula 5I
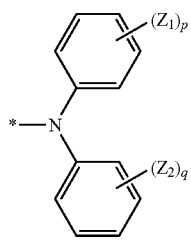

Formula 5J
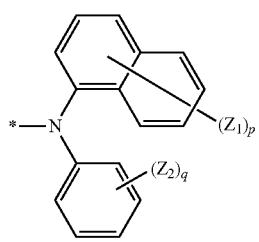

Formula 5K
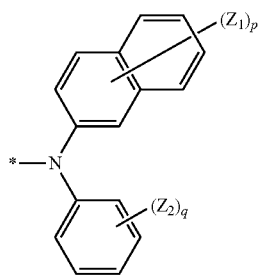

Formula 5L
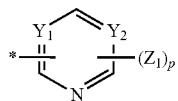

Formula 5M
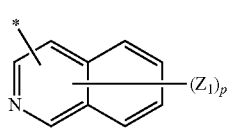

Formula 5N
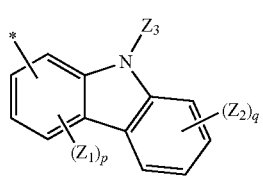

Formula 5O
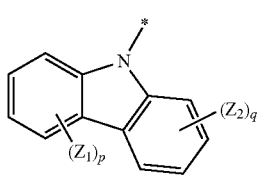

Formula 5P
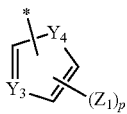

In Formulas 5A through 5P, each of $Z_1$ through $Z_4$ may be independently hydrogen, heavy hydrogen, a halogen atom, a hydroxyl group; a cyano group, a nitro group, a carboxyl group, a $C_1$-$C_{10}$ alkyl group, a $C_1$-$C_{10}$ alkoxy group, a $C_5$-$C_{16}$ aryl group, or a $C_2$-$C_{16}$ heteroaryl group; each of $Y_1$ through $Y_3$ may be independently —C($R_{81}$)($R_{82}$)═ or —N═; $Y_4$ may be —S—, —O—, or —N($R_{84}$)—; each of $R_{81}$ through $R_{84}$ may be independently hydrogen, heavy hydrogen, a halogen atom, a hydroxyl group, a cyano group, a nitro group, a carboxyl group, a $C_1$-$C_{10}$ alkyl group, a $C_1$-$C_{10}$ alkoxy group, a $C_5$-$C_{16}$ aryl group, or a $C_2$-$C_{16}$ heteroaryl group; p is an integer from 1 to 9; and q is an integer from 1 to 5.

When p is equal to or above 2, at least two $Z_1$ may be identical to or different from each other, and when q is equal to or above 2, at least two $Z_2$ may be identical to or different from each other.

For example, in Formulas 5A through 5P, each of $Z_1$ through $Z_4$ may be independently hydrogen, heavy hydrogen, a halogen atom, a hydroxyl group, a cyano group, a nitro group, a carboxyl group, a methyl group, an ethyl group, a propyl group, a butyl group, a pentyl group, a hexyl group, a heptyl group, an octyl group, a methoxy group, an ethoxy group, a propoxy group, a butoxy group, a pentoxy group, a phenyl group, a naphthyl group, an anthryl group, a pyrenyl group, a pyridinyl group, a pyrimidinyl group, a triazyl group, a puranyl group, a thiophenyl group, or an isoxazolyl group; each of $Y_1$ through $Y_3$ may be —C($R_{81}$)($R_{82}$)═ or —N═; $Y_4$ may be —S—, —O—, or —N($R_{84}$)—; each of $R_{81}$ through $R_{84}$ may be independently hydrogen, heavy hydrogen, a halogen atom, a hydroxyl group, a cyano group, a nitro group, a carboxyl group, a methyl group, an ethyl group, a propyl group, a butyl group, a pentyl group, a hexyl group, a heptyl group, an octyl group, a methoxy group, an ethoxy group, a propoxy group, a butoxy group, a pentoxy group, a phenyl group, a naphthyl group, an anthryl group, a pyrenyl group, a pyridinyl group, a pyrimidinyl group, a triazinyl group, a puranyl group, a thiophenyl group, or an isoxazolyl group; p may be an integer from 1 to 9; and q may be an integer from 1 to 5, but are not limited thereto.

The compound represented by Formula 1 above may be represented by Formula 1a below, and the compound represented by Formula 2 above may be represented by Formula 2a below:

<Formula 1a>

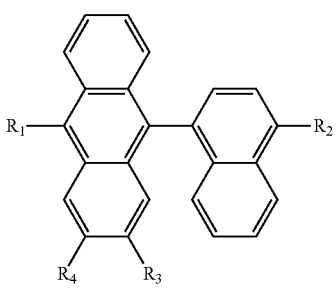

<Formula 2a>
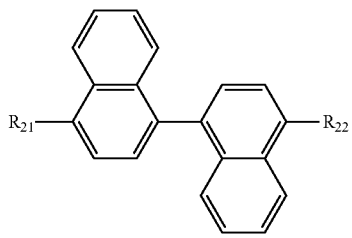
In Formulas 1a and 2a, details about $R_1$ through $R_4$ and $R_{21}$ through $R_{22}$ are as described above. For example, each of $R_1$ through $R_4$ and $R_{21}$ through $R_{22}$ may be independently one of formulas 5A through 5P above, but is not limited thereto.
Examples about the compound represented by Formula 1 above include Compounds 1 through 58 below, but are not limited thereto:
1
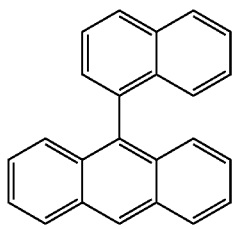
2
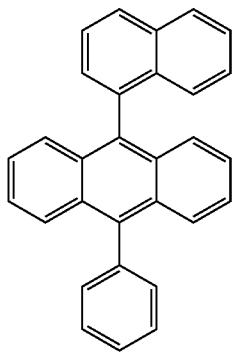
3
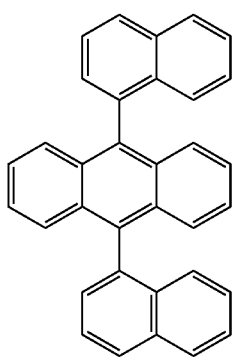
4
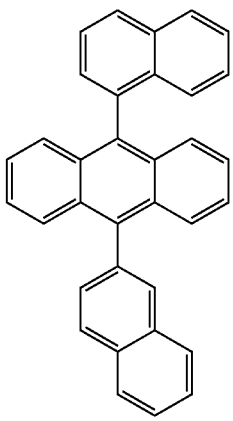
5
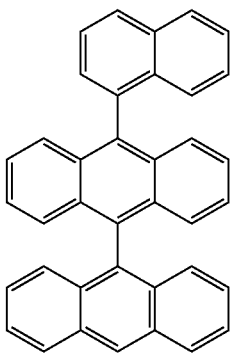
6
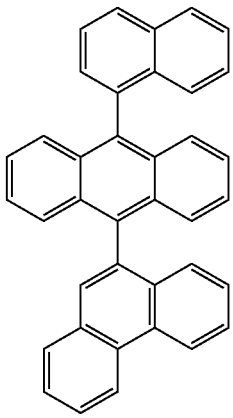
7
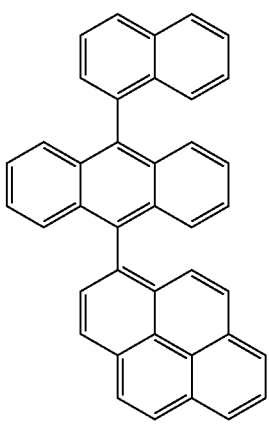

8
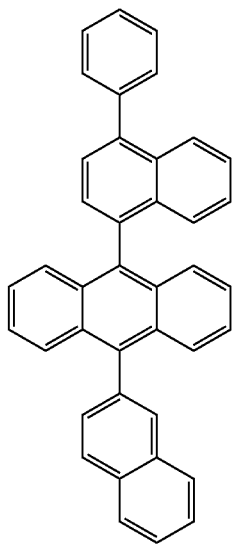
9
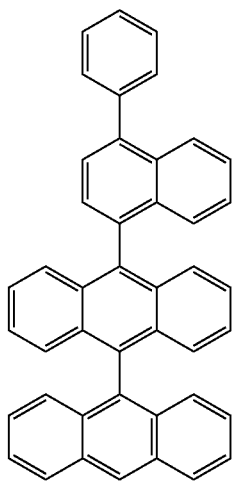
10
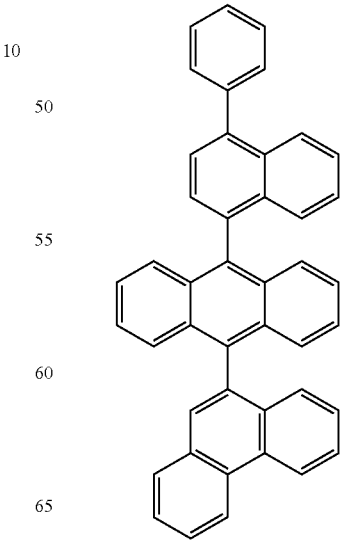
-continued
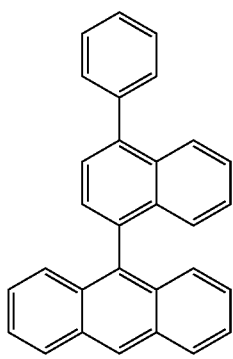
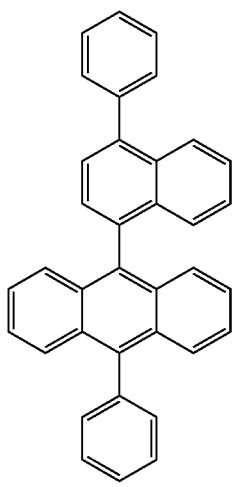
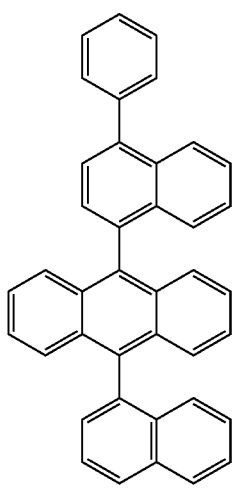

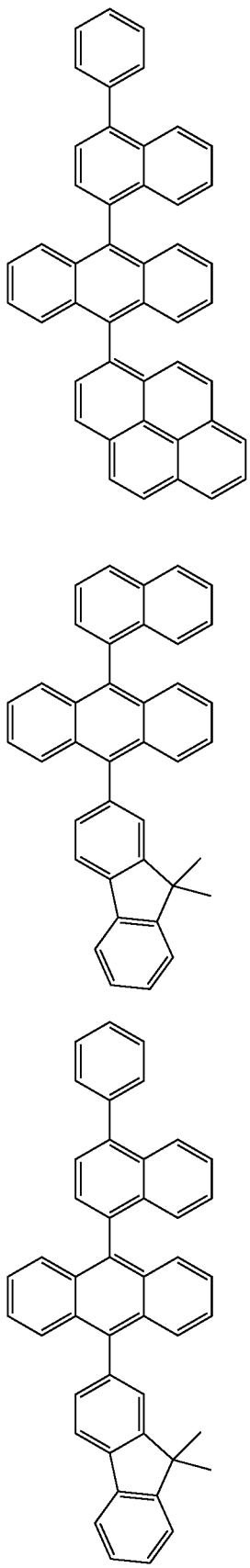
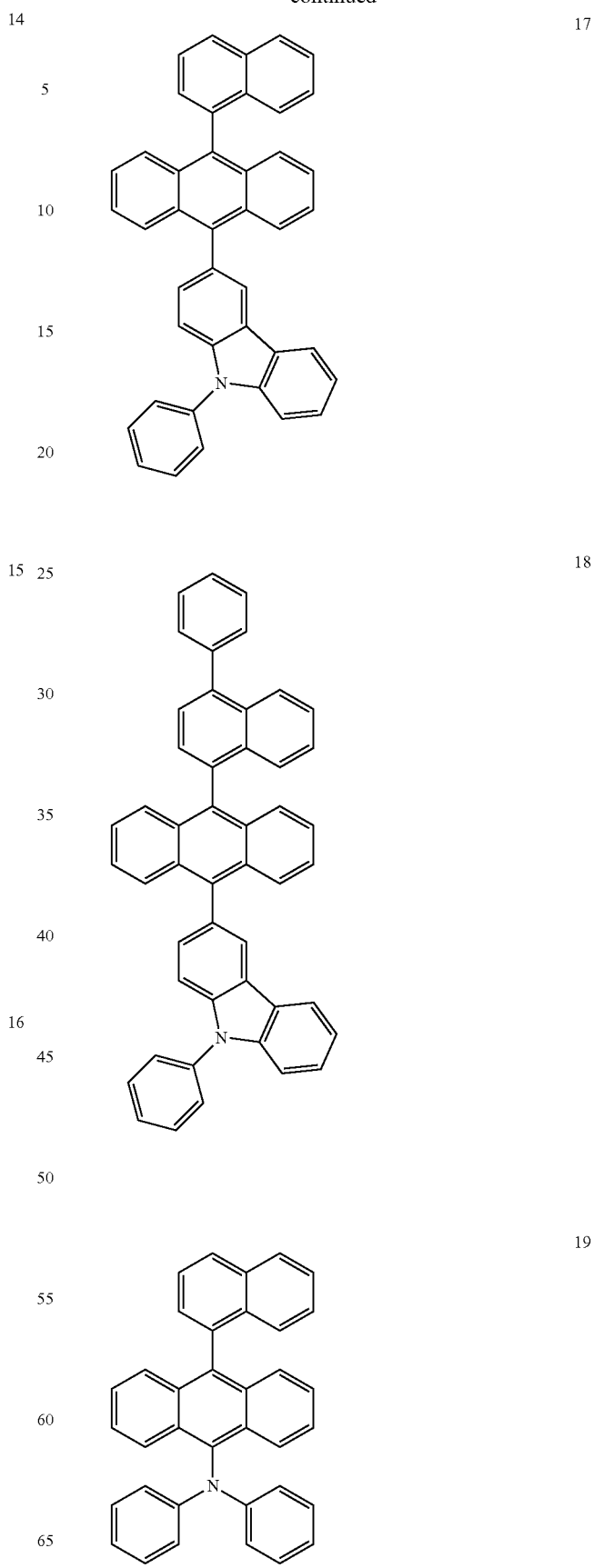

20
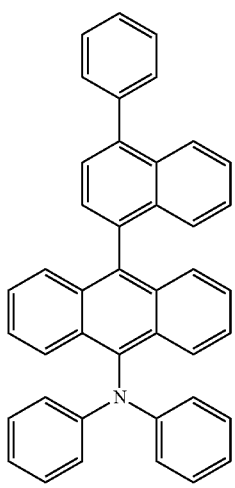
21
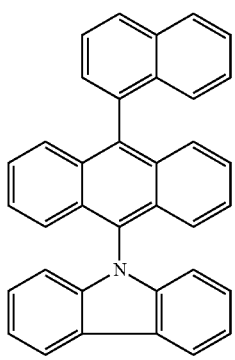
22
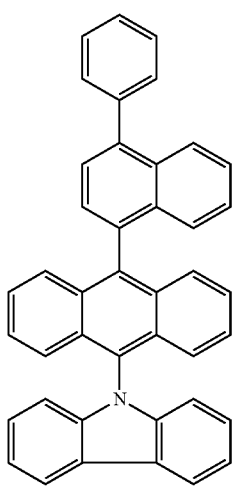
23
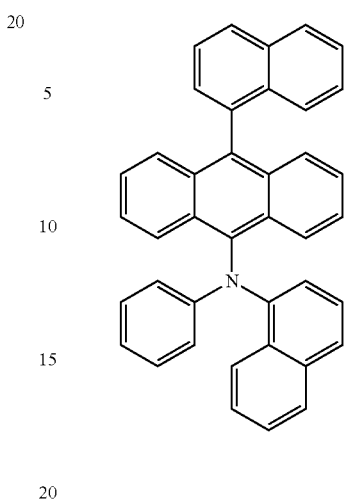
24
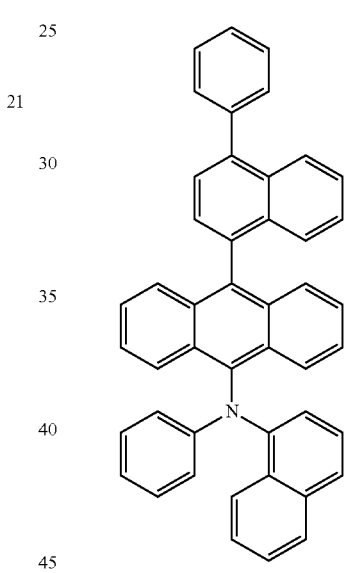
25
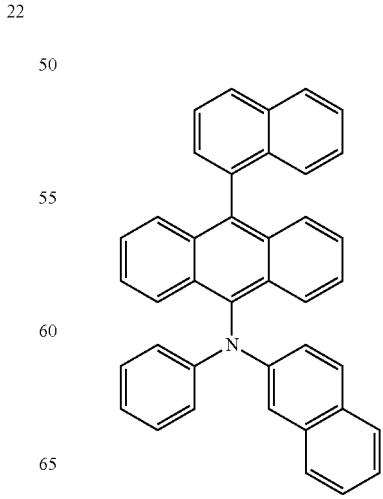

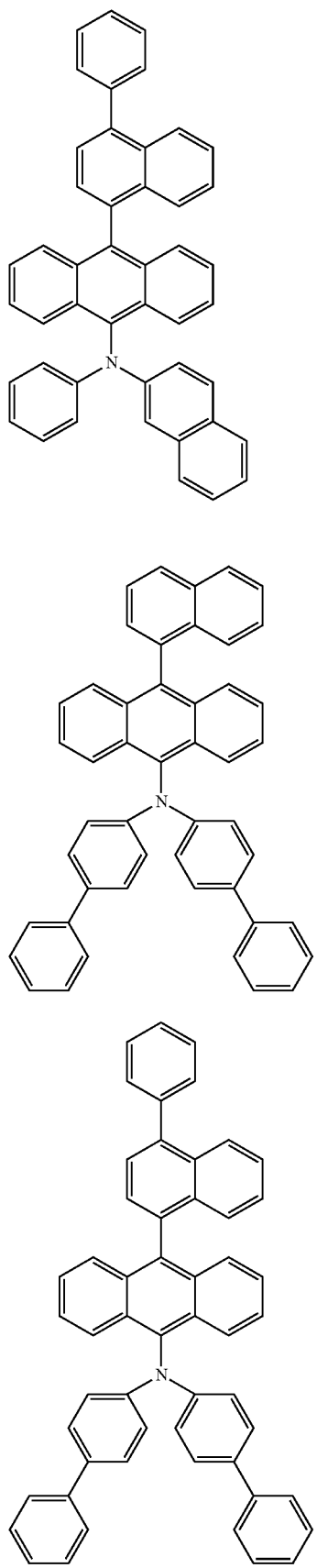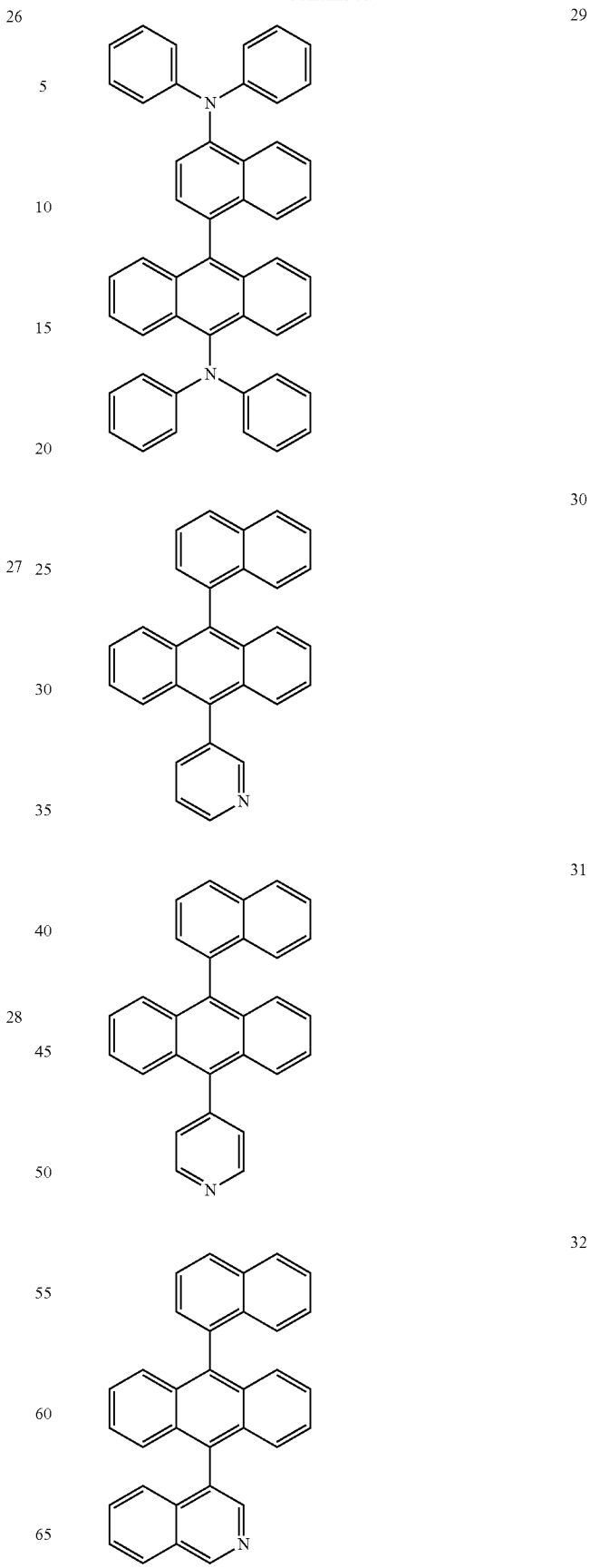

33
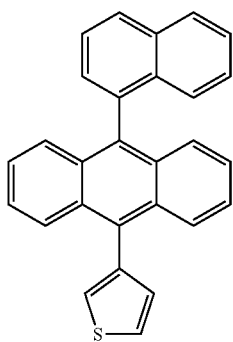
34
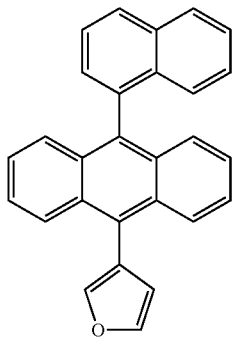
35
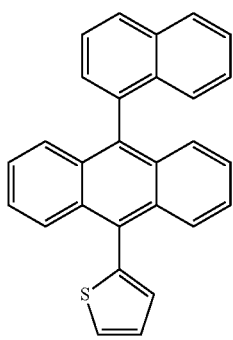
36
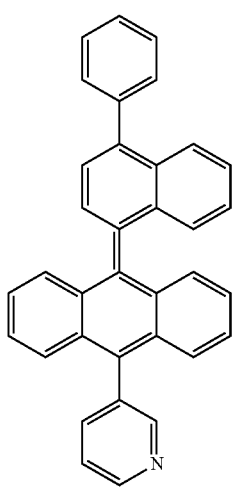
37
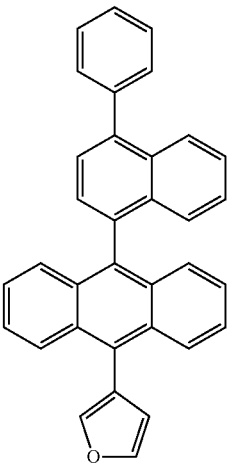
38
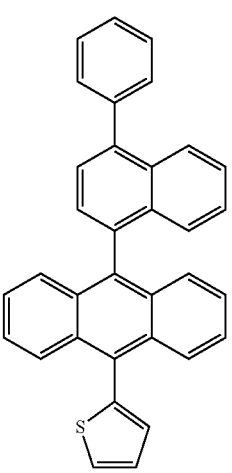
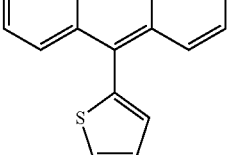
39
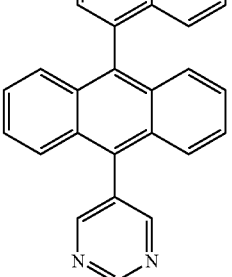
40
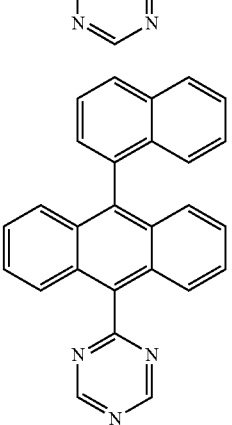

41
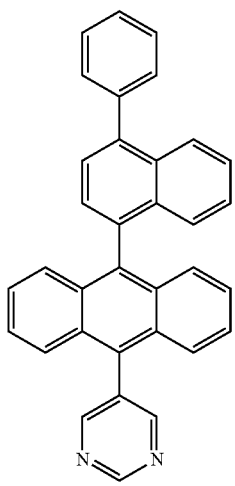
42
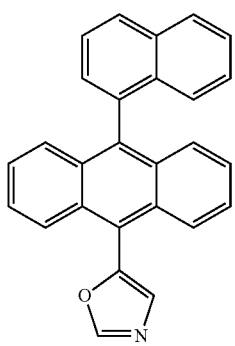
43
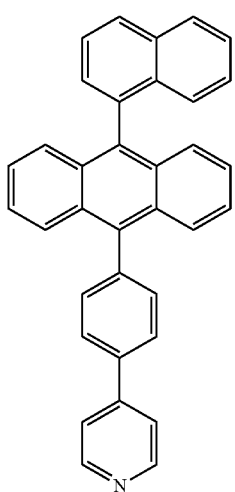
44
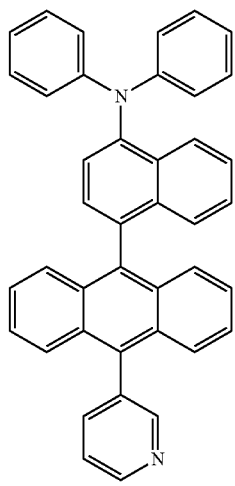
45
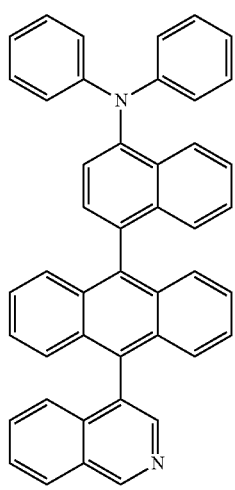
46
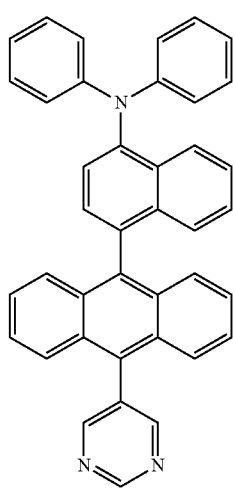

-continued
47
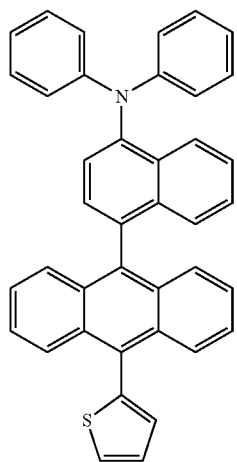
48
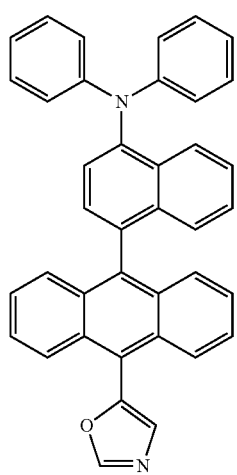
49
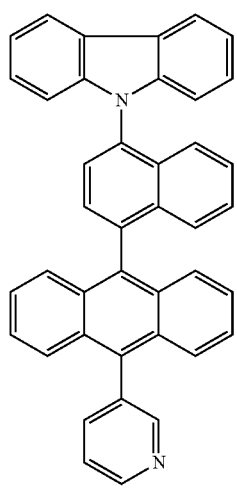
-continued
50
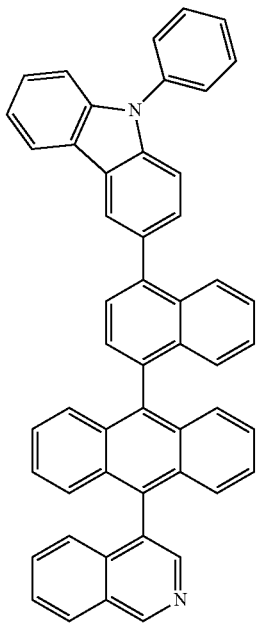
51
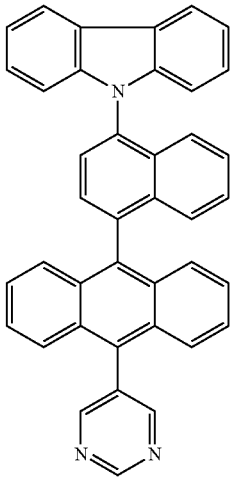
52
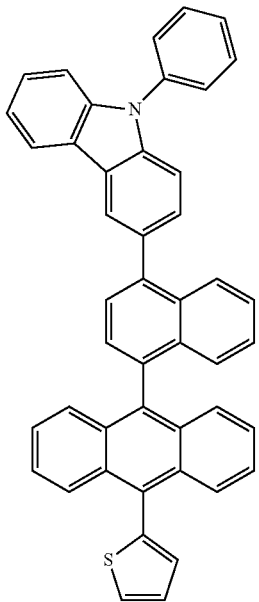

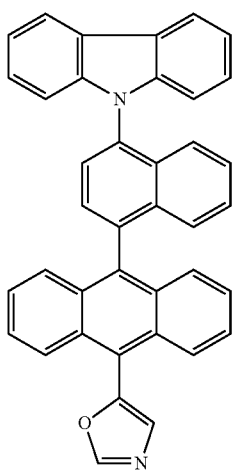
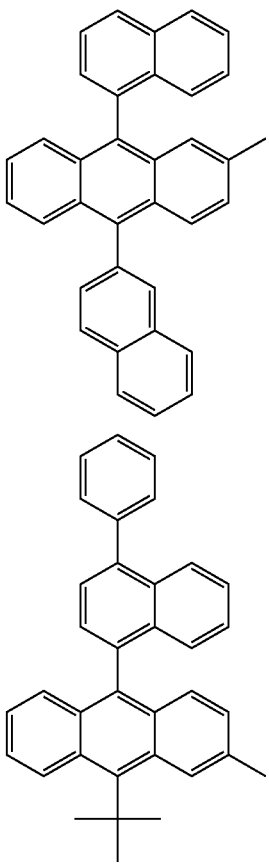
The compound represented by Formula 2 above may be one of Formulas 59 through 78 below, but is not limited thereto:
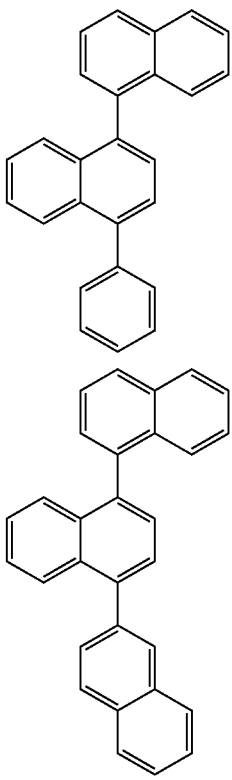

61
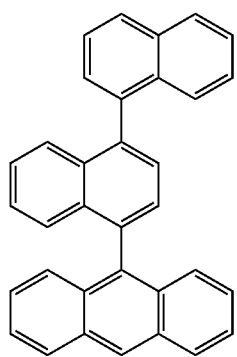
62
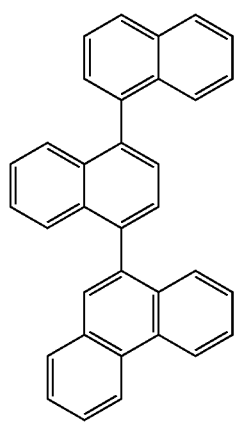
63
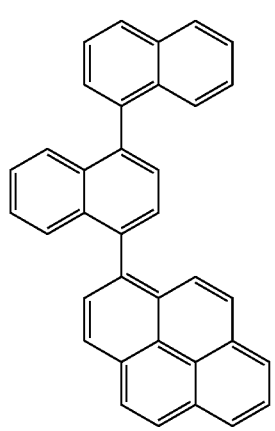
64
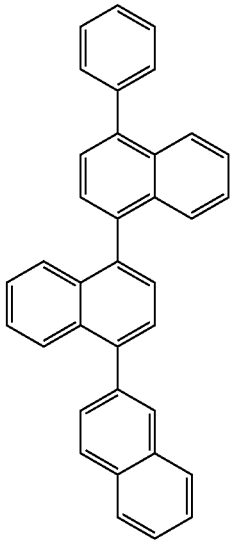
65
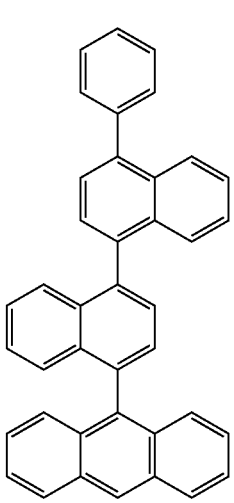
66
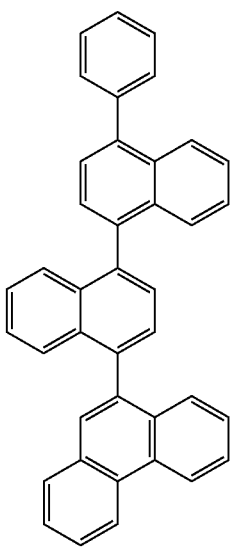

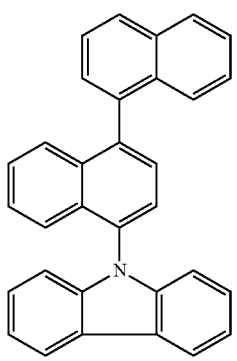
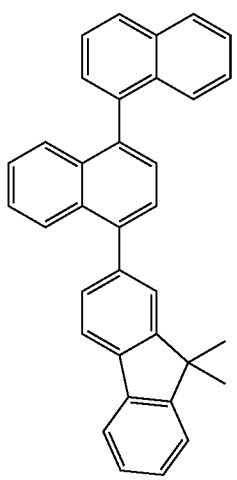
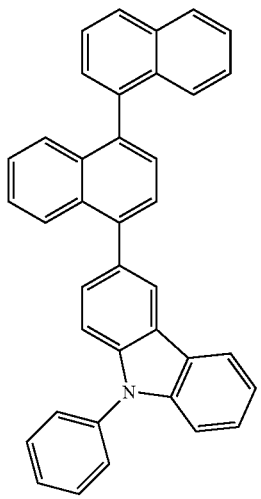
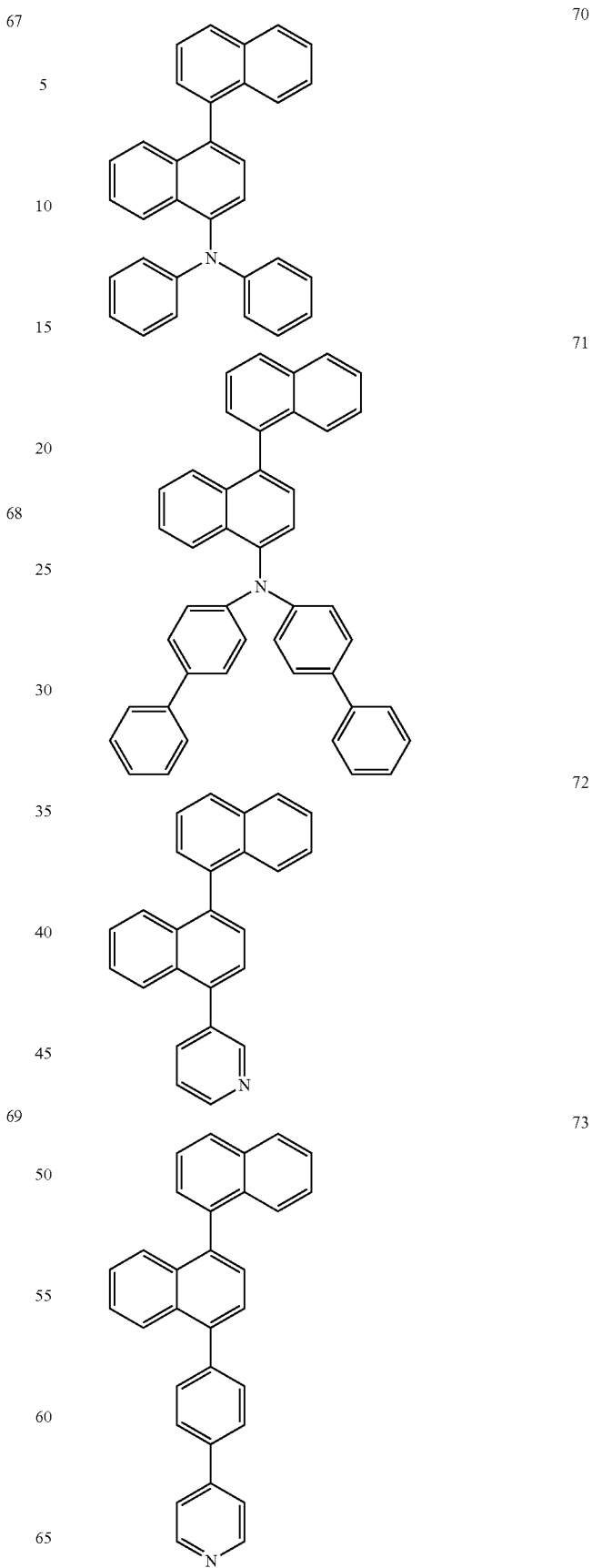

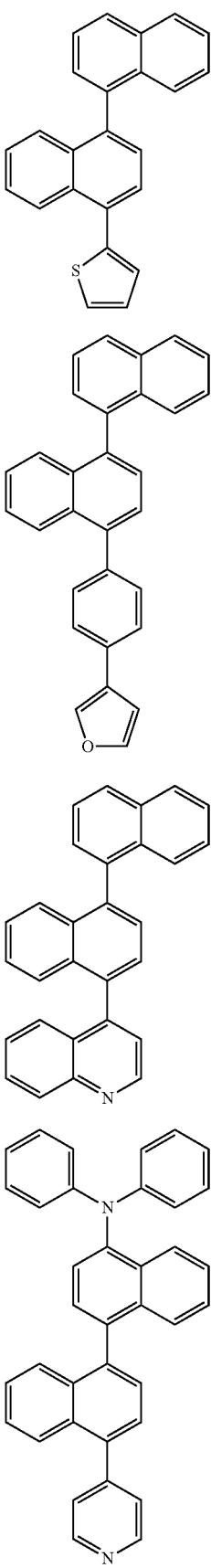

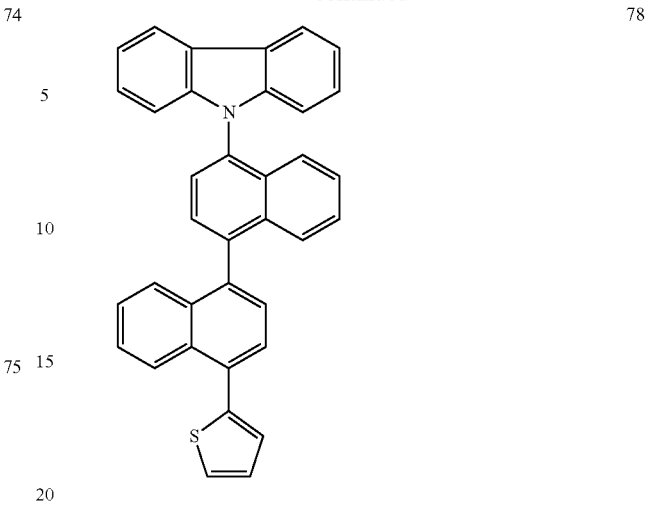

In Formula 3, each of $X_1$ through $X_3$ may be independently a single bond, a substituted or unsubstituted $C_5$-$C_{16}$ arylene group, or a substituted or unsubstituted $C_3$-$C_{16}$ heteroarylene group, but is not limited thereto.

For example, each of $X_1$ through $X_3$ may be independently a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted penalenylene group, a substituted or unsubstituted penantrenylene group, a substituted or unsubstituted anthrylene group, a substituted or unsubstituted fluorantenylene group, a substituted or unsubstituted triphenylenylene group, a substituted or unsubstituted pyrenylene group, a substituted or unsubstituted crysenylene group, a substituted or unsubstituted naphthasenylene group, a substituted or unsubstituted picenylene group, a substituted or unsubstituted perylenylene group, a substituted or unsubstituted pentacenylene group, a substituted or unsubstituted hexacenylene group, a substituted or unsubstituted pyrrolyene group, a substituted or unsubstituted pyrazolylene group, a substituted or unsubstituted imidazolylene group, a substituted or unsubstituted imidazolynylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolyzinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted penazinylene group, a substituted or unsubstituted penanthridinylene group, a substituted or unsubstituted pyranylene group, a substituted or unsubstituted chromenylene group, a substituted or unsubstituted benzopuranylene group, a substituted or unsubstituted thiophenylene group, a substituted or unsubstituted benzothiophenylene group, a substituted or unsubstituted isothiazolylene group, a substituted or unsubstituted benzoimidazolylene group, substituted or unsubstituted isoxazolyene group, a substituted or unsubstituted puranylene group, a substituted or unsubstituted pyrimidinylene 17, group, or a substituted or unsubstituted triazinylene group, but is not limited thereto.

Each of $X_1$ through $X_3$ may be independently one of a single bond and Formulas 7A through 7D, but is not limited thereto:

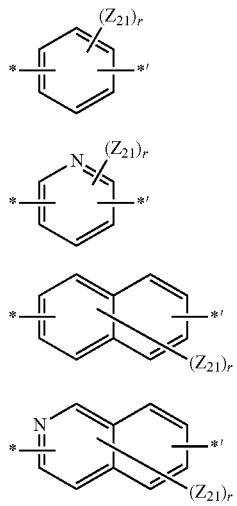

Formula 7A

Formula 7B

Formula 7C

Formula 7D $Z_{21}$ may be hydrogen, heavy hydrogen, a halogen atom, a hydroxyl group, a cyano group, a nitro group, a carboxyl group, a $C_1$-$C_{10}$ alkyl group, a $C_1$-$C_{10}$ alkoxy group, a $C_5$-$C_{16}$ aryl group, or a $C_2$-$C_{16}$ heteroaryl group; and r may be from 1 to 6.

For example, $Z_{21}$ may be hydrogen, heavy hydrogen, a halogen atom, a hydroxyl group, a cyano group, a nitro group, a carboxyl group, a methyl group, an ethyl group, a propyl group, a butyl group, a pentyl group, a hexyl group, a heptyl group, an octyl group, a methoxy group, an ethoxy group, a propoxy group, a butoxy group, a pentoxy group, a phenyl group, a naphthyl group, an anthryl group, a pyrenyl group, a pyridinyl group, a pyrimidinyl group, a triazyl group, a puranyl group, a thiophenyl group, or an isoxazolyl group, but is not limited thereto.

In Formula 3, $Ar_1$ may be a substituted or unsubstituted pyrrolyl group, a substituted or unsubstituted pyrazolyl group, a substituted or unsubstituted imidazolyl group, a substituted or unsubstituted imidazolinyl group, a substituted or unsubstituted imidazopyridinyl group, a substituted or unsubstituted imidazopyrimidinyl group, a substituted or unsubstituted pyridinyl group, a substituted or unsubstituted pyrazinyl group, a substituted or unsubstituted pyrimidinyl group, a substituted or unsubstituted indolyl group, a substituted or unsubstituted purinyl group, a substituted or unsubstituted quinolinyl group, a substituted or unsubstituted phthalazinyl group, a substituted or unsubstituted indolizinyl group, a substituted or unsubstituted naphthyridinyl group, a substituted or unsubstituted quinazolinyl group, a substituted or unsubstituted cinnolinyl group, a substituted or unsubstituted indazolyl group, a substituted or unsubstituted carbazolyl group, a substituted or unsubstituted phenazinyl group, a substituted or unsubstituted phenanthridinyl group, a substituted or unsubstituted pyranyl group, a substituted or unsubstituted chromenyl group, a substituted or unsubstituted benzofuranyl group, a substituted or unsubstituted thiophenyl group, a substituted or unsubstituted benzothiophenyl group, a substituted or unsubstituted isothiazolyl group, a substituted or unsubstituted benzoimidazolyl group, a substituted or unsubstituted isoxazolyl group, a substituted or unsubstituted puranyl group, a substituted or unsubstituted pyrimidinyl group, or a substituted or unsubstituted triazinyl group, but is not limited thereto.

Examples of $Ar_1$ include Formulas 5A through 5P above, but are not limited thereto.

The compound represented by Formula 3 above may be represented by Formula 3a below:

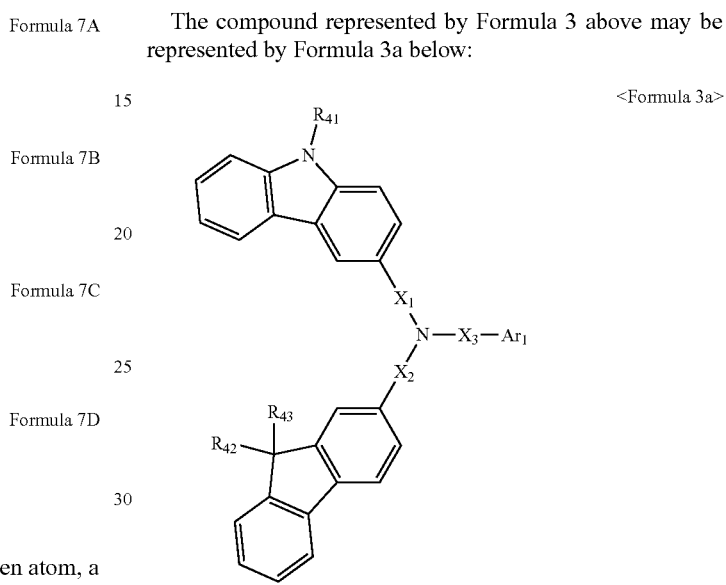

<Formula 3a>

In Formula 3a, details about $R_{41}$ through $R_{43}$, $X_1$ through $X_3$, and $Ar_1$ are as described above. For example, in Formula 3a, each of $R_{41}$ through $R_{43}$ may be independently one of Formulas 5A through 5P, each of $X_1$ through $X_3$ may be independently one of a single bond and Formulas 7A through 7D, and $Ar_1$ may be one of Formulas 5A through 5P. Here, $R_{41}$, $R_{42}$, $R_{43}$, and $Ar_1$ may be identical to or different from each other.

The compound represented by Formula 3 above may be one of Compounds 201 through 261, but is not limited thereto:

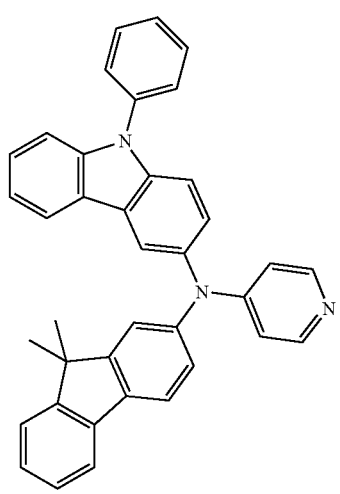

201

202
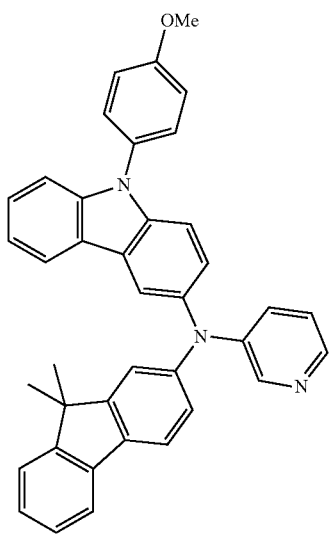
203
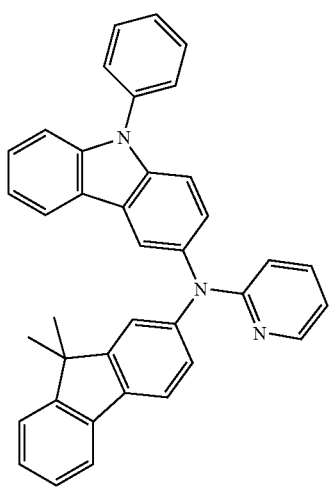
204
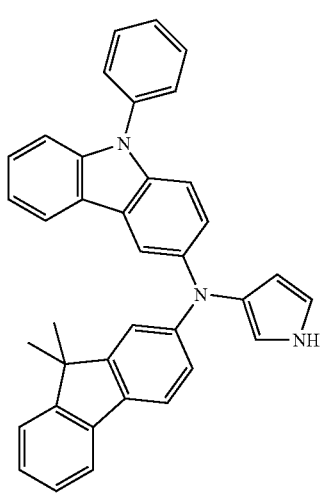
205
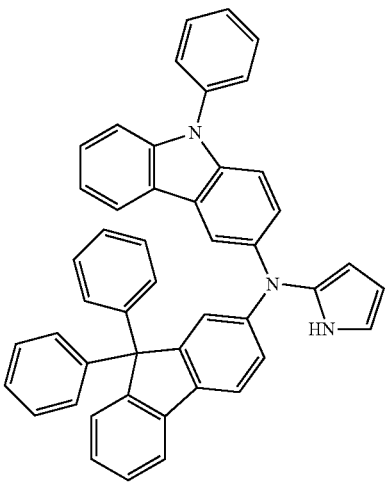
206
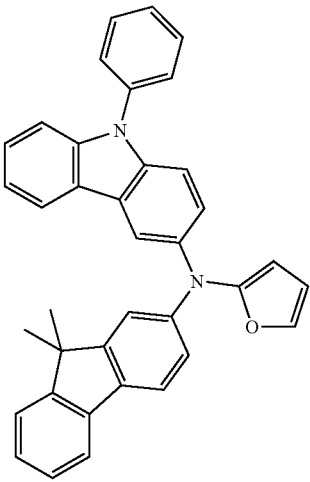
207
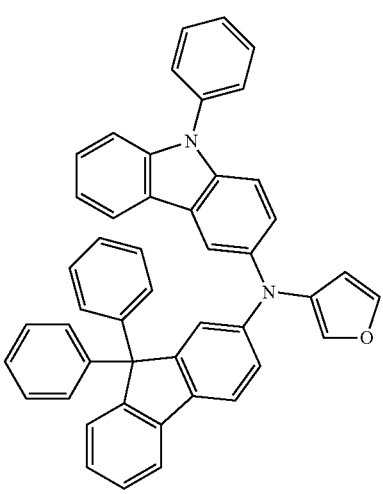

208
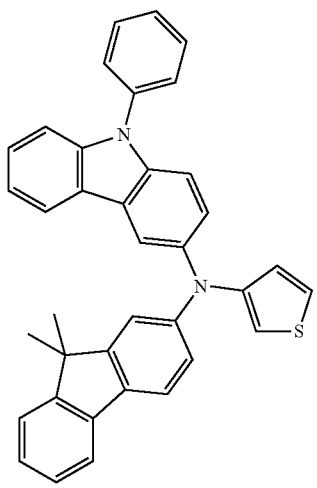
209
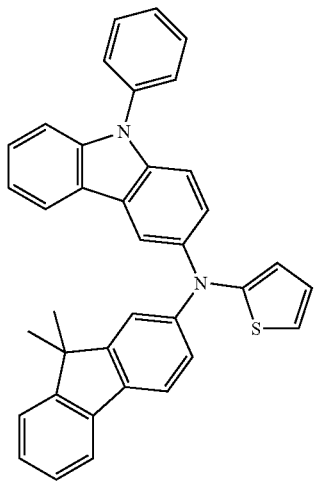
210
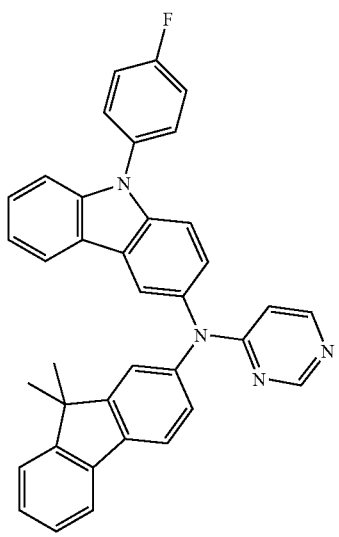
211
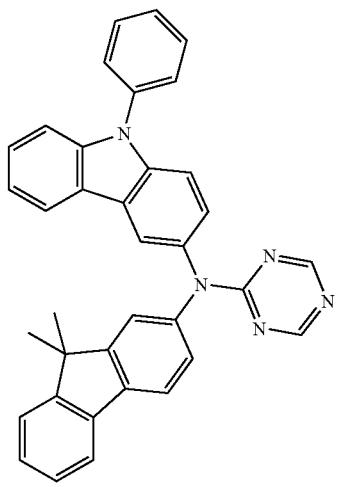
212
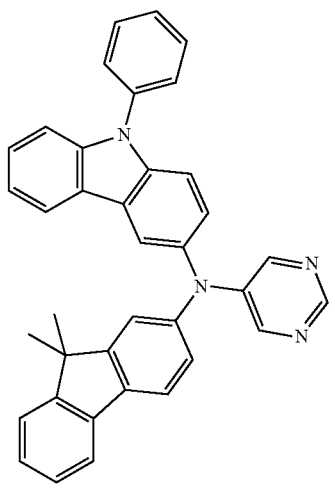
213
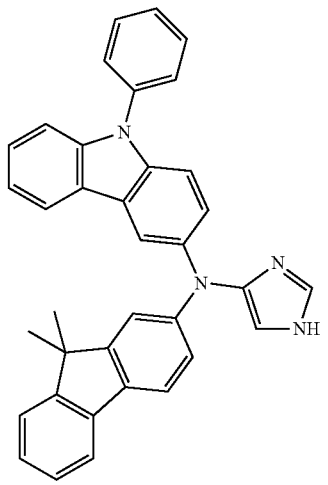

214
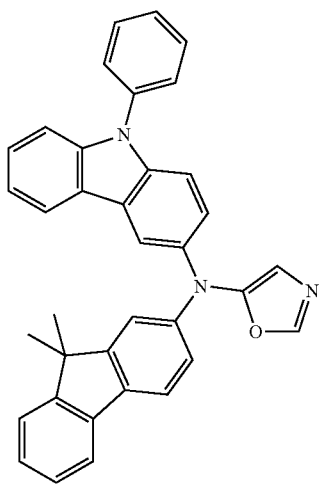
217
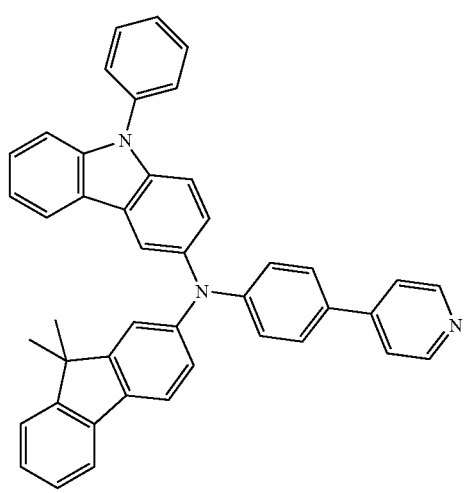
215
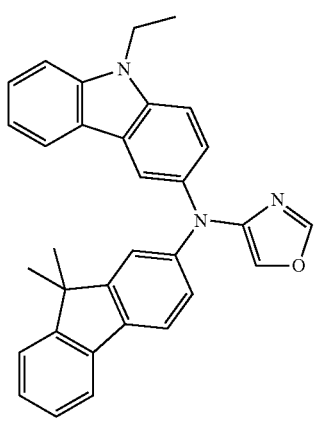
218
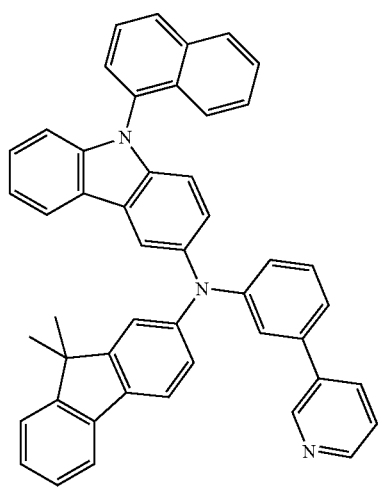
216
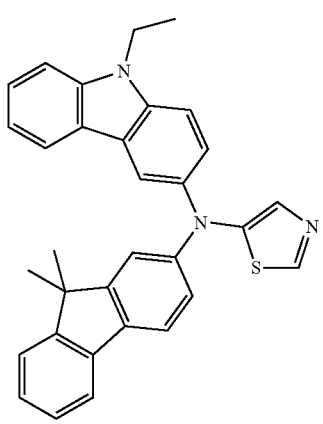
219
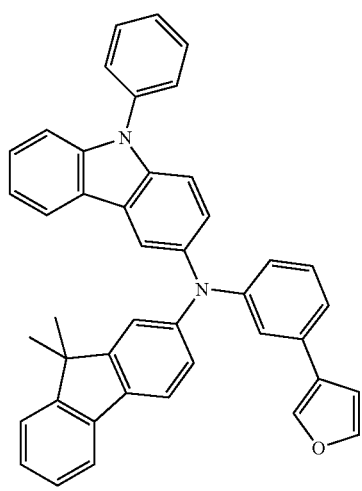

220
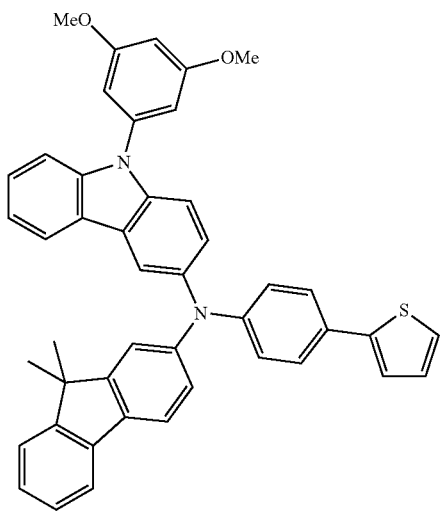
221
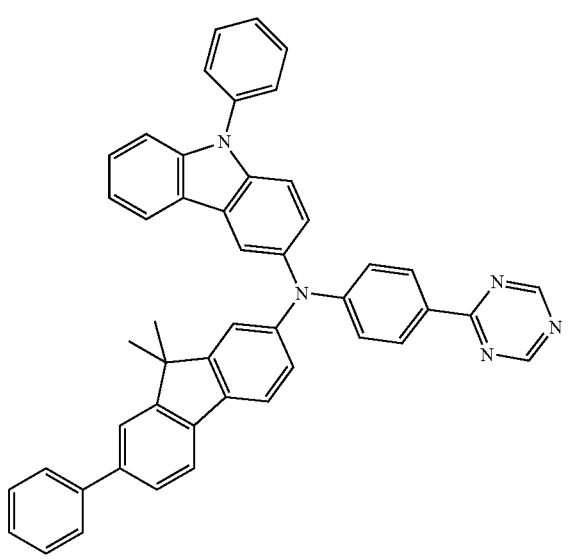
222
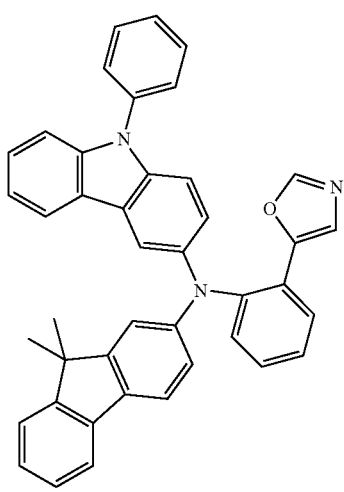
223
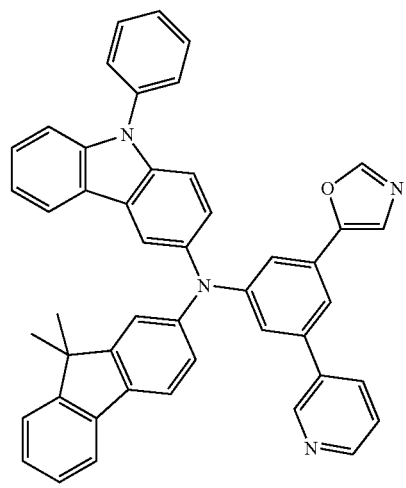
224
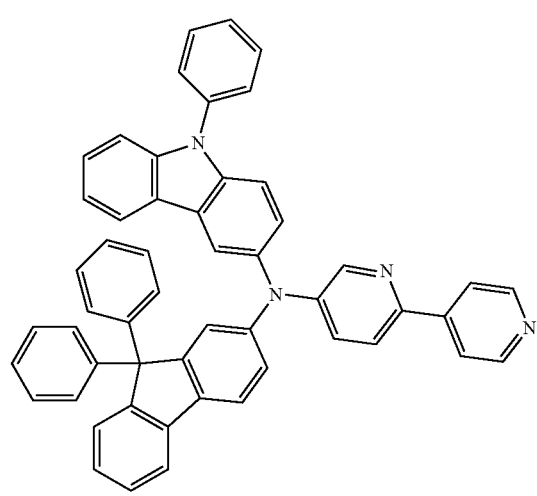
225
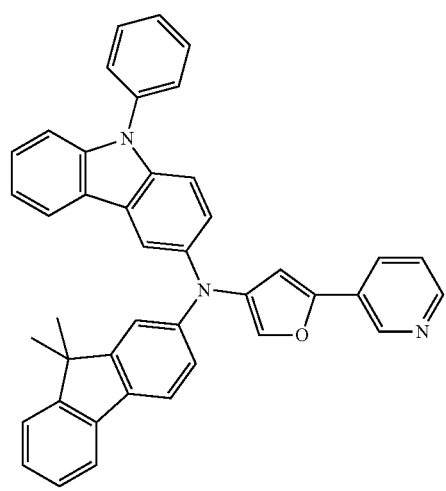

226
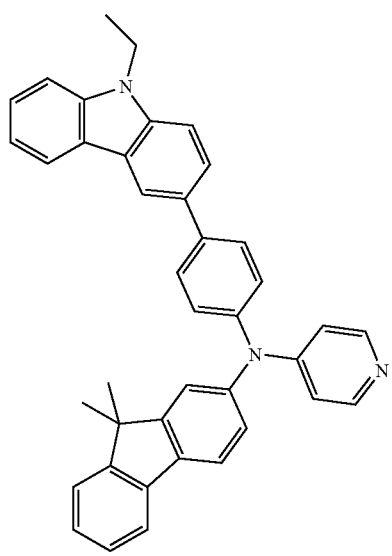
227
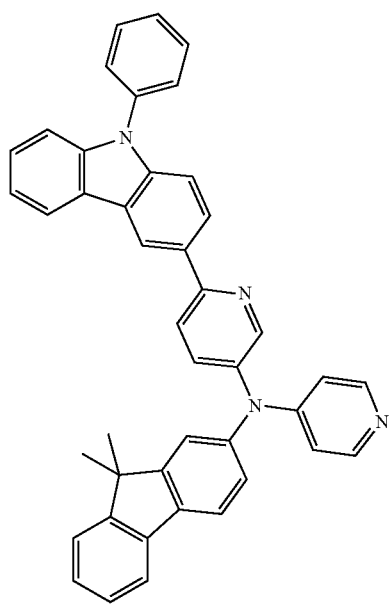
228
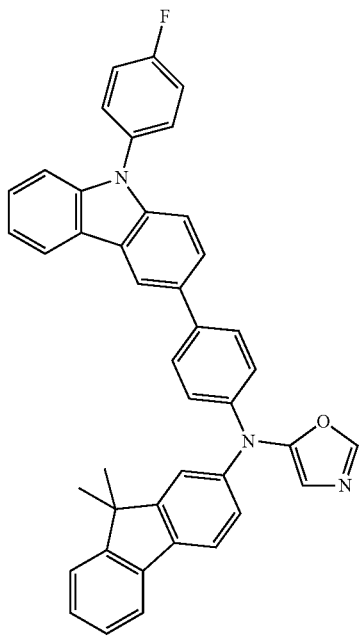
229
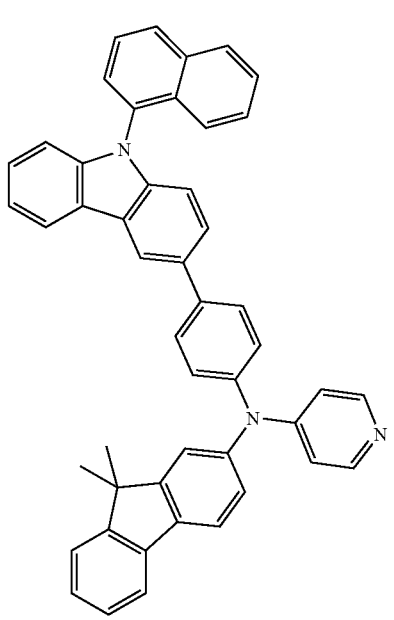

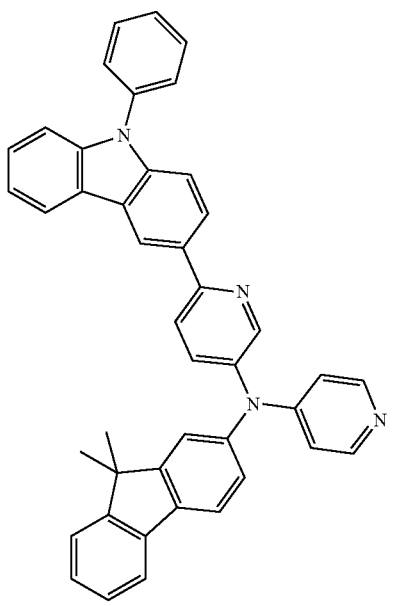
230
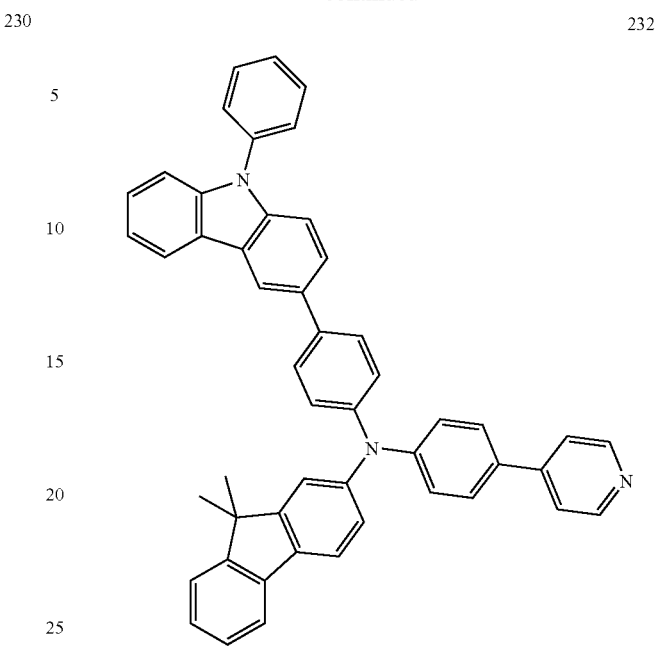
232
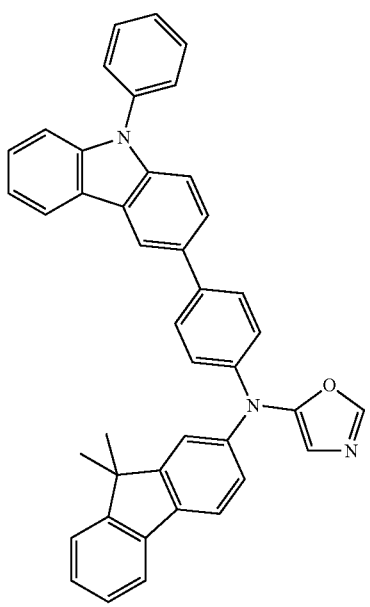
231
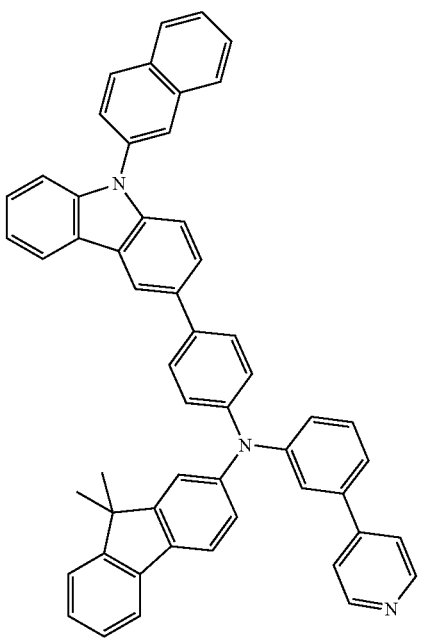
233

234
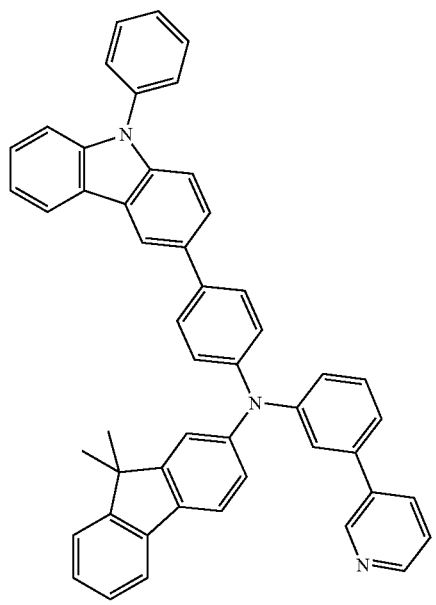
235
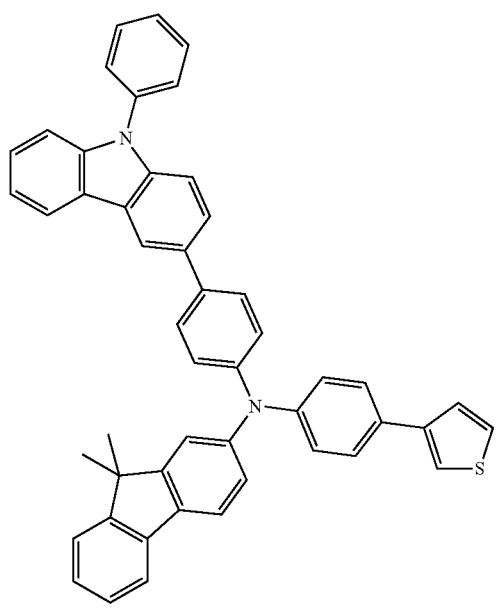
236
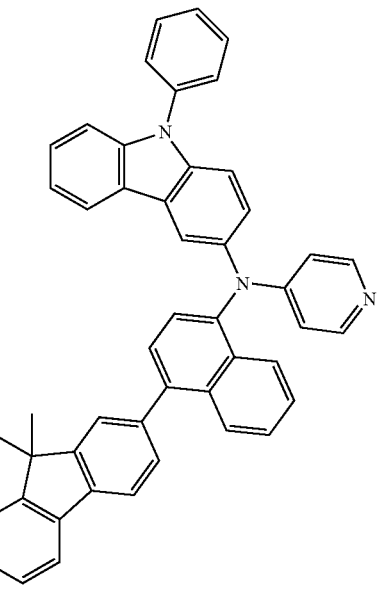
237
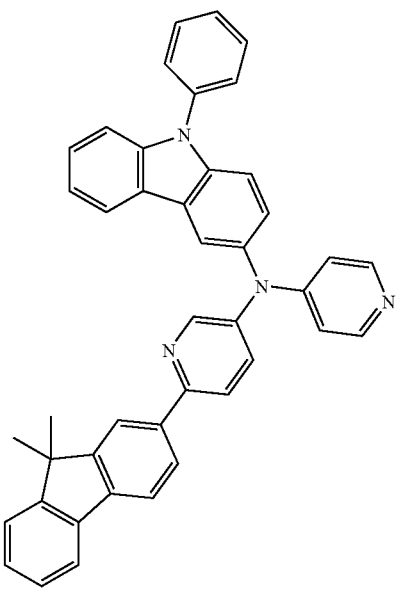

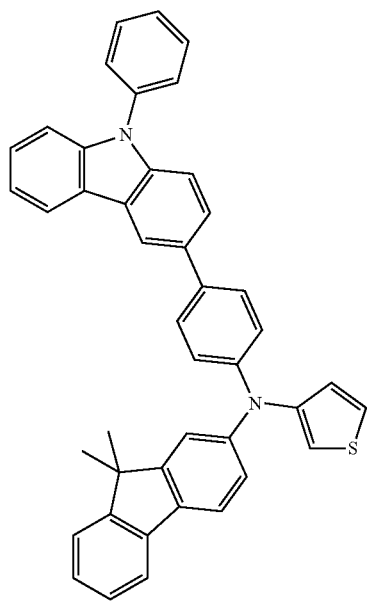
238
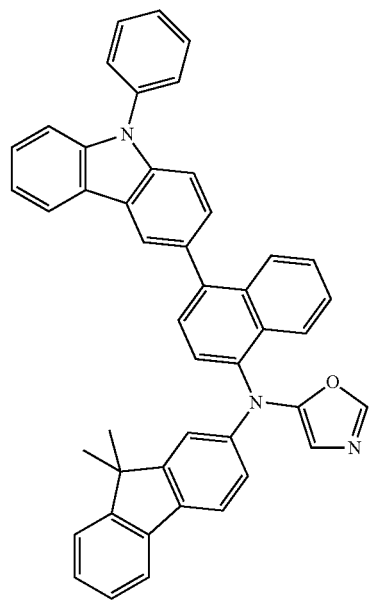
240
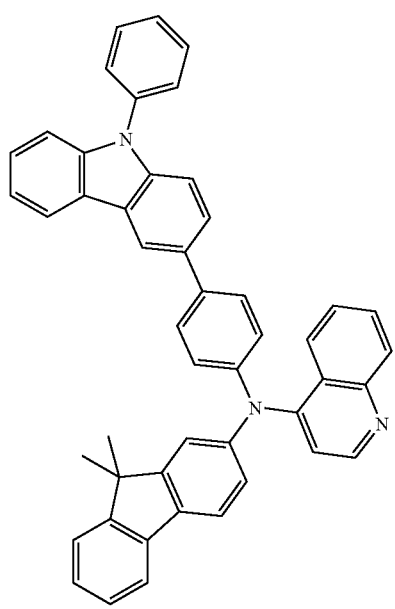
239
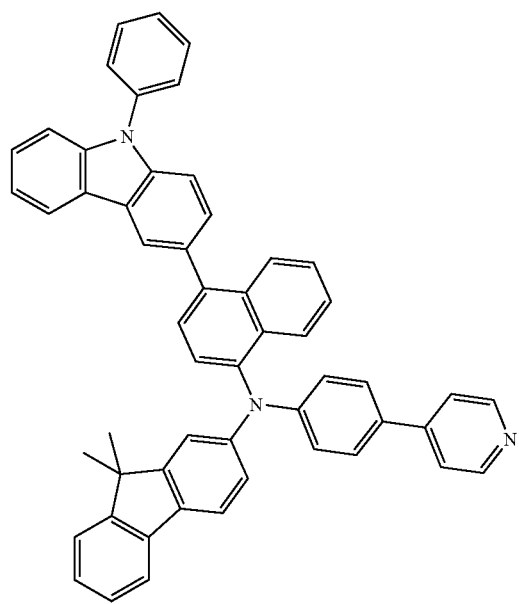
241

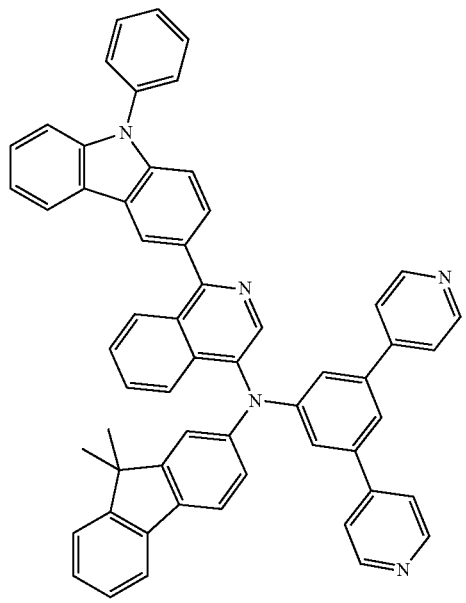
242
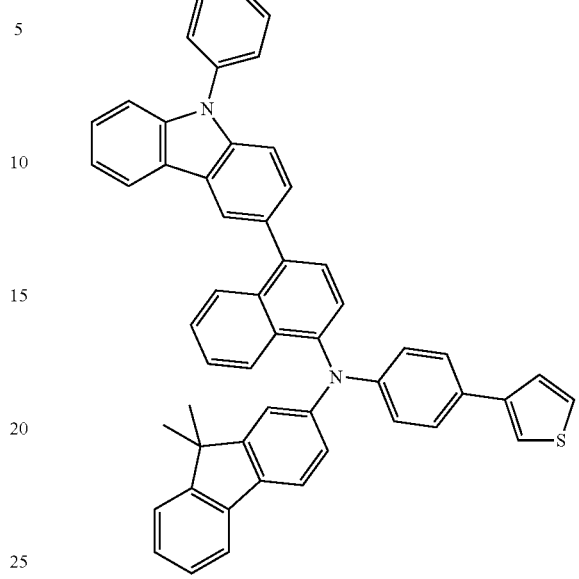
244
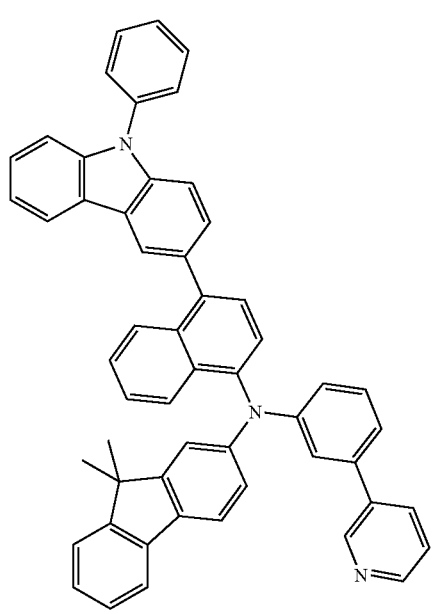
243
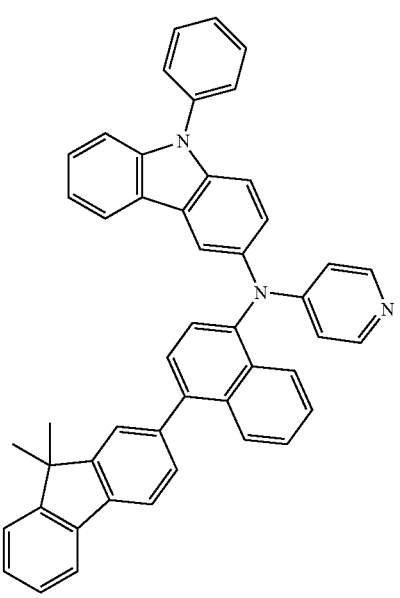
245

246
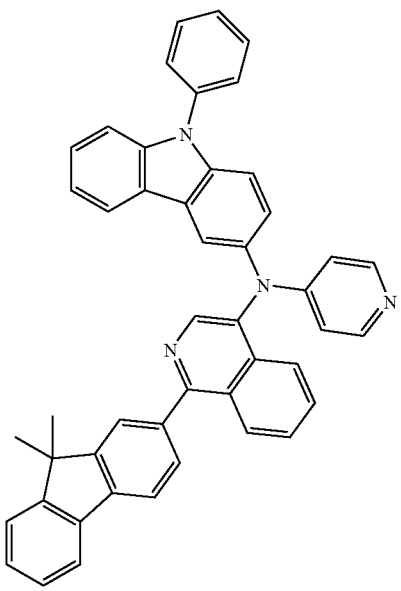
247
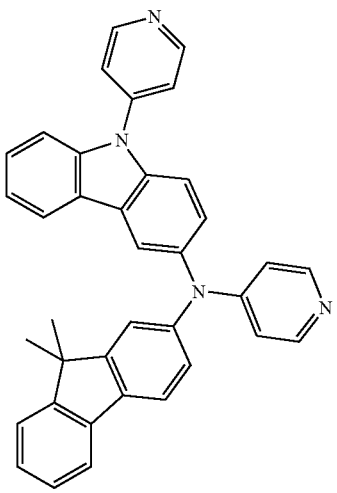
248
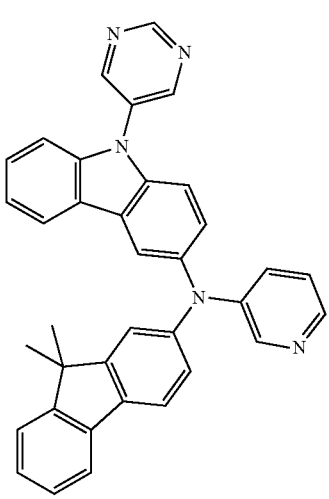
249
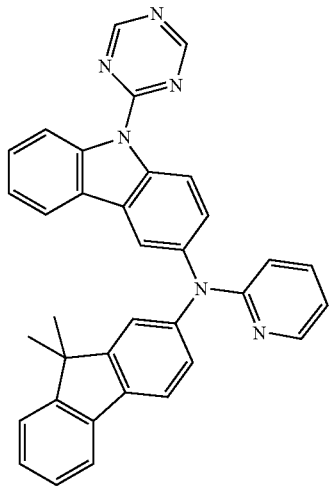
250
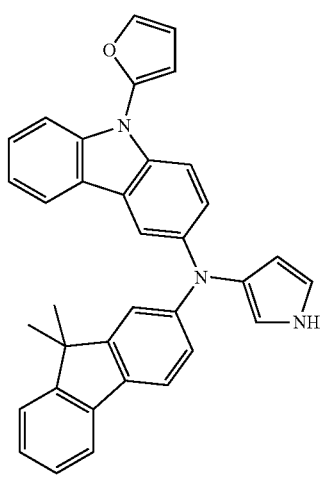
251
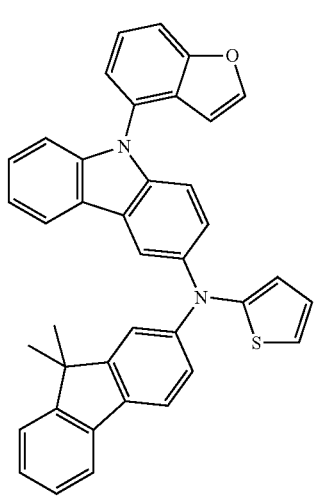

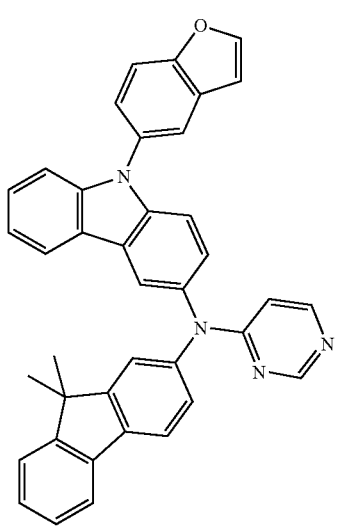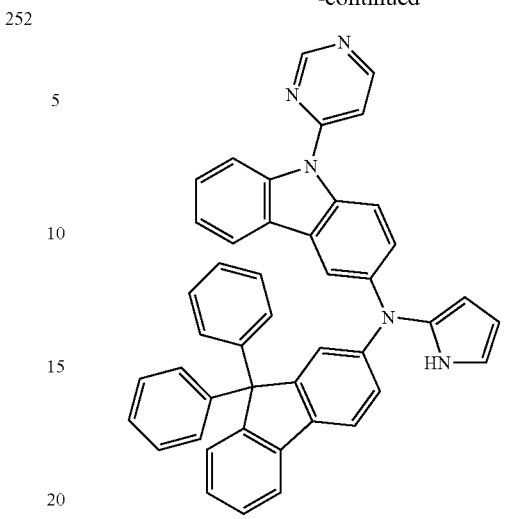

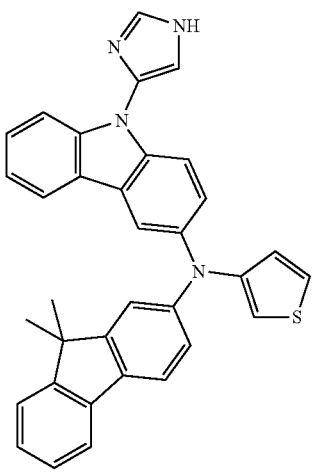

258

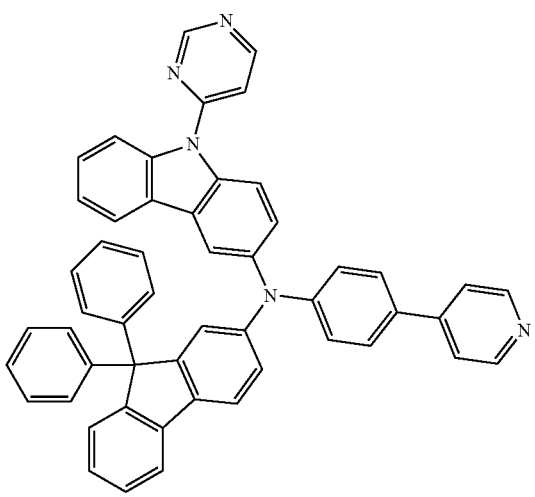

259

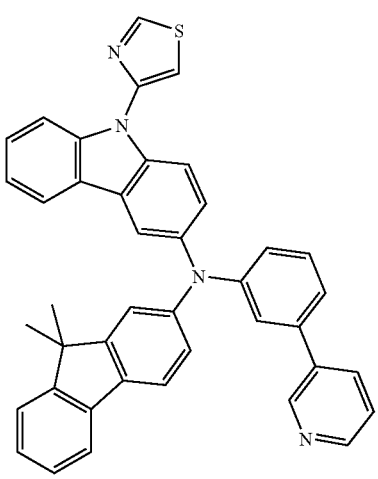

260

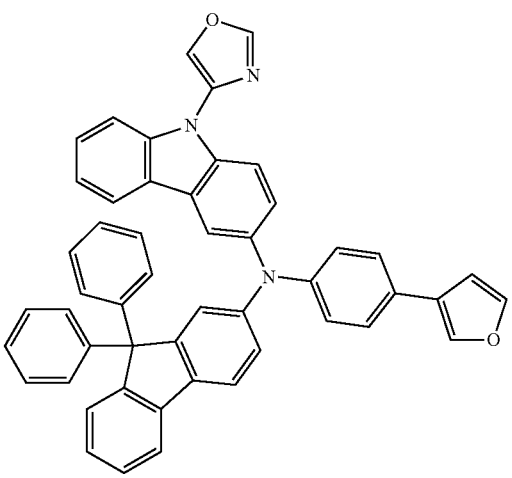

261

The ambipolar compound described above may be a single compound or a mixture of at least tow different compounds. For example, the ambipolar compound may be Compound 4, or a mixture of Compounds 4 and 9.

Herein, examples of the unsubstituted $C_1$-$C_{50}$ alkyl group (or $C_1$-$C_{50}$ alkyl group) include methyl, ethyl, propyl, isobutyl, sec-butyl, pentyl, iso-amyl, and hexyl. Also, the substituted $C_1$-$C_{50}$ alkyl group is obtained as at least one hydrogen atom in the unsubstituted $C_1$-$C_{50}$ alkyl group is substituted with a halogen atom, a hydroxyl group, a nitro group, a cyano group, an amino group, an amidino group, hydrazine, hydrazone, a carboxyl group or a salt thereof, a sulfonic acid group or a salt thereof, a phosphoric acid or a salt thereof, a $C_1$-$C_{50}$ alkyl group, a $C_2$-$C_{30}$ alkenyl group, a $C_2$-$C_{30}$ alkynyl group, a $C_6$-$C_{30}$ aryl group, a $C_2$-$C_{20}$ heteroaryl group, —N($Q_1$)($Q_2$), or —Si($Q_3$)($Q_4$)($Q_5$) (Here, each of $Q_1$ through $Q_5$ is independently selected from the group consisting of hydrogen, a $C_1$-$C_{30}$ alkyl group, a $C_2$-$C_{30}$ alkenyl group, a $C_2$-$C_{30}$ alkynyl group, a $C_6$-$C_{30}$ aryl group, and a $C_2$-$C_{20}$ heteroaryl group). Meanwhile, the substituted or unsubstituted $C_1$-$C_{50}$ alkylene group has the same structure as the substituted or unsubstituted $C_1$-$C_{50}$ alkyl group described above, except that the substituted or unsubstituted $C_1$-$C_{50}$ alkylene group is a divalent linker.

Herein, the unsubstituted $C_1$-$C_{50}$ alkoxy group (or $C_1$-$C_{50}$ alkoxy group) is represented by a formula of —$OA_1$ (here, $A_1$ is the unsubstituted $C_1$-$C_{50}$ alkyl group described above), and examples thereof include methoxy, ethoxy, and isopropyloxy. Also, at least one hydrogen atom in the alkoxy group may be substituted with a substituent like the substituted $C_1$-$C_{50}$ alkyl group described above.

Herein, the unsubstituted $C_2$-$C_{50}$ alkenyl group (or $C_2$-$C_{50}$ alkenyl group) contains at least one carbon double bond in the middle or at the end, such as ethenyl, prophenyl, and butenyl. At least one hydrogen atom in the unsubstituted $C_2$-$C_{50}$ alkenyl group may be substituted with a substituent like the substituted $C_1$-$C_{50}$ alkyl group described above. Meanwhile, the substituted or unsubstituted $C_2$-$C_{50}$ alkenylene group has the same structure as the substituted or unsubstituted $C_2$-$C_{50}$ alkenyl group described above, except that the substituted or unsubstituted $C_2$-$C_{50}$ alkenylene group is a divalent linker.

Herein, the unsubstituted $C_2$-$C_{50}$alkynyl group (or $C_2$-$C_{50}$alkynyl group) contains at least one triple bond in the middle or at the end of the $C_2$-$C_{50}$ alkyl group described above, such as ethynyl or propynyl. At least one hydrogen atom in the alkynyl group may be substituted with a substituent like the substituted $C_1$-$C_{50}$ alkyl group described above.

Herein, the unsubstituted $C_5$-$C_{50}$ aryl group denotes a monovalent group having a carbocyclic aromatic system of 5 to 30 carbon atoms including at least one aromatic ring, and the unsubstituted $C_5$-$C_{50}$ arylene group denotes a divalent group having a carbocyclic aromatic system of 5 to 30 carbon atoms including at least one aromatic ring. If the aryl group and the arylene group include at least two rings, these at least two rings may be fused to each other. At least one hydrogen atom of the aryl group and the arylene group may be substituted with a substituent like the substituted $C_1$-$C_{50}$ alkyl group described above.

Examples of the substituted or unsubstituted $C_5$-$C_{50}$ aryl group include a phenyl group, a $C_1$-$C_{10}$ alkylphenyl group (for example, an, ethylphenyl group), a $C_1$-$C_{10}$ alkylbiphenyl group (for example, an ethylbiphenyl group), a halophenyl group (for example, o-, m-, and p-fluorophenyl groups, and a dichlorophenyl group), a dicyanophenyl group, a trifluoromethoxyphenyl group, o-, m-, and p-tolyl groups, o-, m-, and p-cumenyl groups, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, a halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), an anthracenyl group, an azulenyl group, a heptalenyl group, an acenaphthylenyl group, a phenalenyl group, a fluorenyl group, an antraquinolyl group, a methylanthryl group, a penanthryl group, a triphenylenyl group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group. Also, examples of the substituted $C_5$-$C_{50}$aryl group may be easily recognized by referring to the examples of the unsubstituted $C_5$-$C_{50}$ aryl group described above and the substituents of the substituted $C_1$-$C_{50}$alkyl group. Examples of the substituted or unsubstituted $C_5$-$C_{50}$ arylene group may be easily recognized by referring to the examples of the substituted or unsubstituted $C_5$-$C_{50}$ aryl group.

Herein, the unsubstituted $C_2$-$C_{50}$ heteroaryl group denotes a monovalent group having a system consisting at least one aromatic ring including at least one heteroatom selected from among N, O, P, and S, wherein the rest of ring atoms are C, and the unsubstituted $C_3$-$C_{30}$ heteroarylene group denotes a divalent group having a system consisting at least one aromatic ring including at least one heteroatom selected from among N, O, P, and S, wherein the rest of ring atoms are C. Here, if the heteroaryl group and the heteroarylene group include at least two rings, the at least two rings may be fused to each other. At least one hydrogen atom in the heteroaryl group and the heteroarylene group may be substituted with a substituent like the $C_1$-$C_{50}$ alkyl group described above.

Examples of the unsubstituted $C_2$-$C_{50}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, and an imidazopyrimidinyl group. Examples of the unsubstituted $C_2$-$C_{50}$ heteroarylene group may be easily recognized by referring to the examples of the substituted or unsubstituted $C_2$-$C_{50}$ arylene group.

The unsubstituted $C_5$-$C_{50}$ aryloxy group may include a formula of —$OA_2$ (Here, $A_2$ is the unsubstituted $C_5$-$C_{50}$ aryl group described above), and the unsubstituted $C_5$-$C_{50}$ arylthio group may include a formula of —$OA_3$ (Here, $A_3$ is the unsubstituted $C_5$-$C_{50}$ aryl group described above). At least one hydrogen atom of the aryloxy group and the arylthio group may be substituted by a substituent like the $C_1$-$C_{30}$ alkyl group described above.

When the second color light is a green light and the third color light is a red light, the second emission layer 113-2 and the third emission layer 113-3 may respectively include a well known green emitting material and a well known red emitting material. For example, the second emission layer 113-2 and the third emission layer 113-3 may include $Alq_3$, 4,4'-N,N'-dicarbazole-biphenyl (CBP), poly(n-vinylcarbazole) (PVK), 9,10-di(naphthalene-2-yl)anthracene (ADN), TCTA, TPBI (1,3,5-tris(N-phenylbenzimidazole-2-yl)benzene), TBADN (3-tert-butyl-9,10-di(naphth-2-yl)anthracene), E3, or DSA (distyrylarylene) described above as a host.

Meanwhile, the green and red dopants may be at least one of fluorescent dopant and phosphorescent dopant. The phosphorescent dopant may be an organic metal complex including Ir, Pt, Os, Re, Ti, Zr, Hf, or a mixture of at least two thereof, but is not limited thereto.

When the second color light is a green light, $Ir(ppy)_3$ (ppy=phenylpyridine), $Ir(ppy)_2(acac)$, $Ir(mpyp)_3$, or C545T may be used as a well known green dopant, but the well known green dopant is not limited thereto.

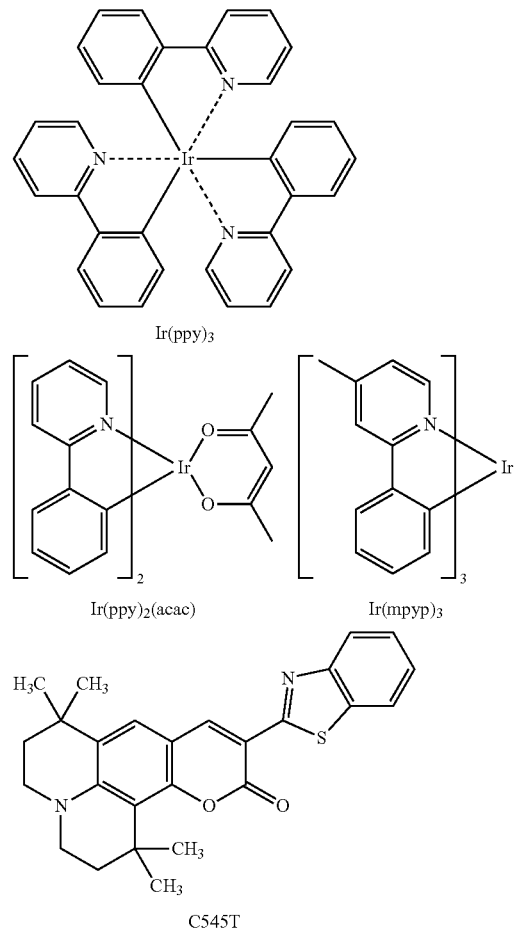

When the third color light is a red light, PtOEP, $Ir(piq)_3$, or BtpIr may be used as a well known red dopant, but the well known red dopant is not limited thereto.

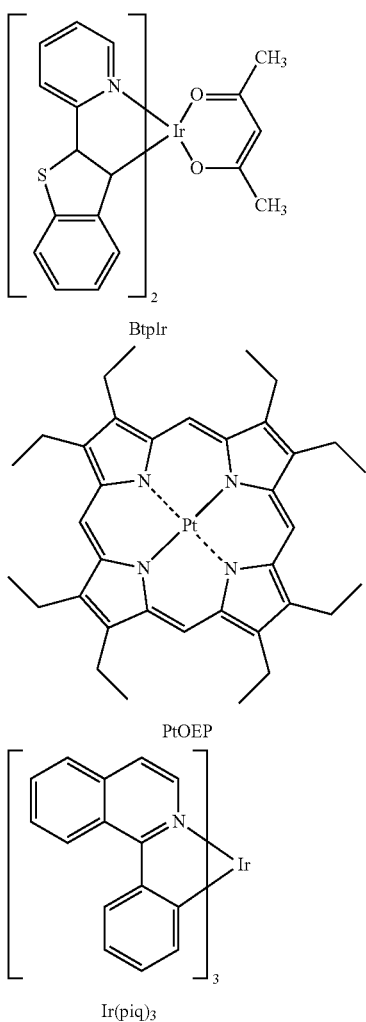

Btplr

PtOEP

Ir(piq)₃

Meanwhile, the first auxiliary layer 114 accelerating resonance of the third color light is disposed between the third region of the first layer 110 and the third emission layer 113-3. The first auxiliary layer 114 is a layer disposed between the third region of the first layer 110 and the third emission layer 113-3 so as to adjust distances $L_3$ and $D_3$ described later, and may include at least one of a well known hole injection material and a well known hole transport material.

Examples of the first auxiliary layer 114 include carbazole derivatives, such as N-phenylcarbazole and polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine) (TCTA), and N,N'-di(1-naphthyl)-N,N'-diphenylbenzidine (NPB), but are not limited thereto.

A thickness of the first auxiliary layer 114 may be selected in a range satisfying the distances $D_3$ and $L_3$, which will be described later.

If the first emission layer 113-1, the second emission layer 113-2, and the third emission layer 113-3 include a host and dopant, an amount of the dopant may be generally in the range from about 0.01 to about 15 parts by weight based on about 100 parts by weight of the host, but is not limited thereto.

Each of thicknesses of the first through third emission layers 113-1 through 113-3 may be independently from about 100 Å to about 2000 Å, for example, from about 200 Å to about 1000 Å. When the thicknesses of the first through third emission layers 113-1 through 113-3 are within the above range, the organic light emitting diode 100 showing excellent light emitting characteristics without substantial increase of a driving voltage may be manufactured.

Aside from the materials described above, the first through third emission layers 113-1 through 113-3 may further include at least one compound from among an anthracene-based compound, an arylamine-based compound, and a styryl-based compound.

When the first through third emission layers 113-1 through 113-3 include a phosphorescent dopant, a hole blocking layer (HBL, not shown in FIG. 1) may be formed by using a method, such as a vacuum deposition method, a spin coating method, a cast method, or an LB method, before forming the ETL 115, so as to prevent triple excitons or holes from diffusing into the ETL 115. When the HBL is formed by using a vacuum deposition method of a spin coating method, conditions of forming the HBL may differ based on a used compound, but may be similar to those of forming the hole injection and transport layer 107. A well known hole blocking material may be used for the HBL, such as an oxadiazole derivative, a triazole derivative, a phenanthroline derivative, or Balq.

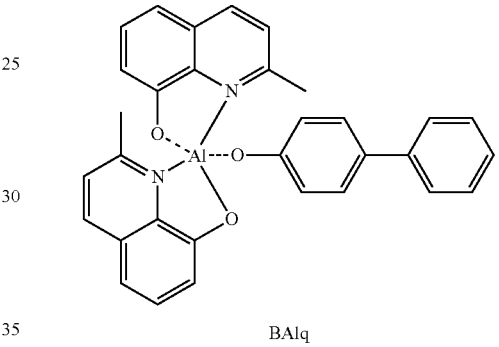

BAlq

A thickness of the HBL may be from about 10 Å to about 1000 Å, for example, from about 30 Å to about 300 Å. If the thickness of the HBL is within the above range, an excellent hole blocking characteristic may be obtained without substantial increase of a driving voltage.

Then, the ETL 115 is formed as a common layer by using any method, such as a vacuum deposition method, a spin coating method, or a cast method. When the ETL 115 is formed by using a vacuum deposition method or a spin coating method, conditions of forming the ELT 115 may differ according to a used compound, but may be generally selected from the similar conditions of forming the hole injection and transport layer 107. A well known hole transport material may be used for the ETL 115 so as to stably transport electrons injected from the second electrode 119. Examples of the well known hole transport material include quinoline derivatives, specifically tris(8-quinolinolate)aluminum (Alq3), TAZ, Balq, and beryllium bis(benzoquinolin-10-olate (Bebq₂), but are not limited thereto.

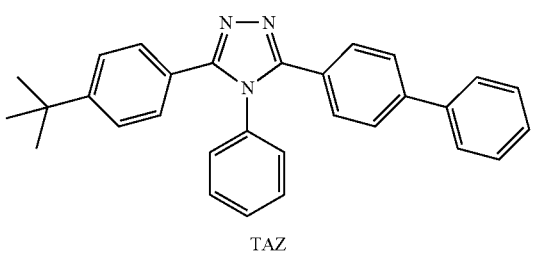

TAZ

-continued

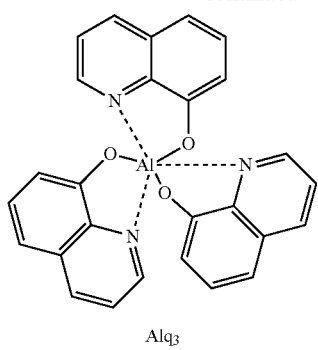

Alq₃

A thickness of the ETL 115 may be from about 10 Å to about 1000 Å, for example, from about 20 Å to about 500 Å. When the thickness of the ETL 115 is within the above range, a satisfactory electron transport characteristic may be obtained without substantial increase of a driving voltage.

Also, the ETL 115 may include an electron transport organic compound and a metal-containing material. Examples of the electron transport organic compound unlimitedly include 9,10-di(naphthalene-2-yl)anthracene (AND); and anthracene-based compounds, such as Compound 101 and 102 below, but are not limited thereto.

<Compound 101>

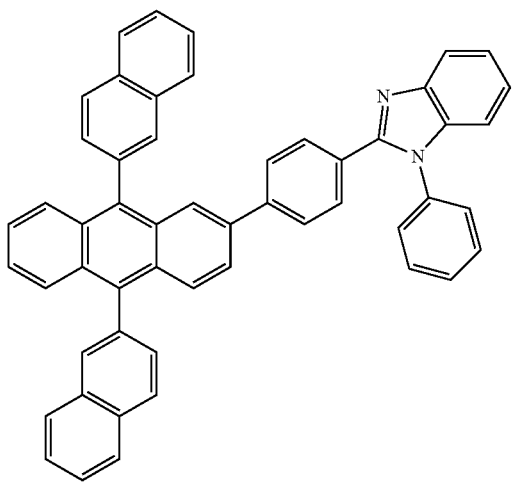

<Compound 102>

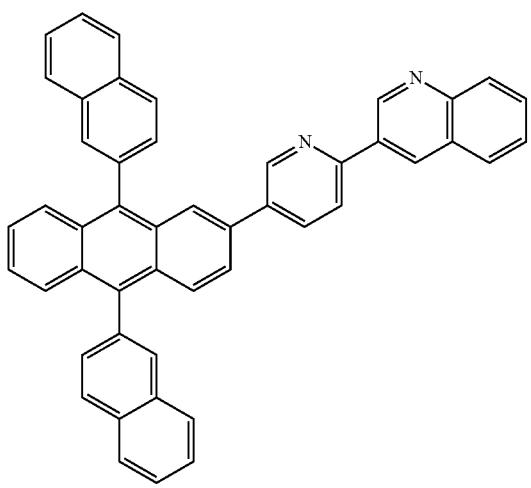

The metal-containing material may include an Li complex. Examples of the Li complex unlimitedly include lithium quinolate (LiQ) and Compound 103 below:

<Compound 103>

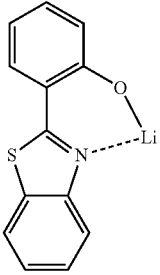

Also, the EIL 117 having a function of easily injecting electrons from the second electrode 119 may be disposed on the ETL 115, and a material of the EIL 117 is not specifically limited.

A well known EIL forming material, such as LiF, NaCl, CsF, Li₂O, or BaO, may be used for the EIL 117. Deposition conditions of the EIL 117 may differ according to a used compound, but may be generally selected from the same conditions as forming of the hole injection and transport layer 107.

A thickness of the EIL 117 may be from about 1 Å to about 100 Å, for example, from about 3 Å to about 90 Å. If the thickness of the EIL 117 is within the above range, a satisfactory electron injection characteristic may be obtained without substantial increase of a driving voltage.

The second electrode 119 is formed on the EIL 117 as a common layer. The second electrode 119 is a reflective electrode. The second electrode 119 may be a cathode being an electron injection electrode. Here, examples of a metal for forming the second electrode 119 include a metal having a low work function, an alloy, an electric conductive compound, and a mixture thereof. In detail, a reflective electrode may be obtained by using lithium (Li), magnesium (Mg), aluminum (Al), aluminum-lithium (Al—Li), calcium (Ca), magnesium-indium (Mg—In), or magnesium-silver (Mg—Ag).

In the organic light emitting diode 100, since the first region of the first layer 110 exists between the first emission layer 113-1 and the second electrode 119, and the first auxiliary layer 114 exists between the third region of the first layer 110 and the third emission layer 113-3 in the third sub-pixel, Equation 1 below may be satisfied:

$$D_1 < D_2 < D_3 \qquad \text{<Equation 1>}$$

Here, $D_1$ denotes a distance between the first electrode 103 and the first emission layer 113-1, $D_2$ denotes a distance between the first electrode 103 and the second emission layer 113-2, and $D_3$ denotes a distance between the first electrode 103 and the third emission layer 113-3.

When the distances $D_1$, $D_2$, and $D_3$ are within the above range, an optimum constructive interference may occur during resonance of each color. In the organic light emitting diode 100, light is emitted as excitons are radiated, and such exciton radiation may be considered as electric dipole radiation. A weak microcavity phenomenon is a phenomenon where a damping rate of a dipole changes due to an image dipole induced by a reflector when dipole radiation is located at a distance below or equal to a wavelength of light to be emitted to the reflector, thereby changing strength of radiation. When the distances $D_1$, $D_2$, and $D_3$ are within the above range, light emitting efficiencies of the first through third color lights may be improved according to the weak microcavity phenomenon.

The organic light emitting diode 100 has a structure in which the first through third color lights generate a resonance between the first electrode 103 constituting a translucent electrode and the second electrode 119 constituting a reflective electrode, while being driven.

For example, the organic light emitting diode 100 satisfies Equations 3 through 5 below:

$$\frac{\lambda_1}{2n_1} \cdot m_1 - \frac{\lambda_1}{10} \leq L_1 \leq \frac{\lambda_1}{2n_1} \cdot m_1 + \frac{\lambda_1}{10} \qquad <\text{Equation 3}>$$

$$\frac{\lambda_2}{2n_2} \cdot m_2 - \frac{\lambda_2}{10} \leq L_2 \leq \frac{\lambda_2}{2n_2} \cdot m_2 + \frac{\lambda_2}{10} \qquad <\text{Equation 4}>$$

$$\frac{\lambda_3}{2n_3} \cdot m_3 - \frac{\lambda_3}{10} \leq L_3 \leq \frac{\lambda_3}{2n_3} \cdot m_1 + \frac{\lambda_3}{10} \qquad <\text{Equation 5}>$$

In Equations 3 through 5, $L_1$ denotes a distance between the first electrode 103 and the second electrode 119 in the first sub-pixel; $L_2$ denotes a distance between the first electrode 103 ad the second electrode 119 in the second sub-pixel; $L_3$ is a distance between the first electrode 103 and the second electrode 119 in the third sub-pixel; $\lambda_1$, $\lambda_2$, and $\lambda_3$ respectively denote wavelengths of the first through third color lights; $n_1$ denotes a refractive index of layers disposed between the first electrode 103 and the second electrode 119 in the first sub-pixel; $n_2$ denotes a refractive index of layers disposed between the first electrode 103 and the second electrode 119 in the second sub-pixel; $n_3$ denotes a refractive index of layers disposed between is the first electrode 103 and the second electrode 119 in the third sub-pixel; and each of $m_1$, $m_2$, and $m_3$ is independently a natural number.

When the organic light emitting diode 100 satisfies Equations 3 through 5 above, the first through third color lights may be emitted to the outside of the organic light emitting diode 100 by passing through the second electrode 119 according to the principle of constructive interference while resonating between the first and second electrodes 103 and 119, and thus efficiency of the organic light emitting diode 100 may be improved.

In the organic light emitting diode 100, the distances $L_1$, $L_2$, and $L_3$ have a relationship of $L_1<L_2<L_3$.

Manufacturing processes of the organic light emitting diode 100 will now be described with reference to FIGS. 2A through 2E.

Figure 2A:
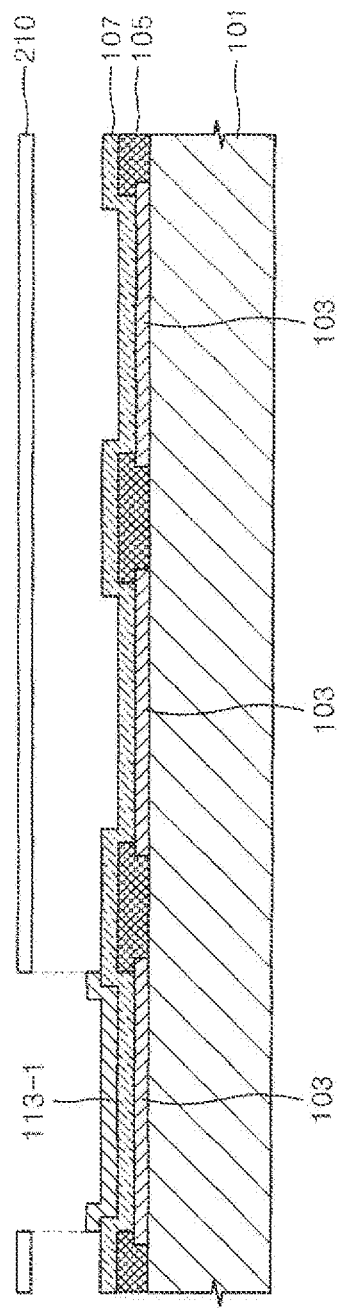
FIGS. 2A through 2E are cross-sectional views for describing manufacturing processes of the organic light emitting diode of FIG. 1.

First, as shown in FIG. 2A, the substrate 101 including the first electrode 103 patterned according to the first through third sub-pixels, the pixel definition layer 105 defining a pixel region, and the hole injection and transport layer 107 being a common layer is prepared, and then the first emission layer 113-1 is formed in the first sub-pixel by using a first mask 210 having an opening corresponding to a pattern of the first emission layer 113-1.

Figure 2B:
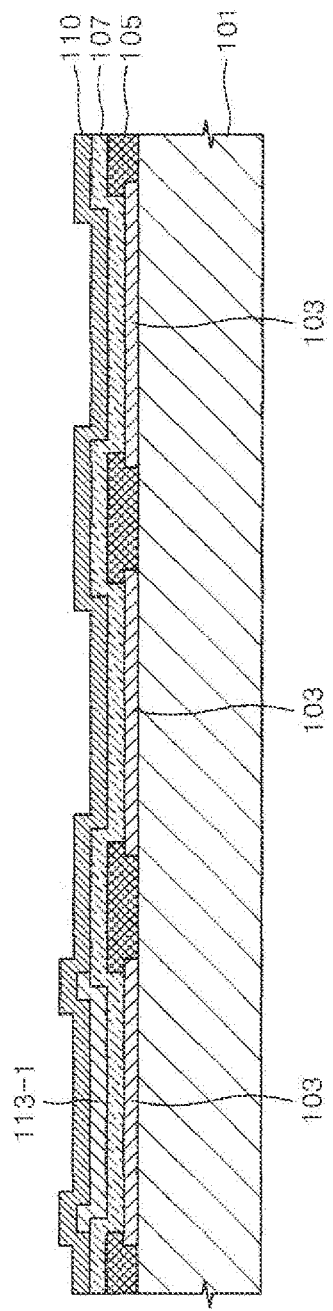
Figure 2C:
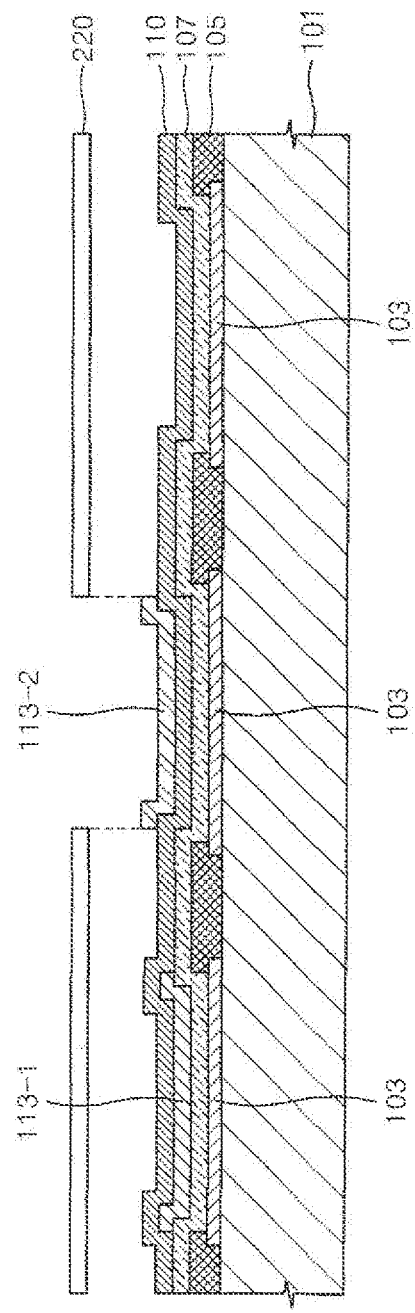
Figure 2D:
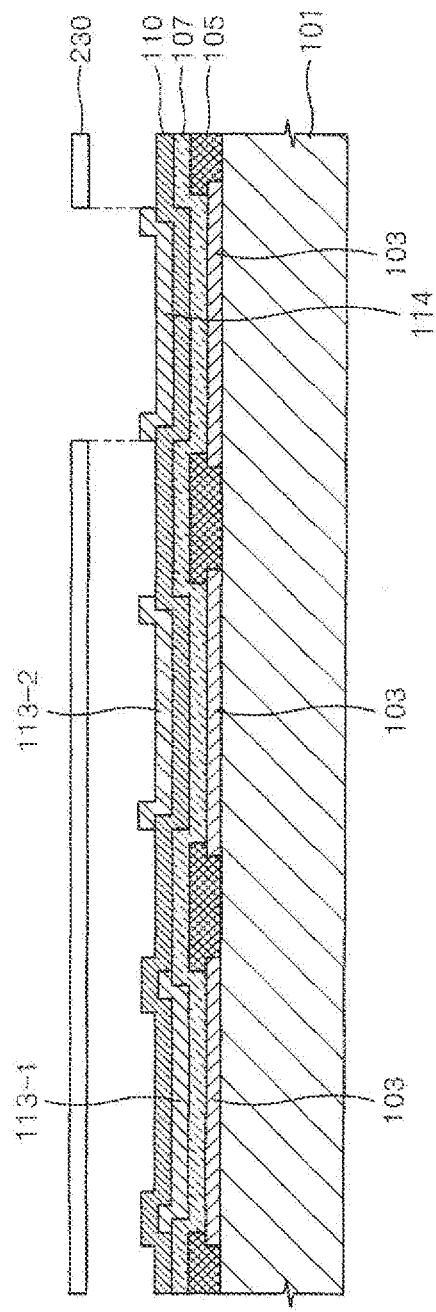
Figure 2E:
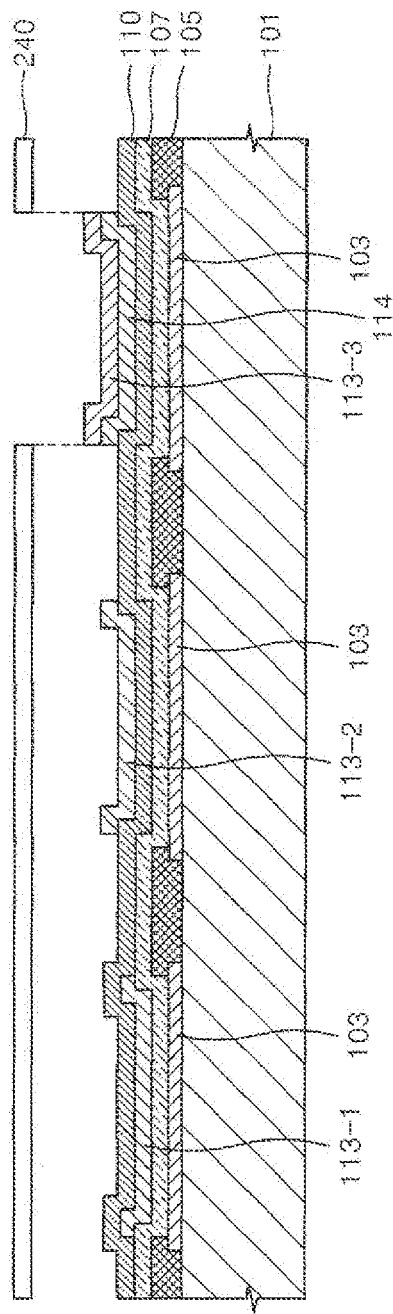

Next, as shown in FIG. 2B, the first layer 110 including an ambipolar compound is formed as a common layer without using a mask, and then as shown in FIG. 2C, the second emission layer 113-2 is formed in the second sub-pixel by using a second mask 220 having an opening corresponding to a pattern of the second emission layer 113-2. Then, as shown in FIG. 2D, the first auxiliary layer 114 is formed in the third sub-pixel by using a third mask 230 having an opening corresponding to a pattern of the first auxiliary layer 114, and then as shown in FIG. 2E, the third emission layer 113-3 is formed by using a fourth mask 240 having an opening corresponding to a pattern of the third emission layer 113-3. Next, the ETL 115, the EIL 117, and the second electrode 119 are formed as a common layer without using a mask, thereby manufacturing the organic light emitting diode 100 of FIG. 1. Accordingly, four mask processes are required to manufacture the organic light emitting diode 100.

For example, when the first electrode 103 is an anode for injecting holes, the second electrode 119 is a cathode for injecting electrons, and a hole transport compound is used as a material for forming the first layer 110, light emitting efficiency of the first color light may be deteriorated in the first sub-pixel since the first region of the first layer 110 disposed between the first emission layer 113-1 and the second electrode 119 is unable to smoothly transfer the electrons to the first emission layer 113-1. Accordingly, if an additional patterning process is performed so as not to dispose the first region of the first layer 110 between the first emission layer 113-1 and the second electrode 119 (i.e., so as to dispose the first layer 110 only in the second and third sub-pixels), an additional mask process is required, and thus manufacturing processes of an organic light emitting diode become complicated.

However, since the organic light emitting diode 100 employs the first layer 110 including the ambipolar compound having excellent hole and electron transport ability as described above, $D_1<D_2<D_3$ may be satisfied without deterioration of light emitting efficiency of the first sub-pixel, even if the first region of the first layer 110 is disposed between the first emission layer 113-1 and the second electrode 119 by forming the first layer 110 as a common layer without using a mask. Accordingly, the organic light emitting diode 100 has excellent light emitting efficiency and simple manufacturing processes.

Figure 3:
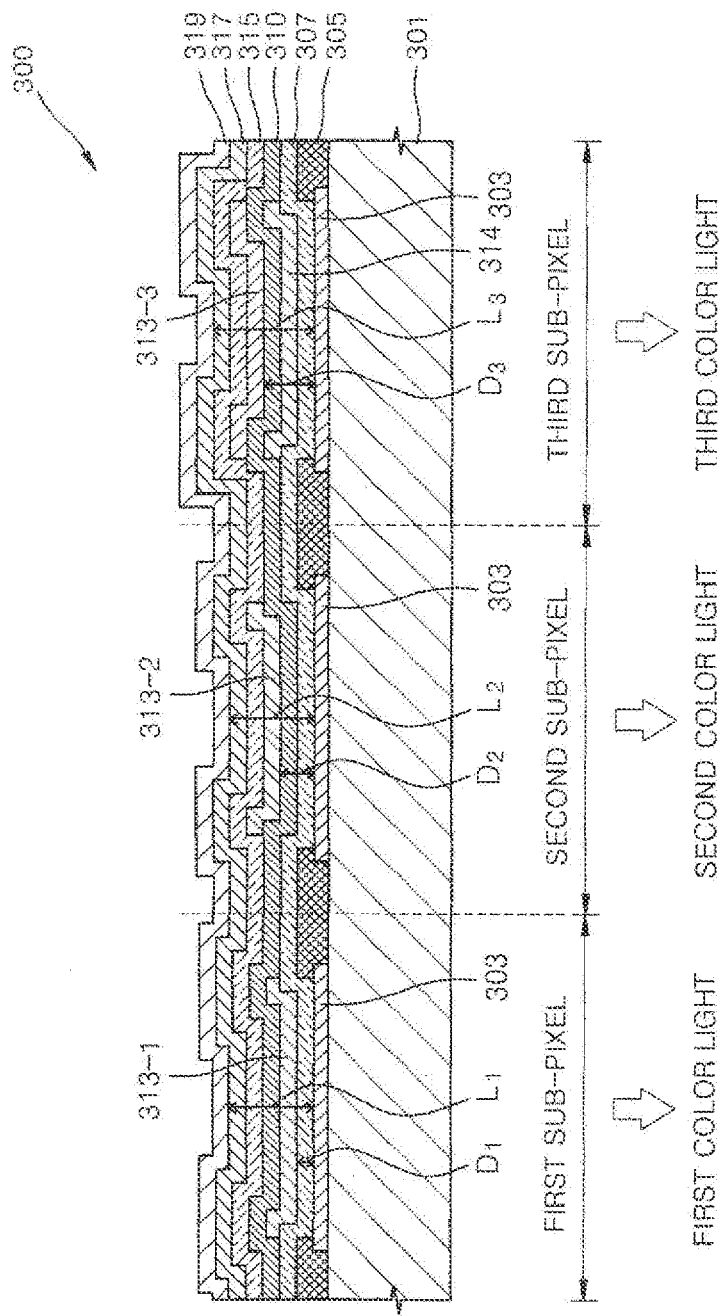
FIG. 3 is a cross-sectional view schematically illustrating an organic light emitting diode according to another embodiment of the present invention.

FIG. 3 is a cross-sectional view schematically illustrating an organic light emitting diode 300 according to another embodiment of the present invention. A substrate 301 of the organic light emitting diode 300 of FIG. 3 includes a first sub-pixel, a second sub-pixel, and a third sub-pixel. A first electrode 303 is patterned according to the first through third sub-pixels. A hole injection and transport layer 307 and a first layer 310 including an ambipolar compound are formed on the first electrode 303 as a common layer. The first layer 310 includes a first region disposed in the first sub-pixel, a second region disposed in the second sub-pixel, and a third region disposed in the third sub-pixel. A first emission layer 313-1 is formed in the first sub-pixel, and the first region of the first layer 310 is disposed between the first emission layer 313-1 and a second electrode 319. A second emission layer 313-2 is formed in the second sub-pixel, and the second region of the first layer 310 is disposed between the second emission layer 313-2 and the first electrode 303. A third emission layer 313-3 is formed in the third sub-pixel, and the third region of the first layer 310 is disposed between the third emission layer 313-3 and the first electrode 303. A first auxiliary layer 314 for increasing resonance of a third color light is disposed between the third region of the first layer 310 and the first electrode 303. Next, an ETL 315, an EIL 317, and the second electrode 319 are sequentially disposed as a common layer.

Unlike the organic light emitting diode 100 of FIG. 1, the organic light emitting diode 300 of FIG. 3 includes the first auxiliary layer 314 between the third region of the first layer 310 and the first electrode 303. Refer to the descriptions about the organic light emitting diode 100 of FIG. 1 for other details about the organic light emitting diode 300 of FIG. 3.

Figure 4:
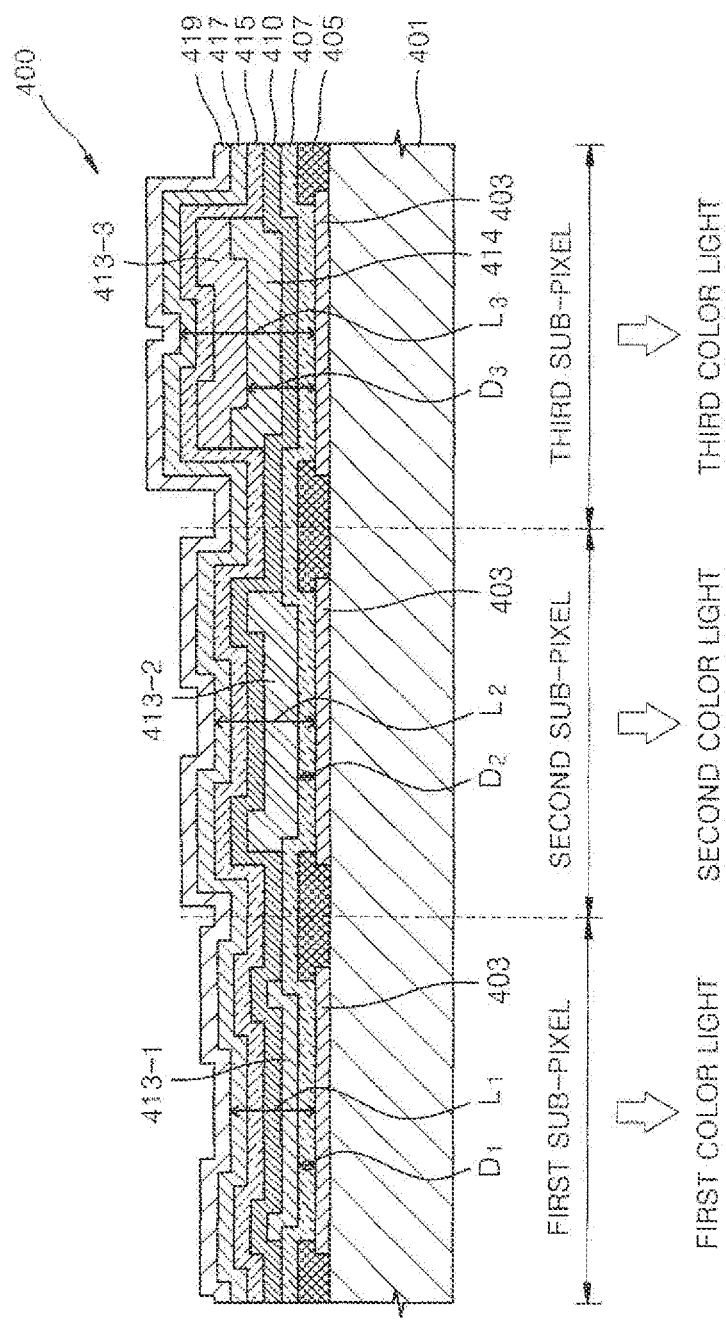
FIG. 4 is a cross-sectional view schematically illustrating an organic light emitting diode according to another embodiment of the present invention.

FIG. 4 is a cross-sectional view schematically illustrating an organic light emitting diode 400 according to another embodiment of the present invention. A substrate 401 of the organic light emitting diode 400 of FIG. 4 includes a first sub-pixel, a second sub-pixel, and a third sub-pixel. A first electrode 403 is patterned according to the first through third sub-pixels. A hole injection and transport layer 407 and a first layer 410 including an ambipolar compound are formed on the first electrode 403 as a common layer. The first layer 410 includes a first region disposed in the first sub-pixel, a second region disposed in the second sub-pixel, and a third region disposed in the third sub-pixel. A first emission layer 413-1 is formed in the first sub-pixel, and the first region of the first layer 410 is disposed between the first emission layer 413-1 and a second electrode 419. A second emission layer 413-2 is formed in the second sub-pixel, and the second region of the first layer 410 is disposed between the second emission layer 413-2 and the second electrode 419. A third emission layer 413-3 is formed in the third sub-pixel, and the third region of the first layer 410 is disposed between the third emission layer 413-3 and the first electrode 403. A first auxiliary layer 414 for increasing resonance of a third color light is disposed between the third emission layer 413-3 and the third region of the first layer 410. Next, an ETL 415, an EIL 417, and the second electrode 419 are sequentially disposed as a common layer.

Unlike the organic light emitting diode 100 of FIG. 1, the organic light emitting diode 400 of FIG. 4 includes the second region of the first layer 410 between the second emission layer 413-2 and the second electrode 419. Accordingly, the organic light emitting diode 400 satisfies Equation 2 below.

$$D_1 = D_2 < D_3 \qquad \text{<Equation 2>}$$

In Equation 2, $D_1$ denotes a distance between the first electrode 403 and the first emission layer 413-1; $D_2$ denotes a distance between the first electrode 403 and the second emission layer 413-2; and $D_3$ denotes a distance between the first electrode 403 and the third emission layer 413-3.

As described above, since $D_1$ and $D_2$ are the same, $L_1 < L_2$ may be satisfied by increasing a thickness of the second emission layer 413-2 to be larger than a thickness of the first emission layer 413-1, thereby increasing resonance of first and second color lights. Accordingly, the distances $L_1$, $L_2$, and $L_3$ may satisfy a condition of $L_1 < L_2 < L_3$ in the organic light emitting diode 400.

Refer to the descriptions about the organic light emitting diode 100 of FIG. 1 for other details about the organic light emitting diode 400 of FIG. 4.

Figure 5:
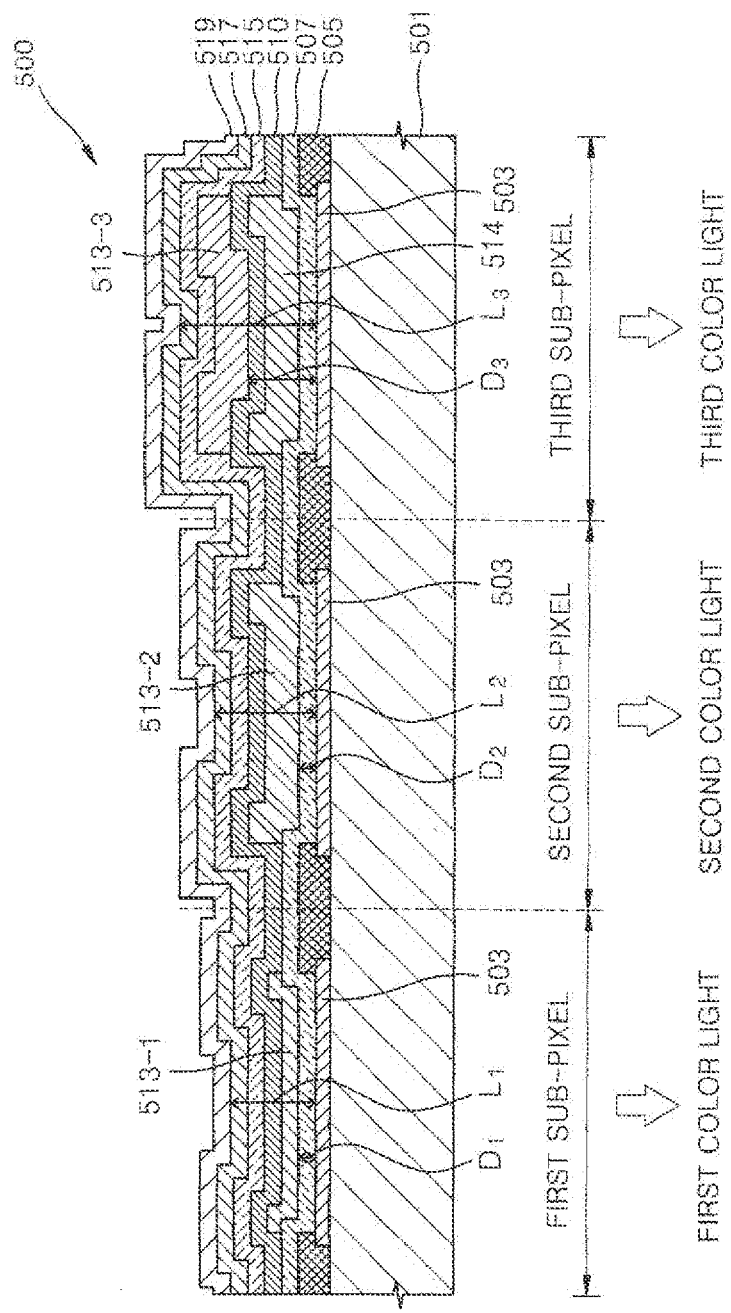
FIG. 5 is a cross-sectional view schematically illustrating an organic light emitting diode according to another embodiment of the present invention.

FIG. 5 is a cross-sectional view schematically illustrating an organic light emitting diode 500 according to another embodiment of the present invention. A substrate 501 of the organic light emitting diode 500 of FIG. 5 includes a first sub-pixel, a second sub-pixel, and a third sub-pixel. A first electrode 503 is patterned according to the first through third sub-pixels. A hole injection and transport layer 507 and a first layer 510 including an ambipolar compound are formed on the first electrode 503 as a common layer. The first layer 510 includes a first region disposed in the first sub-pixel, a second region disposed in the second sub-pixel, and a third region disposed in the third sub-pixel. A first emission layer 513-1 is formed in the first sub-pixel, and the first region of the first layer 510 is disposed between the first emission layer 513-1 and a second electrode 519. A second emission layer 513-2 is formed in the second sub-pixel, and the second region of the first layer 510 is disposed between the second emission layer 513-2 and the second electrode 519. A third emission layer 513-3 is formed in the third sub-pixel, and the third region of the first layer 510 is disposed between the third emission layer 513-3 and the first electrode 503. A first auxiliary layer 514 for increasing resonance of a third color light is disposed between the third region of the first layer 510 and the first electrode 503. Next, an ETL 515, an EIL 517, and the second electrode 519 are sequentially disposed as a common layer.

Unlike the organic light emitting diode 400 of FIG. 4, the organic light emitting diode 500 of FIG. 5 includes the first auxiliary layer 514 between the third region of the first layer 510 and the first electrode 503. Refer to the descriptions about the organic light emitting diode 400 of FIG. 4 for other details about the organic light emitting diode 500 of FIG. 5.

The organic light emitting diodes 100, 300, 400, and 500 have been described above with reference to FIGS. 1 and 5, but an organic light emitting diode of the present invention is not limited thereto. For example, the first electrode 103, 303, 403, or 503 may be a reflective electrode and the second electrode 119, 319, 419, or 519 may be a translucent electrode, thereby realizing a top emission type organic light emitting diode.

The organic light emitting diode may be included in a flat panel display device including a thin film transistor. The thin film transistor may include a gate electrode, source and drain electrodes, a gate insulation layer, and an active layer, wherein one of the source and drain electrodes is electrically connected to a first electrode of the organic light emitting diode.

The present invention will be described in greater detail with reference to the following examples. The following examples are for illustrative purposes only and are not intended to limit the scope of the invention.

EXAMPLES

Example 1B

A corning 15 Ω/cm² (1200 Å) ITO glass substrate was cut into a size of 50 mm×50 mm×0.7 mm to obtain a substrate and first electrode. The substrate and first electrode were washed with ultrasonic waves by using isopropyl alcohol and pure water respectively for 5 minutes, were irradiated with ultraviolet rays for 30 minutes, and were washed by exposing to ozone. Then, the substrate was installed to a vacuum deposition apparatus.

A HIL having a thickness of 800 Å was formed by vacuum-depositing 2-TNATA on the first electrode (translucent electrode), and then a HTL having a thickness of 600 Å was formed by vacuum-depositing NPB on the HIL.

Next, a blue emission layer having a thickness of 200 Å was formed by co-depositing ADN and DPVBi on the HTL at a weight ratio of 98:2, and then a first layer having a thickness of 400 Å was formed by depositing Compound 4 as an ambipolar compound on the blue emission layer.

An ETL having a thickness of 50 Å was formed by vacuum-depositing Alq$_3$ on the first layer, an EIL having a thickness of 10 Å was formed by depositing LiF on the ETL, and then a second electrode (reflective electrode) having a thickness of 3000 Å was formed by depositing Al on the EIL, thereby manufacturing a blue organic light emitting diode (blue light emission).

Example 1G

A corning 15 Ω/cm² (1200 Å) ITO glass substrate was cut into a size of 50 mm×50 mm×0.7 mm to obtain a substrate and first electrode. The substrate and first electrode were washed with ultrasonic waves by using isopropyl alcohol and pure water respectively for 5 minutes, were irradiated with ultraviolet rays for 30 minutes, and were washed by exposing to ozone. Then, the substrate was installed to a vacuum deposition apparatus.

A HIL having a thickness of 800 Å was formed by vacuum-depositing 2-TNATA on the first electrode (translucent electrode), and then a HTL having a thickness of 600 Å was formed by vacuum-depositing NPB on the HIL.

Next, a first layer having a thickness of 400 Å was formed by depositing Compound 4 as an ambipolar compound on the HTL, and then a green emission layer having a thickness of 500 Å was formed by co-depositing $Alq_3$ and C545T on the first layer at a weight ratio of 95:5.

An ETL having a thickness of 50 Å was formed by vacuum-depositing $Alq_3$ on the green emission layer, an EIL having a thickness of 10 Å was formed by depositing LiF on the ETL, and then a second electrode (reflective electrode) having a thickness of 3000 Å was formed by depositing Al on the EIL, thereby manufacturing a green organic light emitting diode (green light emission).

Examples 2B and 2G

Blue and green organic light emitting diodes were respectively manufactured in the same manner as in Examples 1B and 1G, except that Compound 9 was used instead of Compound 4 as ambipolar compound.

Examples 3B and 3G

Blue and green organic light emitting diodes were respectively manufactured in the same manner as in Examples 1B and 1G, except that Compound 43 was used instead of Compound 4 as an ambipolar compound.

Examples 4B and 4G

Blue and green organic light emitting diodes were respectively manufactured in the same manner as in Examples 1B and 1G, except that Compound 44 was used instead of Compound 4 as an ambipolar compound.

Examples 5B and 5G

Blue and green organic light emitting diodes were respectively manufactured in the same manner as in Examples 1B and 1G, except that Compound 58 was used instead of Compound 4 as an ambipolar compound.

Examples 6B and 6G

Blue and green organic light emitting diodes were respectively manufactured in the same manner as in Examples 1B and 1G, except that Compound 64 was used instead of Compound 4 as an ambipolar compound.

Comparative Example 1B

A blue organic light emitting diode was manufactured in the same manner as in Example 1B, except that an organic layer including $Alq_3$ was formed instead of the first layer including Compound 4 as an ambipolar compound.

Comparative Example 1G

A green organic light emitting diode was manufactured in the same manner as in Example 1G, except that an organic layer including NPB was formed instead of the first layer including Compound 4 as an ambipolar compound.

Evaluation Example 1

Driving voltages, current densities, luminance, efficiencies, and half lives of the blue organic light emitting diodes of Examples 1B through 6B and Comparative Example 1B, and the green organic light emitting diodes of Examples 1G through 6G and Comparative Example 1G were evaluated by using an IVL measuring device (PhotoResearch PR650, Keithley 238), and results thereof are shown in Table 1 below.

TABLE 1

| | First layer | Emitted color | Driving voltage (V) | Current density (mA/cm$^2$) | Luminance (cd/m$^2$) | Efficiency (cd/A) | Half life (hr @ 100 mA/cm$^2$) |
|---|---|---|---|---|---|---|---|
| Example 1B | Compound 4 | Blue | 6.62 | 50 | 2,210 | 4.42 | 201 hr |
| Example 1G | Compound 4 | Green | 6.78 | 50 | 6,655 | 13.3 | 244 hr |
| Example 2B | Compound 9 | Blue | 6.73 | 50 | 2,120 | 4.24 | 212 hr |
| Example 2G | Compound 9 | Green | 6.60 | 50 | 6,880 | 13.8 | 233 hr |
| Example 3B | Compound 43 | Blue | 6.68 | 50 | 2,324 | 4.54 | 222 hr |
| Example 3G | Compound 43 | Green | 6.75 | 50 | 6,776 | 13.6 | 240 hr |
| Example 4B | Compound 44 | Blue | 6.78 | 50 | 2,124 | 4.25 | 226 hr |
| Example 4G | Compound 44 | Green | 6.59 | 50 | 6,456 | 12.9 | 257 hr |
| Example 5B | Compound 58 | Blue | 6.51 | 50 | 2,312 | 4.62 | 210 hr |
| Example 5G | Compound 58 | Green | 6.72 | 50 | 6,765 | 13.5 | 255 hr |
| Example 6B | Compound 64 | Blue | 6.79 | 50 | 2,352 | 4.70 | 224 hr |
| Example 6G | Compound 64 | Green | 6.70 | 50 | 6,753 | 13.5 | 252 hr |
| Comparative Example 1B | $Alq_3$ | Blue | 7.85 | 50 | 1,560 | 3.12 | 113 hr |
| Comparative Example 1G | NPB | Green | 7.45 | 50 | 6,120 | 12.2 | 237 hr |

According to Table 1 above, the driving voltages of the blue organic light emitting diodes of Examples 1B through 6B are lower than the driving voltage of the blue organic light emitting diode of Comparative Example 1B, and the efficiencies and half lives of the blue organic light emitting diodes of Examples 1B through 6B are higher than those of the blue organic light emitting diode of Comparative Example 1B. Also, the driving voltages of the green organic light emitting diodes of Examples 1G through 6G are lower than the driving voltage of the green organic light emitting diode of Comparative Example 1G, and the efficiencies and half lives of the green organic light emitting diodes of Examples 1G through 6G are higher than those of the green organic light emitting diode of Comparative Example 1G.

Example 11B

A corning 15 Ω/cm$^2$ (1200 Å) ITO glass substrate was cut into a size of 50 mm×50 mm×0.7 mm to obtain a substrate and first electrode. The substrate and first electrode were washed with ultrasonic waves by using isopropyl alcohol and pure water respectively for 5 minutes, were irradiated with ultraviolet rays for 30 minutes, and were washed by exposing to ozone. Then, the substrate was installed to a vacuum deposition apparatus.

A HIL having a thickness of 800 Å was formed by vacuum-depositing 2-TNATA on the first electrode (translucent electrode), and then a HTL having a thickness of 600 Å was formed by vacuum-depositing NPB on the HIL.

Next, a blue emission layer having a thickness of 200 Å was formed by co-depositing ADN and DPVBi on the HTL at a weight ratio of 98:2, and then a first layer having a thickness of 400 Å was formed by depositing Compound 201 as an ambipolar compound on the blue emission layer.

An ETL having a thickness of 50 Å was formed by vacuum-depositing $Alq_3$ on the first layer, an EIL having a thickness of 10 Å was formed by depositing LiF on the ETL, and then a second electrode (reflective electrode) having a thickness of 3000 Å was formed by depositing Al on the EIL, thereby manufacturing a blue organic light emitting diode (blue light emission).

Example 11G

A corning 15 Ω/cm² (1200 Å) ITO glass substrate was cut into a size of 50 mm×50 mm×0.7 mm to obtain a substrate and first electrode. The substrate and first electrode were washed with ultrasonic waves by using isopropyl alcohol and pure water respectively for 5 minutes, were irradiated with ultraviolet rays for 30 minutes, and were washed by exposing to ozone. Then, the substrate was installed to a vacuum deposition apparatus.

A HIL having a thickness of 800 Å was formed by vacuum-depositing 2-TNATA on the first electrode (translucent electrode), and then a HTL having a thickness of 600 Å was formed by vacuum-depositing NPB on the HIL.

Next, a first layer having a thickness of 400 Å was formed by depositing Compound 201 as an ambipolar compound on the HTL, and then a green emission layer having a thickness of 500 Å was formed by co-depositing $Alq_3$ and C545T on the first layer at a weight ratio of 95:5.

An ETL having a thickness of 50 Å was formed by vacuum-depositing $Alq_3$ on the green emission layer, an EIL having a thickness of 10 Å was formed by depositing LiF on the ETL, and then a second electrode (reflective electrode) having a thickness of 3000 Å was formed by depositing Al on the EIL, thereby manufacturing a green organic light emitting diode (green light emission).

Examples 12B and 12G

Blue and green organic light emitting diodes were respectively manufactured in the same manner as in Examples 11B and 11G, except that Compound 209 was used instead of Compound 201 as an ambipolar compound.

Examples 13B and 13G

Blue and green organic light emitting diodes were respectively manufactured in the same manner as in Examples 11B and 11G, except that Compound 224 was used instead of Compound 201 as an ambipolar compound.

Examples 14B and 14G

Blue and green organic light emitting diodes were respectively manufactured in the same manner as in Examples 11B and 11G, except that Compound 232 was used instead of Compound 201 as an ambipolar compound.

Examples 15B and 15G

Blue and green organic light emitting diodes were respectively manufactured in the same manner as in Examples 11B and 11G, except that Compound 239 was used instead of Compound 201 as an ambipolar compound.

Examples 16B and 16G

Blue and green organic light emitting diodes were respectively manufactured in the same manner as in Examples 11B and 11G, except that Compound 254 was used instead of Compound 201 as an ambipolar compound.

Evaluation Example 2

Driving voltages, current densities, luminance, efficiencies, and half lives of the blue organic light emitting diodes of Examples 11B through 16B and the green organic light emitting diodes of Examples 11G through 16G were evaluated by using an IVL measuring device (PhotoResearch PR650, Keithley 238), and results thereof are shown in Table 2 below. For comparison, the driving voltages, current densities, luminance, efficiencies, and half lives of the blue and green organic light emitting diodes of Comparative Examples 1B and 1G are also shown in Table 2.

TABLE 2

| | First layer | Diode | Driving voltage (V) | Current density (mA/cm²) | Luminance (cd/m²) | Efficiency (cd/A) | Half life (hr @ 100 mA/cm²) |
|---|---|---|---|---|---|---|---|
| Example 11B | Compound 201 | Blue | 7.65 | 50 | 2,190 | 4.38 | 188 hr |
| Example 11G | Compound 201 | Green | 6.88 | 50 | 6,705 | 13.4 | 254 hr |
| Example 12B | Compound 209 | Blue | 7.63 | 50 | 2,232 | 4.46 | 201 hr |
| Example 12G | Compound 209 | Green | 6.90 | 50 | 6,980 | 14.0 | 230 hr |
| Example 13B | Compound 224 | Blue | 7.78 | 50 | 2,110 | 4.22 | 210 hr |
| Example 13G | Compound 224 | Green | 6.65 | 50 | 6,678 | 13.3 | 247 hr |
| Example 14B | Compound 232 | Blue | 7.78 | 50 | 2,323 | 4.64 | 189 hr |
| Example 14G | Compound 232 | Green | 6.54 | 50 | 6,567 | 13.1 | 257 hr |
| Example 15B | Compound 239 | Blue | 7.71 | 50 | 2,225 | 4.45 | 196 hr |
| Example 15G | Compound 239 | Green | 6.78 | 50 | 6,687 | 13.4 | 262 hr |
| Example 16B | Compound 254 | Blue | 7.76 | 50 | 2,121 | 4.24 | 187 hr |
| Example 16G | Compound 254 | Green | 6.60 | 50 | 6,454 | 12.9 | 242 hr |
| Comparative Example 1B | Alq3 | Blue | 7.85 | 50 | 1,560 | 3.12 | 113 hr |
| Comparative Example 1G | NPB | Green | 7.45 | 50 | 6,120 | 12.2 | 237 hr |

According to Table 2 above, the driving voltages of the blue organic light emitting diodes of Examples 11B through 16B are lower than the driving voltage of the blue organic light emitting diode of Comparative Example 1B, and the efficiencies and half lives of the blue organic light emitting diodes of Examples 11B through 16B are higher than those of the blue organic light emitting diode of Comparative Example 1B. Also, the driving voltages of the green organic light emitting diodes of Examples 11G through 16G are, lower than the driving voltage of the green organic light emitting diode of Comparative Example 1G, and the efficiencies and half lives of the green organic light emitting diodes of Examples 11G through 16G are higher than those of the green organic light emitting diode of Comparative Example 1G.

The organic light emitting diode of the present invention not only has a low driving voltage, high efficiency, and a long life, but also has simple manufacturing processes.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting diode, comprising:
   a substrate comprising a first sub-pixel, a second sub-pixel, and a third sub-pixel;
   a first electrode disposed according to the first through third sub-pixels of the substrate;
   a second electrode facing the first electrode;
   an emission layer disposed between the first electrode and the second electrode; and
   a first layer disposed between the first electrode and the second electrode and containing an ambipolar compound, wherein
   the emission layer comprises a first emission layer formed in the first sub-pixel and emitting a first color light, a second emission layer formed in the second sub-pixel and emitting a second color light, and a third emission layer formed in the third sub-pixel and emitting a third color light, and
   the first layer is a single continuous common layer disposed throughout the first sub-pixel, the second sub-pixel, and the third sub-pixel, and comprises a first region disposed in the first sub-pixel, a second region disposed in the second sub-pixel, and a third region disposed in the third sub-pixel, wherein
   the first region is disposed between the first emission layer and the second electrode, and the third region is disposed between the third emission layer and the first electrode.

2. The organic light emitting diode of claim 1, wherein the first color light is a blue light, the second color light is a green light, and the third color light is a red light.

3. The organic light emitting diode of claim 1, wherein the second region of the first layer is disposed between the first electrode and the second emission layer.

4. The organic light emitting diode of claim 3, satisfying Equation 1 below:

$$D_1 < D_2 < D_3 \qquad <\text{Equation 1}>$$

wherein $D_1$ denotes a distance between the first electrode and the first emission layer, $D_2$ denotes a distance between the first electrode and the second emission layer, and $D_3$ denotes a distance between the first electrode and the third emission layer.

5. The organic light emitting diode of claim 4, wherein a first auxiliary layer is disposed between the third region of the first layer and the third emission layer.

6. The organic light emitting diode of claim 4, wherein a first auxiliary layer is disposed between the first electrode and the third region of the first layer.

7. The organic light emitting diode of claim 1, wherein the second region of the first layer is disposed between the second emission layer and the second electrode.

8. The organic light emitting diode of claim 7, satisfying Equation 2 below:

$$D_1 = D_2 < D_3 \qquad <\text{Equation 2}>$$

wherein $D_1$ denotes a distance between the first electrode and the first emission layer, $D_2$ denotes a distance between the first electrode and the second emission layer, and $D_3$ denotes a distance between the first electrode and the third emission layer.

9. The organic light emitting diode of claim 7, wherein a thickness of the second emission layer is larger than a thickness of the first emission layer.

10. The organic light emitting diode of claim 7, wherein a first auxiliary layer is disposed between the third region of the first layer and the third emission layer.

11. The organic light emitting diode of claim 7, wherein a first auxiliary layer is disposed between the first electrode and the third region of the first layer.

12. The organic light emitting diode of claim 1, wherein the first electrode is a reflective electrode and the second electrode is a translucent electrode, or the first electrode is a translucent electrode and the second electrode is a reflective electrode, and the organic light emitting diode satisfies Equations 3 through 5 below:

$$\frac{\lambda_1}{2n_1} \cdot m_1 - \frac{\lambda_1}{10} \le L_1 \le \frac{\lambda_1}{2n_1} \cdot m_1 + \frac{\lambda_1}{10} \qquad <\text{Equation 3}>$$

$$\frac{\lambda_2}{2n_2} \cdot m_2 - \frac{\lambda_2}{10} \le L_2 \le \frac{\lambda_2}{2n_2} \cdot m_2 + \frac{\lambda_2}{10} \qquad <\text{Equation 4}>$$

$$\frac{\lambda_3}{2n_3} \cdot m_3 - \frac{\lambda_3}{10} \le L_3 \le \frac{\lambda_3}{2n_3} \cdot m_1 + \frac{\lambda_3}{10} \qquad <\text{Equation 5}>$$

wherein, in Equations 3 through 5,
$L_1$ denotes a distance between the first electrode and the second electrode in the first sub-pixel;
$L_2$ denotes a distance between the first electrode and the second electrode in the second sub-pixel;
$L_3$ denotes a distance between the first electrode and the second electrode in the third sub-pixel;
$\lambda_1$, $\lambda_2$, and $\lambda_3$ respectively denote wavelengths of the first color light, the second color light, and the third color light;
$n_1$ denotes a refractive index of layers disposed between the first electrode and the second electrode in the first sub-pixel;
$n_2$ denotes a refractive index of layers disposed between the first electrode and the second electrode in the second sub-pixel;
$n_3$ denotes a refractive index of layers disposed between the first electrode and the second electrode in the third sub-pixel; and
each of $m_1$, $m_2$, and $m_3$ is independently a natural number.

13. The organic light emitting diode of claim 1, wherein the ambipolar compound is represented by Formula 1, 2, or 3 below:

<Formula 1>

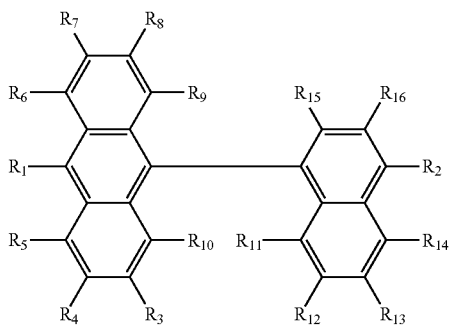

<Formula 2>

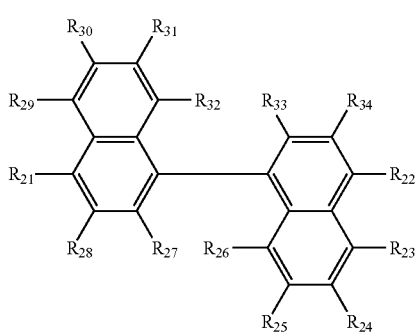

<Formula 3>

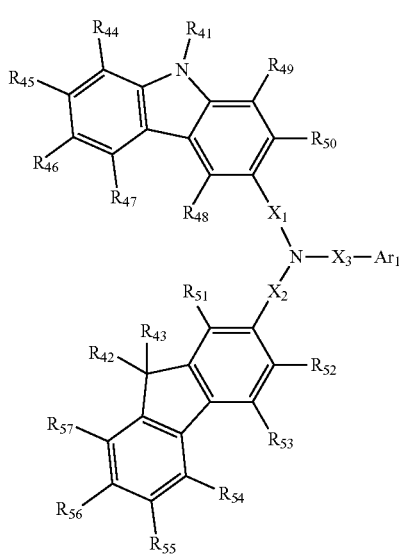

wherein, in Formulas 1 through 3, each of $R_1$ through $R_{16}$, $R_{21}$ through $R_{34}$, and $R_{41}$ through $R_{57}$ is independently one of hydrogen, heavy hydrogen, a halogen atom, a hydroxyl group, a cyano group, a nitro group, a carboxyl group, a substituted or unsubstituted $C_1$-$C_{50}$ alkyl group, a substituted or unsubstituted $C_2$-$C_{50}$ alkenyl group, a substituted or unsubstituted $C_2$-$C_{50}$ alkynyl group, a substituted or unsubstituted $C_1$-$C_{50}$ alkoxy group, a substituted or unsubstituted $C_3$-$C_{50}$ cycloalkyl group, a substituted or unsubstituted $C_6$-$C_{50}$ aryl group, a substituted or unsubstituted $C_6$-$C_{50}$ aryloxy group, a substituted or unsubstituted $C_6$-$C_{50}$ arylthio group, a substituted or unsubstituted $C_2$-$C_{50}$ heteroaryl group, —N($R_{70}$)($R_{71}$), and —Si($R_{72}$)($R_{73}$)($R_{74}$);

each of $X_1$, $X_2$, and $X_3$ is independently one of a single bond, a substituted or unsubstituted $C_6$-$C_{50}$ arylene group, and a substituted or unsubstituted $C_2$-$C_{50}$ heteroarylene group;

$Ar_1$ is a substituted or unsubstituted $C_2$-$C_{50}$ heteroaryl group; and each of $R_{70}$ through $R_{74}$ is independently one of hydrogen, heavy hydrogen, a halogen atom, a hydroxyl group, a cyano group, a nitro group, a carboxyl group, a substituted or unsubstituted $C_1$-$C_{50}$ alkyl group, a substituted or unsubstituted $C_2$-$C_{50}$ alkenyl group, a substituted or unsubstituted $C_2$-$C_{50}$ alkynyl group, a substituted or unsubstituted $C_1$-$C_{50}$ alkoxy group, a substituted or unsubstituted $C_3$-$C_{50}$ cycloalkyl group, a substituted or unsubstituted $C_6$-$C_{50}$ aryl group, a substituted or unsubstituted $C_6$-$C_{50}$ aryloxy group, a substituted or unsubstituted $C_6$-$C_{50}$ arylthio group, and a substituted or unsubstituted $C_2$-$C_{50}$ heteroaryl group.

14. The organic light emitting diode of claim 13, wherein the ambipolar compound is represented by Formula 1a or 2a below:

<Formula 1a>

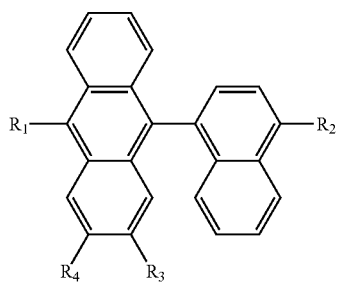

<Formula 2a>

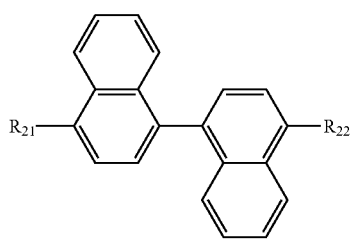

wherein each of $R_1$ through $R_4$, $R_{21}$, and $R_{22}$ is independently one of Formulas 5A through 5P below:

Formula 5A

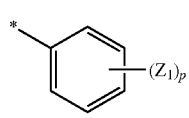

Formula 5B

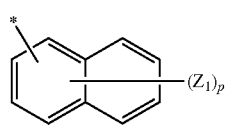

Formula 5C

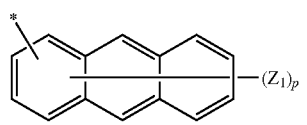

-continued

Formula 5D 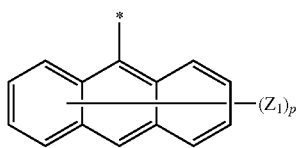

Formula 5E 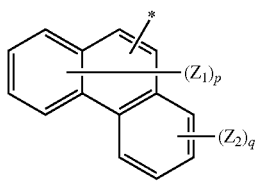

Formula 5F 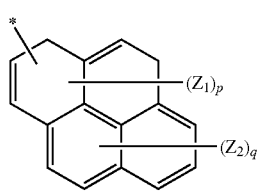

Formula 5G 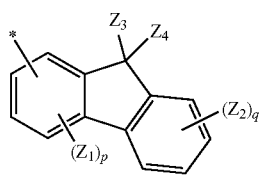

Formula 5H 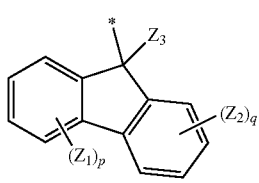

Formula 5I 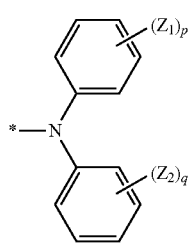

Formula 5J 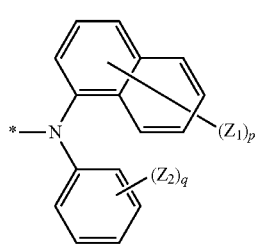

Formula 5K 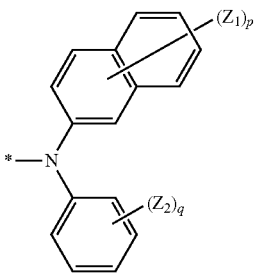

Formula 5L 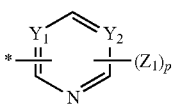

Formula 5M 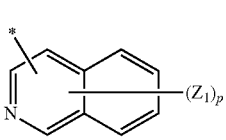

Formula 5N 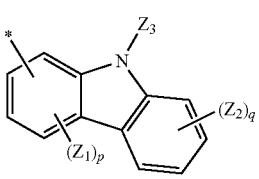

Formula 5O 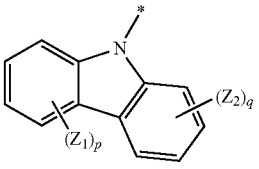

Formula 5P 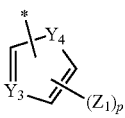

wherein, in Formulas 5A through 5P,
each of $Z_1$ through $Z_4$ is independently hydrogen, heavy hydrogen, a halogen atom, a hydroxyl group, a cyano group, a nitro group, a carboxyl group, a $C_1$-$C_{10}$ alkyl group, a $C_1$-$C_{10}$ alkoxy group, a $C_6$-$C_{16}$ aryl group, or a $C_2$-$C_{16}$ heteroaryl group;
each of $Y_1$ through $Y_3$ is independently —C($R_{81}$)= or —N=;
$Y_4$ is —S—, —O— or —N($R_{84}$)—;
each of $R_{81}$ and $R_{84}$ is independently hydrogen, heavy hydrogen, a halogen atom, a hydroxyl group, a cyano group, a nitro group, a carboxyl group, a $C_1$-$C_{10}$ alkyl group, a $C_1$-$C_{10}$ alkoxy group, a $C_6$-$C_{16}$ aryl group, or a $C_2$-$C_{16}$ heteroaryl group;
p is an integer from 1 to 9; and
q is an integer from 1 to 5.

15. The organic light emitting diode of claim 13, wherein the ambipolar compound is represented by Formula 3a below:

<Formula 3a>
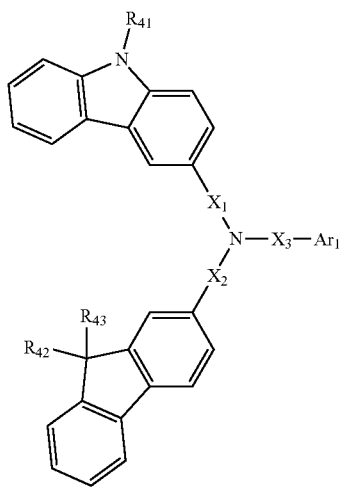
wherein each of $R_{41}$ through $R_{43}$ is independently one of Formulas 5A through 5P;
each of $X_1$ through $X_3$ is independently one of a single bond and Formulas 7A through 7D; and
$Ar_1$ is one of Formulas 5A through 5P:
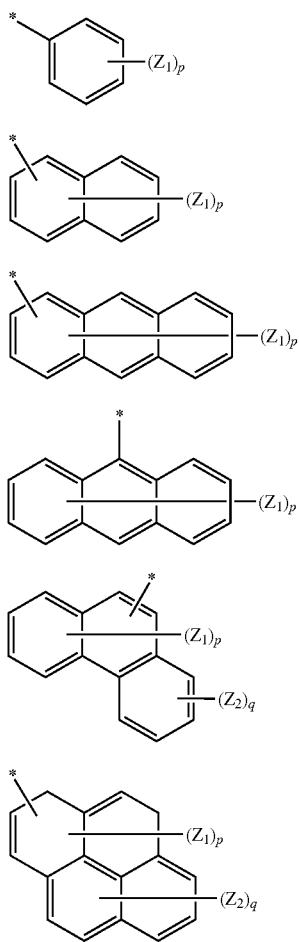
Formula 5A
Formula 5B
Formula 5C
Formula 5D
Formula 5E
Formula 5F
-continued
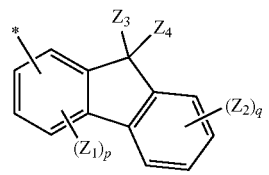
Formula 5G
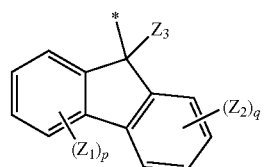
Formula 5H
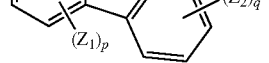
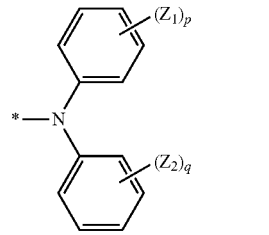
Formula 5I
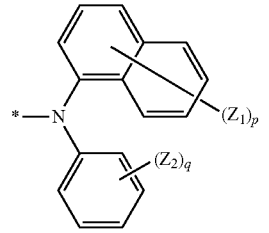
Formula 5J
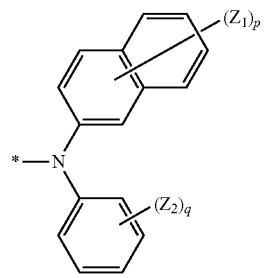
Formula 5K
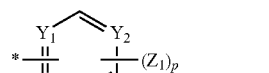
Formula 5L
Formula 5M
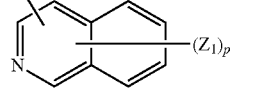
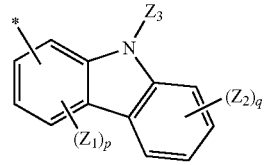
Formula 5N

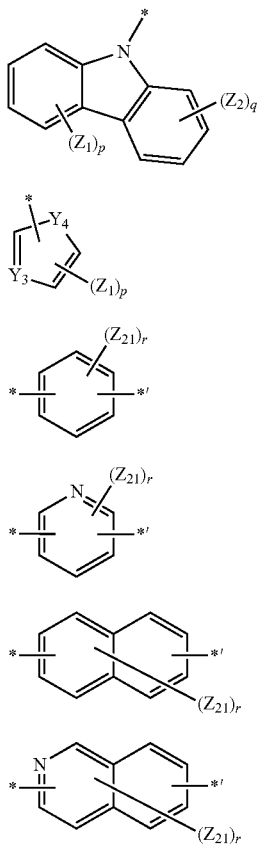

wherein, in Formulas 5A through 5P and 7A through 7D, each of $Z_1$ through $Z_4$ is independently hydrogen, heavy hydrogen, a halogen atom, a hydroxyl group, a cyano group, a nitro group, a carboxyl group, a $C_1$-$C_{10}$ alkyl group, a $C_1$-$C_{10}$ alkoxy group, a $C_6$-$C_{16}$ aryl group, or a $C_2$-$C_{16}$ heteroaryl group;

each of $Y_1$ through $Y_3$ is independently —C($R_{81}$)= or —N=;

$Y_4$ is —S—, —O—, or —N($R_{84}$);

each of $R_{81}$ and $R_{84}$ is independently hydrogen, heavy hydrogen, a halogen atom, a hydroxyl group, a cyano group, a nitro group, a carboxyl group, a $C_1$-$C_{10}$ alkyl group, a $C_1$-$C_{10}$ alkoxy group, a $C_6$-$C_{16}$ aryl group, or a $C_2$-$C_{16}$ heteroaryl group;

p is an integer from 1 to 9;

q is an integer from 1 to 5;

$Z_{21}$ is hydrogen, heavy hydrogen, a halogen atom, a hydroxyl group, a cyano group, a nitro group, a carboxyl group, a $C_1$-$C_{10}$ alkyl group, a $C_1$-$C_{10}$ alkoxy group, a $C_6$-$C_{16}$ aryl group, or a $C_2$-$C_{16}$ heteroaryl group; and r is an integer from 1 to 6.

16. A method of manufacturing an organic light emitting diode, the method comprising:

preparing a first electrode according to a first sub-pixel, a second sub-pixel, and a third sub-pixel, on a substrate comprising the first through third sub-pixels;

preparing a first emission layer emitting a first color light on the first sub-pixel;

after preparing the first emission layer, preparing a first layer comprising an ambipolar compound and being a single continuous common layer disposed throughout the first through third sub-pixels; and after preparing the first layer, preparing a third emission layer emitting a third color light in the third sub-pixel.

17. The method of claim 16, further comprising, before the preparing of the first layer, preparing a second emission layer emitting a second color light in the second sub-pixel.

18. The method of claim 16, further comprising, after the preparing of the first layer, preparing a second emission layer emitting a second color light in the second sub-pixel.

19. The method of claim 16, further comprising, before the preparing of the first layer, preparing a first auxiliary layer in the third sub-pixel.

20. The method of claim 16, further comprising, after the preparing of the first layer and before the preparing of the third emission layer, preparing a first auxiliary layer in the third sub-pixel.

* * * * *